United States Patent
Kaneko et al.

(10) Patent No.: US 10,971,337 B2
(45) Date of Patent: Apr. 6, 2021

(54) MICROWAVE OUTPUT DEVICE AND PLASMA PROCESSING APPARATUS

(71) Applicant: TOKYO ELECTRON LIMITED, Tokyo (JP)

(72) Inventors: Kazushi Kaneko, Miyagi (JP); Yohei Ishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 376 days.

(21) Appl. No.: 15/999,015

(22) Filed: Aug. 20, 2018

(65) Prior Publication Data

US 2019/0057844 A1    Feb. 21, 2019

(30) Foreign Application Priority Data

Aug. 18, 2017   (JP) .............................. JP2017-157887

(51) Int. Cl.
    *B23K 10/00*     (2006.01)
    *H01J 37/32*     (2006.01)
    *H05B 1/02*      (2006.01)

(52) U.S. Cl.
    CPC ... *H01J 37/32311* (2013.01); *H01J 37/32146* (2013.01); *H01J 37/32183* (2013.01); *H01J 37/32201* (2013.01); *H01J 37/32275* (2013.01); *H01J 37/32293* (2013.01); *H01J 37/32458* (2013.01)

(58) Field of Classification Search
    CPC ........... H01J 37/32311; H01J 37/32146; H01J 37/32183; H01J 37/32201; H01J 37/275; H01J 37/32293; H01J 37/32458; H05H 1/02; H05H 1/34; H05H 1/30
    USPC ................ 219/121.43, 121.4, 690, 704, 746
    See application file for complete search history.

(56) References Cited

U.S. PATENT DOCUMENTS

| | | | | |
|---|---|---|---|---|
| 5,587,205 A | * | 12/1996 | Saito | ...................... C23C 16/511 118/723 MA |
| 2009/0105980 A1 | * | 4/2009 | Tetsuka | ............. H01J 37/32935 702/76 |
| 2011/0032047 A1 | * | 2/2011 | Yuzurihara | ............. H03F 3/217 332/108 |

FOREIGN PATENT DOCUMENTS

| JP | H06-267900 A | 9/1994 |
|---|---|---|
| JP | 2012-109080 A | 6/2012 |
| JP | 5320260 B2 | 10/2013 |

* cited by examiner

*Primary Examiner* — Mark H Paschall
(74) *Attorney, Agent, or Firm* — Studebaker & Brackett PC

(57) ABSTRACT

A device includes a microwave generation unit that generates a microwave having a bandwidth, an output unit, a directional coupler, and a measurement unit. The microwave generation unit generates a microwave of which power is pulse-modulated to have a high level and a low level. The measurement unit determines a first high measured value and a first low measured value respectively indicating a high level and a low level of power of travelling waves in the output unit on the basis of parts of the travelling waves output from the directional coupler. The microwave generation unit controls high level power of the pulse-modulated microwave on the basis of and averaged first high measured value and high level setting power, and controls low level power of the pulse-modulated microwave on the basis of an averaged first low measured value and low level setting power.

15 Claims, 54 Drawing Sheets

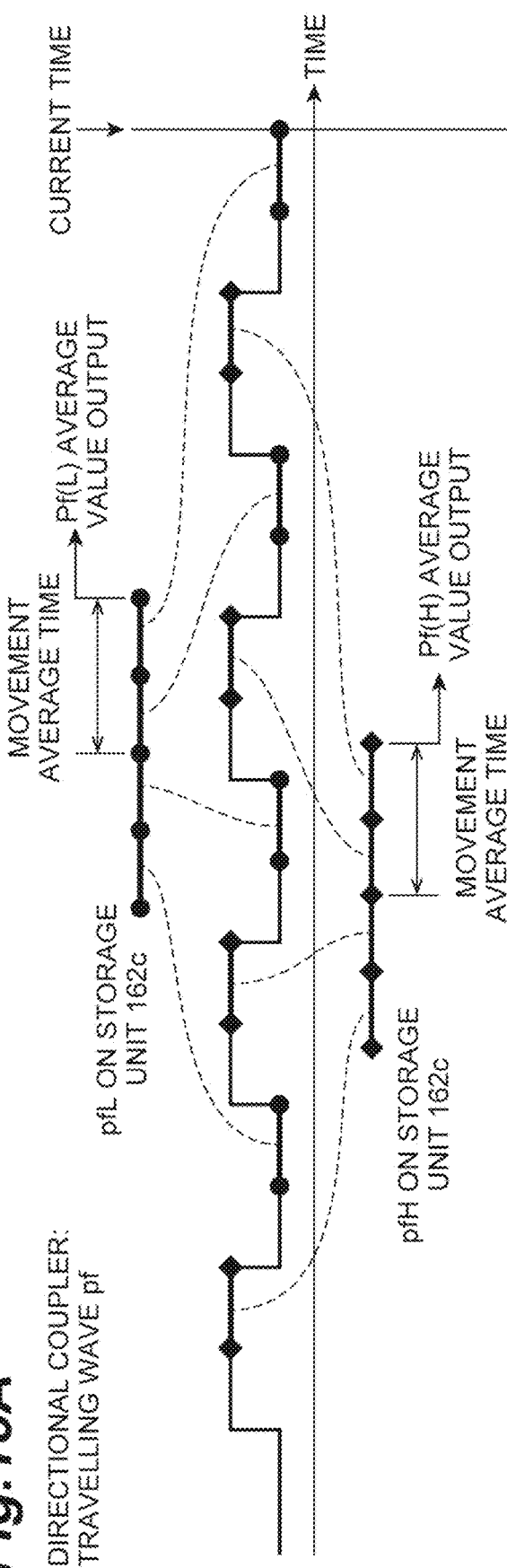
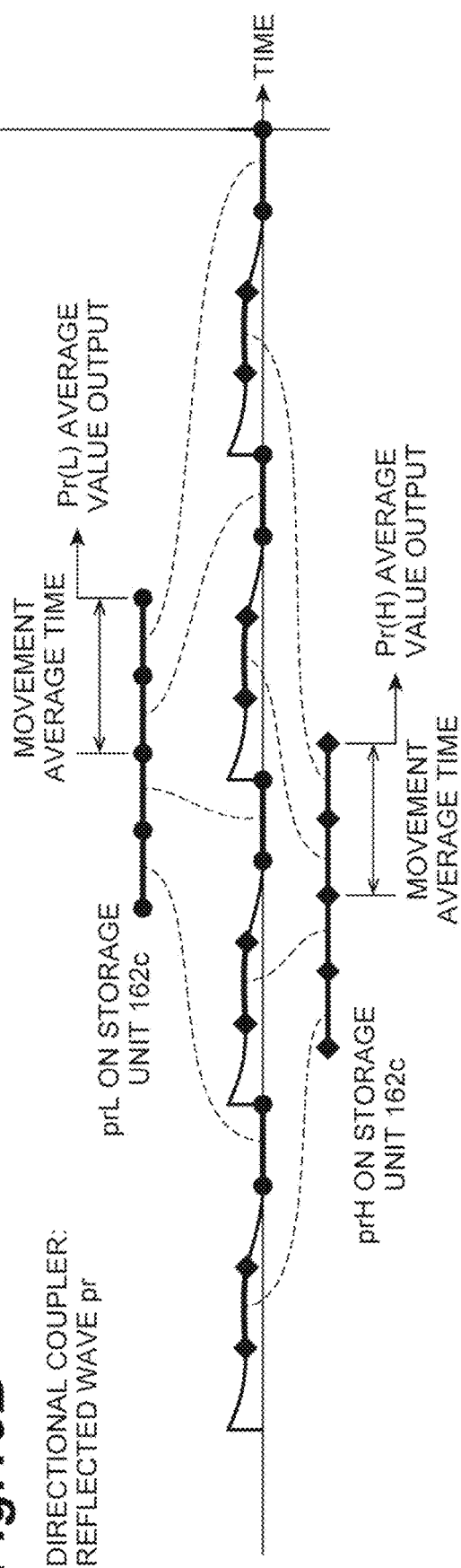

Fig.23

|  | pfH | pfL | prH | prL |
|---|---|---|---|---|
| CURRENT TIME | pfH(n) | pfL(n) | prH(n) | prL(n) |
| 1 SAMPLE BEFORE | pfH(n-1) | pfL(n-1) | prH(n-1) | prL(n-1) |
| 2 SAMPLE BEFORE | pfH(n-2) | pfL(n-2) | prH(n-2) | prL(n-2) |
| ... | ... | ... | ... | ... |
| n-3 SAMPLE BEFORE | pfH(3) | pfL(3) | prH(3) | prL(3) |
| n-2 SAMPLE BEFORE | pfH(2) | pfL(2) | prH(2) | prL(2) |
| n-1 SAMPLE BEFORE | pfH(1) | pfL(1) | prH(1) | prL(1) |

DA2

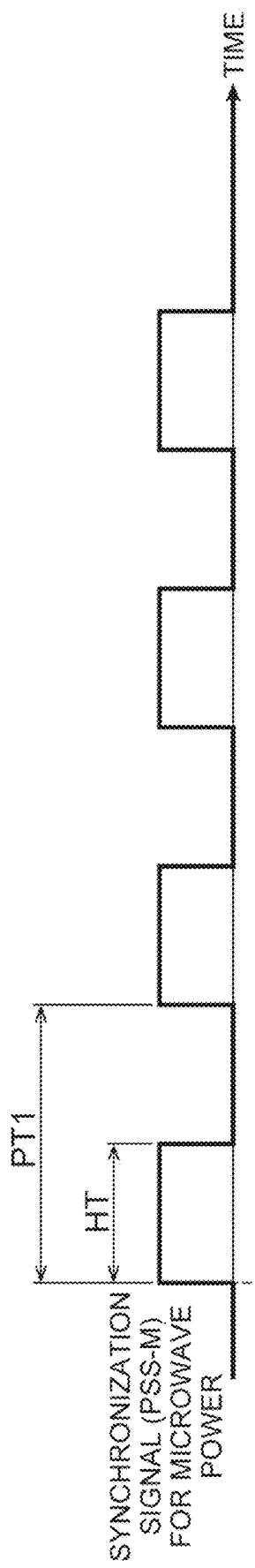
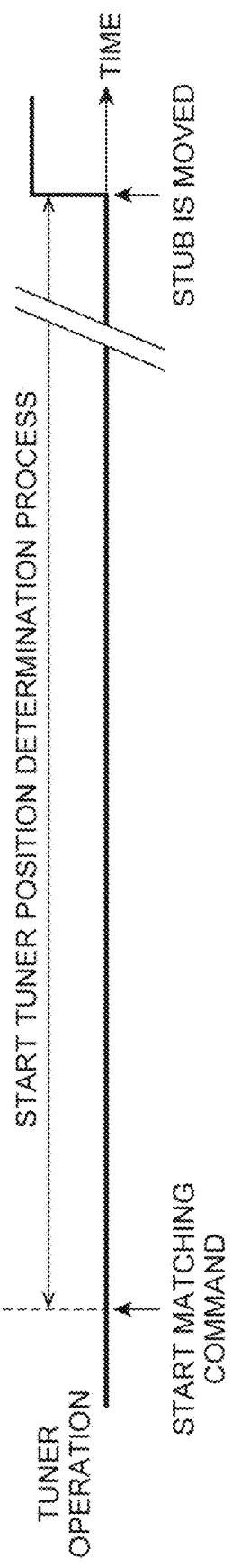
Fig.28A
Fig.28B

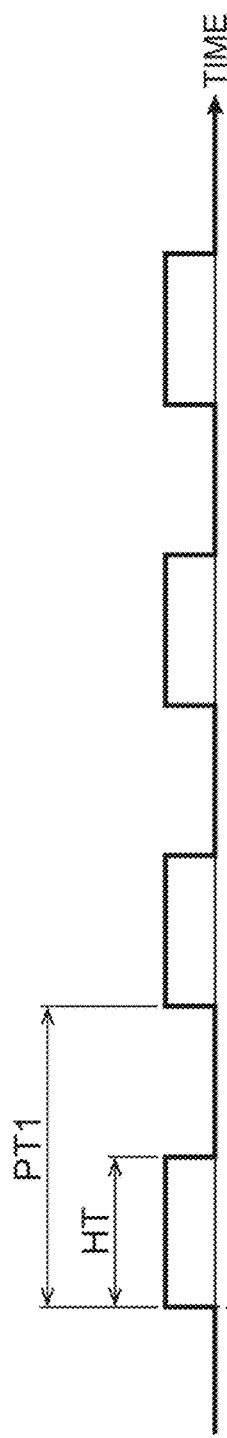
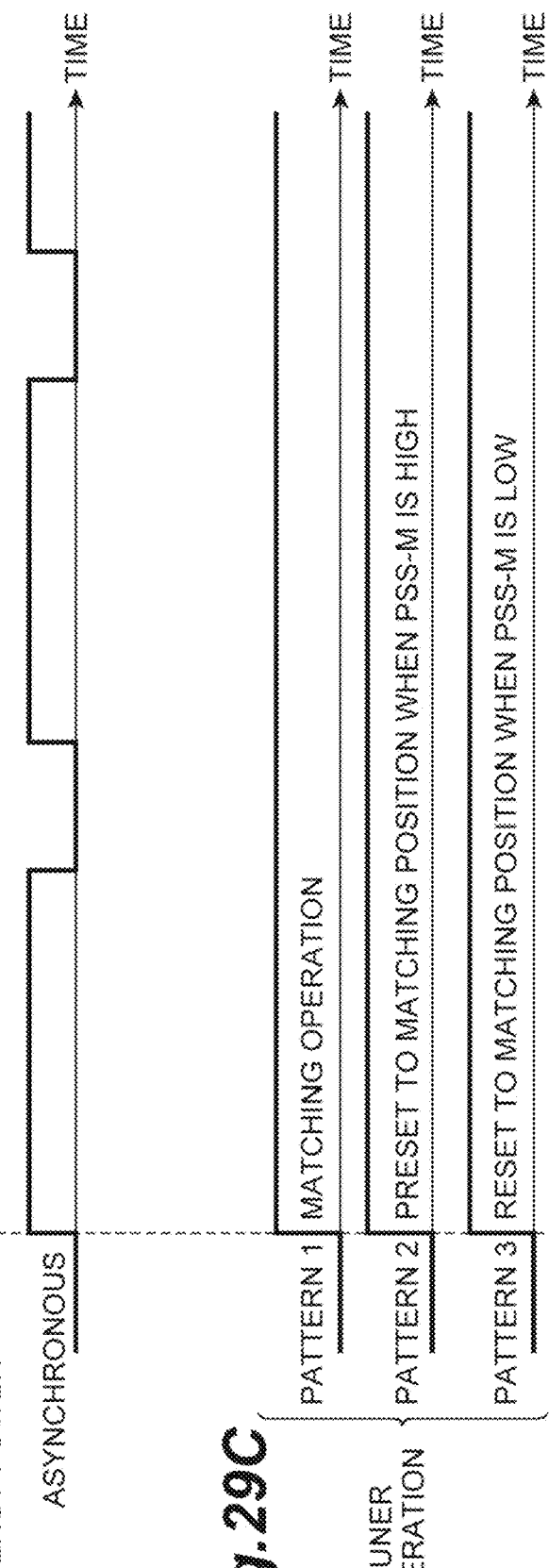
Fig.29A SYNCHRONIZATION SIGNAL (PSS-M) FOR MICROWAVE POWER
Fig.29B SYNCHRONIZATION SIGNAL (PSS-R) FOR RADIO FREQUENCY POWER
Fig.29C TUNER OPERATION

Fig.35

|  | V1H | V1L | ... |  |
|---|---|---|---|---|
| CURRENT TIME | V1h(n) | V1l(n) | ... |  |
| 1 SAMPLE BEFORE | V1h(n-1) | V1l(n-1) | ... |  |
| 2 SAMPLE BEFORE | V1h(n-2) | V1l(n-2) | ... |  |
|  | ... | ... |  |  |
| n-3 SAMPLE BEFORE | V1h(3) | V1l(3) | ... |  |
| n-2 SAMPLE BEFORE | V1h(2) | V1l(2) | ... |  |
| n-1 SAMPLE BEFORE | V1h(1) | V1l(1) | ... |  |

*Fig.52*

|  | V1H | V1L | ... |  |
|---|---|---|---|---|
| CURRENT TIME | V1h(n) | V1l(n) | ... |  |
| 1 SAMPLE BEFORE | V1h(n-1) | V1l(n-1) | ... |  |
| 2 SAMPLE BEFORE | V1h(n-2) | V1l(n-2) | ... |  |
|  | ... | ... |  |  |
| n-3 SAMPLE BEFORE | V1h(3) | V1l(3) | ... |  |
| n-2 SAMPLE BEFORE | V1h(2) | V1l(2) | ... |  |
| n-1 SAMPLE BEFORE | V1h(1) | V1l(1) | ... |  |

MICROWAVE OUTPUT DEVICE AND PLASMA PROCESSING APPARATUS

CROSS-REFERENCE TO RELATED APPLICATIONS

This application is based on and claims the benefit of priority from Japanese Patent Application No. 2017-157887 filed on Aug. 18, 2017, and the entire contents of which are incorporated herein by reference.

FIELD

Exemplary embodiments of the present disclosure relates to a microwave output device and a plasma processing apparatus.

BACKGROUND

A plasma processing apparatus is used to manufacture an electronic device such as a semiconductor device. The plasma processing apparatus includes various types of apparatuses such as a capacitive coupling type plasma processing apparatus and an inductive coupling type plasma processing apparatus. In recent years, a plasma processing apparatus of a type of exciting a gas by using microwaves has been used.

Japanese Unexamined Patent Publication No. 2012-109080 discloses a plasma processing apparatus using microwaves. The plasma processing apparatus includes a microwave output device outputting a microwave having a bandwidth. The apparatus can stabilize plasma by outputting the microwave having a bandwidth.

Japanese Unexamined Patent Publication No. H6-267900 discloses an apparatus which pulse-modulates a microwave for exciting plasma. This apparatus can prevent instability of plasma so as to reduce an electron temperature and an ion temperature.

SUMMARY

In first aspect, a microwave output device including: a microwave generation unit configured to generate a microwave having a center frequency and a bandwidth respectively corresponding to a setting frequency and a setting bandwidth instructed by a controller, the microwave having power pulse-modulated such that a pulse frequency, a duty ratio, a high level and a low level respectively corresponding to a pulse frequency, a setting duty ratio, high level setting power and low level setting power instructed by the controller; an output unit configured to output the microwave propagating from the microwave generation unit; a first directional coupler configured to output parts of travelling waves propagating from the microwave generation unit to the output unit; and a measurement unit configured to determine a first high measured value and a first low measured value respectively indicating a high level and a low level of power of the travelling waves in the output unit on the basis of the parts of the travelling waves output from the first directional coupler, wherein the microwave generation unit averages the first high measured value and the first low measured value with a predetermined movement average time and a predetermined sampling interval, controls high level power of the pulse-modulated microwave on the basis of the averaged first high measured value and the high level setting power, and controls low level power of the pulse-modulated microwave on the basis of the averaged first low measured value and the low level setting power.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 15A and 15B are diagrams for explaining an average value of power during power modulation.

FIG. 23 is a diagram illustrating an example of time-series buffer data.

FIGS. 28A and 28B are diagrams illustrating an example of comparison between a synchronization signal for a microwave and a tuner operation.

FIGS. 29A, 29B and 29C are diagrams illustrating an example of comparison between synchronization signals for a microwave and a radio frequency and a tuner operation.

FIG. 35 is a diagram illustrating an example of time-series buffer data.

FIG. 52 is a diagram illustrating an example of time-series buffer data.

DETAILED DESCRIPTION

Figure 1:
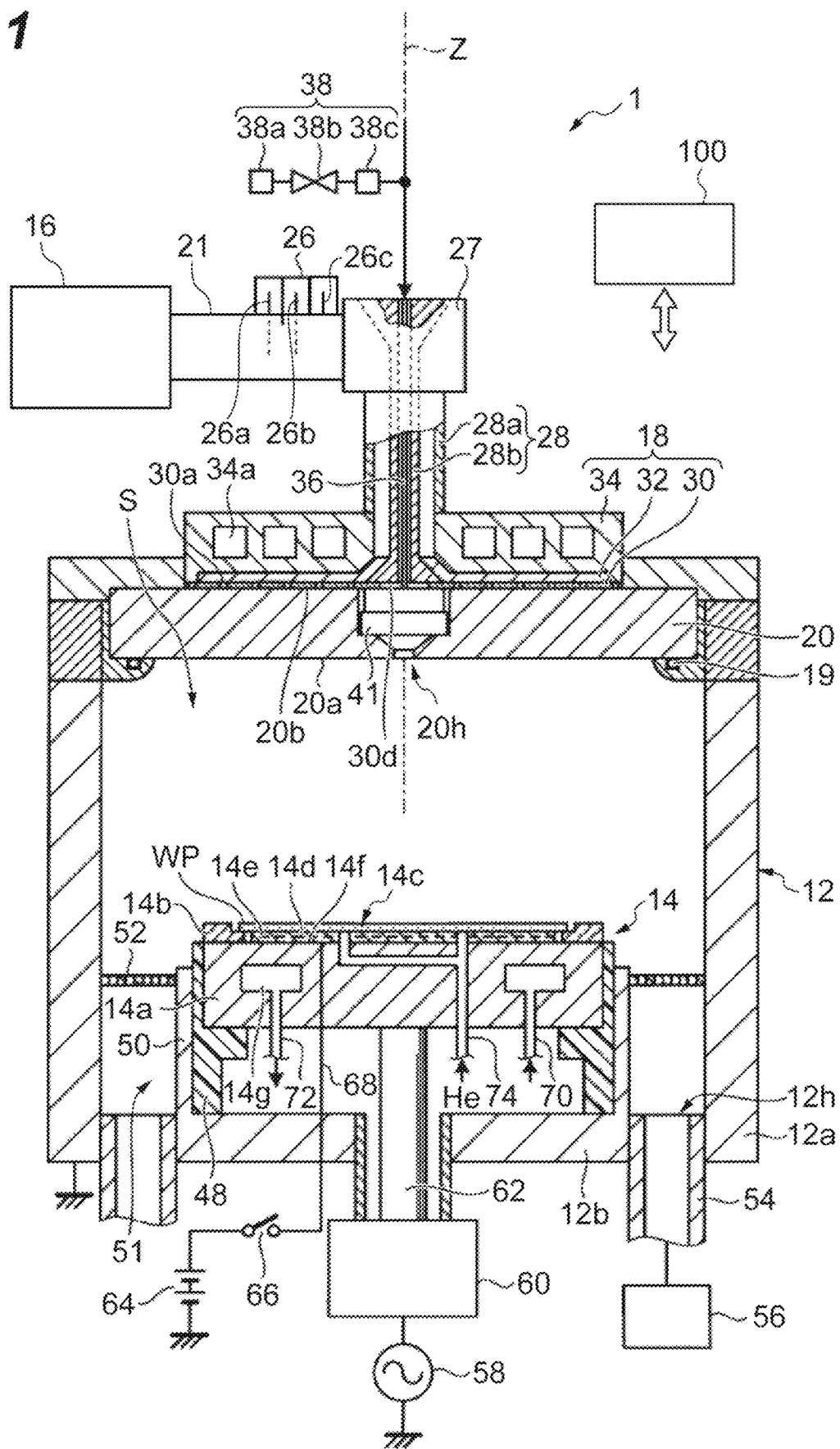
FIG. 1 is a diagram illustrating an example of a plasma processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In an electronic device manufacturing field, achievement of low power of a microwave progresses in order to further reduce damage to an object to be processed. However, when power of a microwave is too low, there is concern that plasma may become unstable or a misfire may occur. In other words, there is a limitation in an approach to achievement of low power. As a separate approach, an electron temperature of plasma may be further reduced.

In order to stabilize plasma and also to reduce an electron temperature, power of a microwave may be pulse-modulated as in the apparatus disclosed in Japanese Unexamined Patent Publication No. H6-267900 by employing a microwave having a bandwidth as in the apparatus disclosed in Japanese Unexamined Patent Publication No. 2012-409080. However, power of a microwave having a bandwidth is not constant but has a varying waveform. Thus, it is hard to appropriately control power. In this technical field, there is the need for a microwave output device and a plasma processing apparatus which can control pulse-modulated power of a microwave having a bandwidth.

According to an aspect, there is provided a microwave output device. The microwave output device includes a microwave generation unit, an output unit, a first directional coupler, and a measurement unit. The microwave generation unit generates a microwave which has a center frequency and a bandwidth respectively corresponding to a setting frequency and a setting bandwidth for which instructions are given from a controller and of which power is pulse-modulated such that a pulse frequency, a duty ratio, a high level, and a low level respectively corresponding to a pulse frequency, a setting duty ratio, high level setting power, and low level setting power for which instructions are given from the controller are obtained. The output unit outputs a microwave propagating from the microwave generation unit. The first directional coupler that outputs parts of travelling waves propagating from the microwave generation unit to the output unit. The measurement unit determines a first high measured value and a first low measured value respectively indicating a high level and a low level of power of the travelling waves in the output unit on the basis of the parts of the travelling waves output from the first directional coupler. The microwave generation unit averages the first high measured value and the first low measured value with a predetermined movement average time and a predetermined sampling interval, controls high level power of the pulse-modulated microwave on the basis of the averaged first high measured value and the high level setting power, and controls low level power of the pulse-modulated microwave on the basis of the averaged first low measured value and the low level setting power.

In the microwave output device, power of the microwave having a bandwidth is pulse-modulated. High level power of the pulse-modulated microwave is controlled on the basis of the averaged first high measured value and the high level setting power. Low level power of the pulse-modulated microwave is controlled on the basis of the averaged first low measured value and the low level setting power. As mentioned above, since power of a microwave is pulse-modulated, and high level power and low level power are controlled on the basis of setting power, pulse-modulated power of a microwave having a bandwidth can be controlled.

In an exemplary embodiment, the microwave output device may include a second directional coupler that outputs parts of reflected waves returned to the output unit. The measurement unit further determines a second high measured value and a second low measured value respectively indicating a high level and a low level of power of the reflected waves in the output unit on the basis of the parts of the reflected waves output from the second directional coupler. The microwave generation unit averages the second high measured value and the second low measured value with a predetermined movement average time and a predetermined sampling interval, controls high level power of the pulse-modulated microwave on the basis of the averaged first high measured value, the averaged second high measured value, and the high level setting power, and controls low level power of the pulse-modulated microwave on the basis of the averaged first low measured value, the averaged the second low measured value, and the low level setting power.

In the microwave output device, high level power of the pulse-modulated microwave is controlled on the basis of the averaged first high measured value, the averaged second high measured value, and the high level setting power. Low level power of the pulse-modulated microwave is controlled on the basis of the averaged first low measured value, the averaged the second low measured value, and the low level setting power. As mentioned above, since power of a microwave is pulse-modulated, and high level power and low level power are controlled by using setting power, pulse-modulated power of a microwave having a bandwidth can be controlled.

In an exemplary embodiment, the measurement unit may not measure the power of the travelling waves and the power of the reflected waves in a first mask period until a predetermined time elapses from a high level timing and in a second mask period until a predetermined time elapses from a low level timing. With this configuration, it is possible to measure travelling wave power and reflected wave power by avoiding a period in which microwave power greatly changes. Therefore, it is possible to reduce a power measurement error. As a result, it is possible to improve the accuracy of power control.

In an exemplary embodiment, with respect to the power of the travelling waves and the power of the reflected waves, the measurement unit may measure high level power in a first sample period from the end of the first mask period to a low level timing, and measures low level power in a second sample period from the end of the second mask period to a high level timing. With this configuration, it is possible to measure travelling wave power and reflected wave power by avoiding a period in which microwave power greatly changes. Therefore, it is possible to reduce a power measurement error. As a result, it is possible to improve the accuracy of power control.

In an exemplary embodiment, the microwave generation unit may calculate a movement average time of each of the first high measured value and the second high measured value by using a period obtained by connecting a plurality of the first sample periods to each other, and calculate a movement average time of each of the first low measured value and the second low measured value by using a period obtained by connecting a plurality of the second sample periods to each other. With this configuration, it is possible to appropriately average pulsed power.

In an exemplary embodiment, in a case where a control mode for which an instruction is given from the controller is a first control mode, the microwave generation unit may control high level power of a pulse-modulated microwave such that a value obtained by subtracting the averaged second high measured value from the averaged first high measured value comes close to the high level setting power, and control low level power of a pulse-modulated microwave such that a value obtained by subtracting the averaged second low measured value from the averaged first low measured value comes close to the low level setting power. In a case where a control mode for which an instruction is given from the controller is a second control mode, the microwave generation unit may control high level power of a pulse-modulated microwave such that the averaged first high measured value comes close to the high level setting power, and control low level power of a pulse-modulated microwave such that the averaged first low measured value comes close to the low level setting power. The microwave generation unit is configured to be able to switch between control modes, and can thus switch between execution and non-execution of load control depending on process conditions.

In an exemplary embodiment, the microwave generation unit may include a waveform generation unit, a control unit, a first converter, an attenuator, and a switch. The waveform generation unit generates a microwave. The control unit outputs a first signal for applying a first attenuation amount to power of the microwave and a second signal for applying a second attenuation amount to the power of the microwave. The first converter is connected to the control unit, and performs D/A conversion on the first signal. The second converter is connected to the control unit, and performs D/A conversion on the second signal. The attenuator is connected to the first converter and the second converter, and attenuates power of the microwave according to the first signal having undergone the D/A conversion or the second signal having undergone the D/A conversion. The switch is provided between the first converter and the second converter, and the attenuator, and switches between a connection between the first converter and the attenuator and a connection between the second converter and the attenuator. Such a switching circuit is provided, and thus it is possible to switch between attenuation amounts in the attenuator at a high speed.

In another aspect, there is provided a plasma processing apparatus. The plasma processing apparatus includes a chamber main body and the microwave output device. The microwave output device is configured to output a microwave for exciting a gas supplied to the inside of the chamber main body. The microwave output device is any one of the microwave output devices of the aspect and a plurality of exemplary embodiments.

In an exemplary embodiment, the plasma processing apparatus may further include an electrode that is provided in the chamber main body; and a radio frequency power supply that applies pulse-modulated radio frequency power to the electrode. The microwave output device may generate a microwave of which power is pulse-modulated to be synchronized with the radio frequency power. With this configuration, it is possible to reduce the influence of pulse modulation of a radio frequency exerted on a reflected wave of a microwave.

According to various aspects and exemplary embodiments of the present disclosure, it is possible to provide a microwave output device and a plasma processing apparatus which can control pulse-modulated power of a microwave having a bandwidth.

Hereinafter, various exemplary embodiments will be described in detail with reference to the drawings. In the drawings, the same reference numeral will be given to the same portion or an equivalent portion in the drawings.

Plasma Processing Apparatus

FIG. 1 is a view illustrating a plasma processing apparatus according to an exemplary embodiment. As illustrated in FIG. 1, a plasma processing apparatus 1 includes a chamber main body 12 and a microwave output device 16. The plasma processing apparatus 1 may further include a stage 14, an antenna 18, and a dielectric window 20.

The chamber main body 12 provides a processing space S at the inside thereof. The chamber main body 12 includes a side wall 12a and a bottom portion 12b. The side wall 12a is formed in an approximately cylindrical shape. A central axial line of the side wall 12a approximately matches an axial line Z which extends in a vertical direction. The bottom portion 12b is provided on a lower end side of the side wall 12a. An exhaust hole 12h for exhaust is provided in the bottom portion 12b. An upper end of the side wall 12a is an opening.

The dielectric window 20 is provided over the upper end of the side wall 12a. The dielectric window 20 includes a lower surface 20a which faces the processing space S. The dielectric window 20 closes the opening in the upper end of the side wall 12a. An O-ring 19 is interposed between the dielectric window 20 and the upper end of the side wall 12a. The chamber main body 12 is more reliably sealed due to the O-ring 19.

The stage 14 is accommodated in the processing space S. The stage 14 is provided to face the dielectric window 20 in the vertical direction. The stage 14 is provided such that the processing space S is provided between the dielectric window 20 and the stage 14. The stage 14 is configured to support a workpiece WP (for example, a wafer) which is mounted thereon.

In an exemplary embodiment, the stage 14 includes a base 14a and an electrostatic chuck 14c. The base 14a has an approximately disc shape, and is formed from a conductive material such as aluminum. A central axial line of the base 14a approximately matches the axial line Z. The base 14a is supported by a cylindrical support 48. The cylindrical support 48 is formed from an insulating material, and extends from the bottom portion 12b in a vertically upward direction. A conductive cylindrical support 50 is provided on an outer circumference of the cylindrical support 48. The cylindrical support 50 extends from the bottom portion 12b of the chamber main body 12 along the outer circumference of the cylindrical support 48 in a vertically upward direction. An annular exhaust path 51 is formed between the cylindrical support 50 and the side wall 12a.

A baffle plate 52 is provided at an upper portion of the exhaust path 51. The baffle plate 52 has an annular shape. A plurality of through-holes, which pass through the baffle plate 52 in a plate thickness direction, are formed in the baffle plate 52. The above-described exhaust hole 12h is provided on a lower side of the baffle plate 52. An exhaust device 56 is connected to the exhaust hole 12h through an exhaust pipe 54. The exhaust device 56 includes an automatic pressure control valve (APC), and a vacuum pump such as a turbo-molecular pump. A pressure inside the processing space S may be reduced to a desired vacuum degree by the exhaust device 56.

The base 14a also functions as a radio frequency electrode. A radio frequency power supply 58 for radio frequency bias is electrically connected to the base 14a through a feeding rod 62 and a matching unit 60. The radio frequency power supply 58 outputs a constant frequency which is suitable to control ion energy which is inducted to the workpiece WP, for example, a radio frequency of 13.56 MHz with power which is set.

The radio frequency power supply 58 may have a pulse generator, and may pulse-modulate radio frequency power (RF power) which is then applied to the base 14a. In this case, the radio frequency power supply 58 pulse-modulates the radio frequency power such that high level power and low level power are periodically repeated. The radio frequency power supply 58 performs pulse adjustment on the basis of a synchronization signal PSS-R generated by the pulse generator. The synchronization signal PSS-R is a signal for determining a cycle and a duty ratio of the radio frequency power. As an example of setting during pulse modulation, a pulse frequency is 10 Hz to 250 kHz, and a duty ratio of a pulse (a ratio of a high level power time to a pulse cycle) is 10% to 90%.

The matching unit 60 accommodates a matching device configured to attain matching between impedance on the radio frequency power supply 58 side, and impedance mainly on a load side such as an electrode, plasma, and the chamber main body 12. A blocking capacitor for self-bias generation is included in the matching device.

In a case where radio frequency power is pulse-modulated, the matching unit 60 is operated to perform matching on the basis of the synchronization signal PSS-R.

The electrostatic chuck 14c is provided on an upper surface of the base 14a. The electrostatic chuck 14c holds the workpiece WP with an electrostatic suction force. The electrostatic chuck 14c includes an electrode 14d, an insulating film 14e, and an insulating film 14f, and has an approximately disc shape. A central axial line of the electrostatic chuck 14c approximately matches the axial line Z. The electrode 14d of the electrostatic chuck 14c is constituted by a conductive film, and is provided between the insulating film 14e and the insulating film 14f. A DC power supply 64 is electrically connected to the electrode 14d through a switch 66 and a covered wire 68. The electrostatic chuck 14c can suction and hold the workpiece WP by a coulomb's force which is generated by a DC voltage applied from the DC power supply 64. A focus ring 14b is provided on the base 14a. The focus ring 14b is disposed to surround the workpiece WP and the electrostatic chuck 14c.

A coolant chamber 14g is provided at the inside of the base 14a. For example, the coolant chamber 14g is formed to extend around the axial line Z. A coolant is supplied into the coolant chamber 14g from a chiller unit through a pipe 70. The coolant, which is supplied into the coolant chamber 14g, returns to the chiller unit through a pipe 72. A temperature of the coolant is controlled by the chiller unit, and thus a temperature of the electrostatic chuck 14c and a temperature of the workpiece WP are controlled.

A gas supply line 74 is formed in the stage 14. The gas supply line 74 is provided to supply a heat transfer gas, for example, a He gas to a space between an upper surface of the electrostatic chuck 14c and a rear surface of the workpiece WP.

The microwave output device 16 outputs a microwave which excites a process gas which is supplied into the chamber main body 12. The microwave output device 16 is configured to variably adjust a frequency, power, and a bandwidth of the microwave. The microwave output device 16 may generate a microwave having a single frequency by setting, for example, a bandwidth of the microwave to substantially 0. The microwave output device 16 may generate a microwave having a bandwidth having a plurality of frequency components. Power levels of the plurality of frequency components may be the same as each other, and only a center frequency component in the bandwidth may have a power level higher than power levels of other frequency components. In an example, the microwave output device 16 may adjust the power of the microwave in a range of 0 W to 5000 W, may adjust the frequency or the center frequency of the microwave in a range of 2400 MHz to 2500 MHz, and may adjust the bandwidth of the microwave in a range of 0 MHz to 100 MHz. The microwave output device 16 may adjust a frequency pitch (carrier pitch) of the plurality of frequency components of the microwave in the bandwidth in a range of 0 to 25 kHz.

The microwave output device 16 may include a pulse generator, and may pulse-modulate and output power of a microwave. In this case, the microwave output device 16 pulse-modulates the microwave such that high level power and low level power are periodically repeated. The microwave output device 16 adjusts a pulse on the basis of a synchronization signal PSS-M generated by the pulse generator. The synchronization signal PSS-M is a signal for determining a cycle and a duty ratio of microwave power. As an example of setting during pulse modulation, a pulse frequency is 1 Hz to 20 kHz, and a duty ratio of a pulse (a ratio of a high level power time to a pulse cycle) is 10% to 90%. The microwave output device 16 may pulse-modulate microwave power to be synchronized with radio frequency power pulse-modulated, output from the radio frequency power supply 58.

The plasma processing apparatus 1 further includes a wave guide tube 21, a tuner 26, a mode converter 27, and a coaxial wave guide tube 28. An output unit of the microwave output device 16 is connected to one end of the wave guide tube 21. The other end of the wave guide tube 21 is connected to the mode converter 27. For example, the wave guide tube 21 is a rectangular wave guide tube. The tuner 26 is provided in the wave guide tube 21. The tuner 26 has stubs 26a, 26b, and 26c. Each of the stubs 26a, 26b, and 26c is configured to adjust a protrusion amount thereof with respect to an inner space of the wave guide tube 21. The tuner 26 adjusts a protrusion position of each of the stubs 26a, 26b, and 26c with respect to a reference position so as to match impedance of the microwave output device 16 with impedance of a load, for example, impedance of the chamber main body 12.

The mode converter 27 converts a mode of the microwave transmitted from the wave guide tube 21, and supplies the microwave having undergone mode conversion to the coaxial wave guide tube 28. The coaxial wave guide tube 28 includes an outer conductor 28a and an inner conductor 28b. The outer conductor 28a has an approximately cylindrical shape, and a central axial line thereof approximately matches the axial line Z. The inner conductor 28b has an approximately cylindrical shape, and extends on an inner side of the outer conductor 28a. A central axial line of the inner conductor 28b approximately matches the axial line Z. The coaxial wave guide tube 28 transmits the microwave from the mode converter 27 to the antenna 18.

The antenna 18 is provided on a surface 20b opposite to the lower surface 20a of the dielectric window 20. The antenna 18 includes a slot plate 30, a dielectric plate 32, and a cooling jacket 34.

The slot plate 30 is provided on a surface 20b of the dielectric window 20. The slot plate 30 is formed from a conductive metal, and has an approximately disc shape. A central axial line of the slot plate 30 approximately matches the axial line Z. A plurality of slot holes 30a are formed in the slot plate 30. In an example, the plurality of slot holes 30a constitute a plurality of slot pairs. Each of the plurality of slot pairs includes two slot holes 30a which extend in directions interesting each other and have an approximately elongated hole shape. The plurality of slot pairs are arranged along one or more concentric circles centering around the axial line Z. In addition, a through-hole 30d, through which a conduit 36 to be described later can pass, is formed in the central portion of the slot plate 30.

The dielectric plate 32 is formed on the slot plate 30. The dielectric plate 32 is formed from a dielectric material such as quartz, and has an approximately disc shape. A central axial line of the dielectric plate 32 approximately matches the axial line Z. The cooling jacket 34 is provided on the dielectric plate 32. The dielectric plate 32 is provided between the cooling jacket 34 and the slot plate 30.

A surface of the cooling jacket 34 has conductivity. A flow passage 34a is formed at the inside of the cooling jacket 34. A coolant is supplied to the flow passage 34a. A lower end of the outer conductor 28a is electrically connected to an upper surface of the cooling jacket 34. In addition, a lower end of the inner conductor 28b passes through a hole formed in a central portion of the cooling jacket 34 and the dielectric plate 32 and is electrically connected to the slot plate 30.

A microwave from the coaxial wave guide tube 28 propagates through the inside of the dielectric plate 32 and is supplied to the dielectric window 20 from the plurality of slot holes 30a of the slot plate 30. The microwave, which is supplied to the dielectric window 20, is introduced into the processing space S.

The conduit 36 passes through an inner hole of the inner conductor 28b of the coaxial wave guide tube 28. In addition, as described above, the through-hole 30d, through which the conduit 36 can pass, is formed at the central portion of the slot plate 30. The conduit 36 extends to pass through the inner hole of the inner conductor 28b, and is connected to a gas supply system 38.

The gas supply system 38 supplies a process gas for processing the workpiece WP to the conduit 36. The gas supply system 38 may include a gas source 38a, a valve 38b, and a flow rate controller 38c. The gas source 38a is a gas source of the process gas. The valve 38b switches supply and supply stoppage of the process gas from the gas source 38a. For example, the flow rate controller 38c is a mass flow controller, and adjusts a flow rate of the process gas from the gas source 38a.

The plasma processing apparatus 1 may further include an injector 41. The injector 41 supplies a gas from the conduit 36 to a through-hole 20h which is formed in the dielectric window 20. The gas, which is supplied to the through-hole 20h of the dielectric window 20, is supplied to the processing space S. In addition, the process gas is excited by a microwave which is introduced into the processing space S from the dielectric window 20. According to this, plasma is generated in the processing space 5, and the workpiece WP is processed by active species such as ions and/or radicals from the plasma.

The plasma processing apparatus 1 further includes a controller 100. The controller 100 collectively controls respective units of the plasma processing apparatus 1. The controller 100 may include a processor such as a CPU, a user interface, and a storage unit.

The processor executes a program and a process recipe which are stored in the storage unit so as to collectively control respective units such as the microwave output device 16, the stage 14, the gas supply system 38, and the exhaust device 56.

The user interface includes a keyboard or a touch panel with which a process manager performs an command input operation and the like so as to manage the plasma processing apparatus 1, a display which visually displays an operation situation of the plasma processing apparatus 1 and the like.

The storage unit stores control programs (software) for realizing various kinds of processing executed by the plasma processing apparatus 1 by a control of the processor, a process recipe including process condition data and the like, and the like. The processor calls various kinds of control programs from the storage unit and executes the control programs in correspondence with necessity including an instruction from the user interface. Desired processing is executed in the plasma processing apparatus 1 under the control of the processor.

Configuration Example of Microwave Output Device 16

Figure 2:
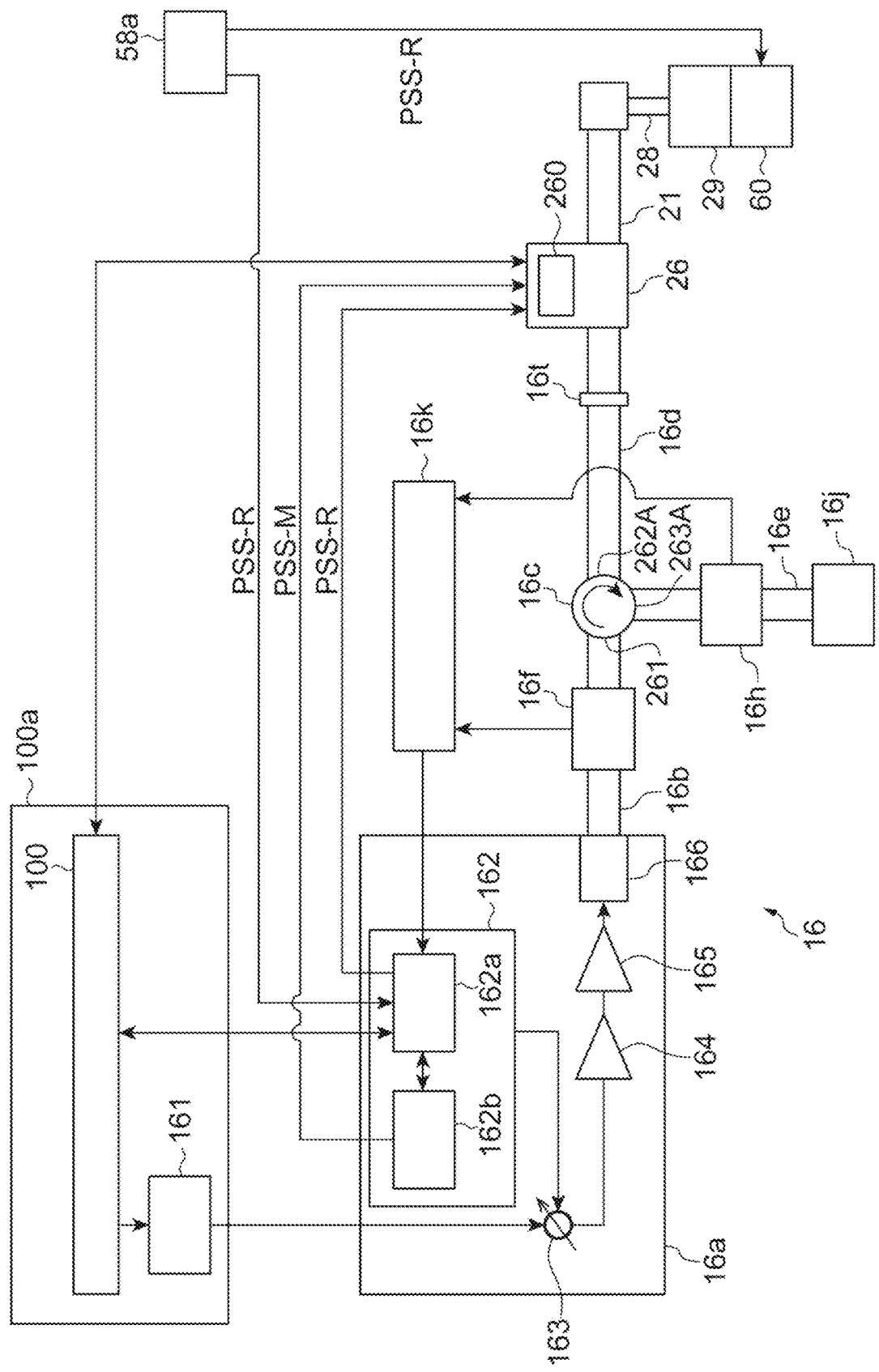
FIG. 2 is a diagram illustrating an example of a microwave output device.

FIG. 2 is a diagram illustrating an example of the microwave output device. As illustrated in FIG. 2, the microwave output device 16 is connected to a calculation device 100a including the controller 100 and a waveform generator 161.

The waveform generator 161 generates a waveform of a microwave. The waveform generator 161 generates a waveform of a microwave having a center frequency and a bandwidth respectively corresponding to a setting frequency and a setting bandwidth designated by the controller 100. The waveform generator 161 outputs the waveform of the microwave to the microwave output device 16.

The microwave output device 16 pulse-modulates the waveform of the microwave generated by the waveform generator 161 according to the setting in the controller 100, and outputs the microwave. The microwave output device 16 includes a microwave generation unit 16a, a wave guide tube 16b, a circulator 16c, a wave guide tube 16d, a wave guide tube 16e, a first directional coupler 16f, a second directional coupler 16h, a measurement unit 16k (an example of a measurement unit), and a dummy load 16j.

The microwave generation unit 16a generates the microwave of which power is pulse-modulated so as to obtain a pulse frequency, a duty ratio, high level power, and low level power respectively corresponding to a pulse frequency, a setting duty ratio, high level setting power, and low level setting power for which instructions are given by the controller 100.

The microwave generation unit 16a includes a power control unit 162, an attenuator 163, an amplifier 164, an amplifier 165, and a mode converter 166.

The waveform generator 161 is connected to the attenuator 163. The attenuator 163 is a device which can changes an attenuation amount (attenuation rate) according to an applied voltage value as an example. The attenuator 163 is connected to the power control unit 162. The power control unit 162 controls an attenuation rate (attenuation amount) of a microwave in the attenuator 163 by using an applied voltage value. The power control unit 162 controls an attenuation rate (attenuation amount) of a microwave in the attenuator 163 such that a microwave output from the waveform generator 161 becomes a microwave having power corresponding to a pulse frequency, a setting duty ratio, high level setting power, and low level setting power for which instructions are given by the controller 100.

The power control unit 162 includes a control unit 162a and a pulse generator 162b as an example. The control unit 162a may be a processor. The control unit 162a acquires a setting profile from the controller 100. The control unit 162a outputs information (a pulse frequency and a duty ratio) required for pulse modulation in the setting profile to the pulse generator 162b. The pulse generator 162b generates the synchronization signal PSS-M on the basis of the acquired information. The control unit 162a determines an attenuation rate (attenuation amount) of a microwave on the basis of the synchronization signal PSS-M, and the setting profile which is set by the controller 100.

The control unit 162a may acquire the synchronization signal PSS-R generated by a pulse generator 58a of the radio frequency power supply 58. The pulse generator 162b may generate the synchronization signal PSS-M synchronized with the synchronization signal PSS-R. In this case, pulse modulation of microwave power and pulse modulation of radio frequency power can be synchronized with each other.

An output of the attenuator 163 is connected to the mode converter 166 via the amplifier 164 and the amplifier 165. Each of the amplifier 164 and the amplifier 165 amplifies a microwave at a predetermined amplification rate. The mode converter 166 converts a propagation mode of a microwave output from the amplifier 165 from TEM into TE01. A microwave, which is generated through the mode conversion in the mode converter 166, is output as an output microwave of the microwave generation unit 16a.

An output of the microwave generation unit 16a is connected to one end of the wave guide tube 16b. The other end of the wave guide tube 16b is connected to a first port 261 of the circulator 16c. The circulator 16c includes a first port 261, a second port 262A, and a third port 263A. The circulator 16c outputs a microwave, which is input to the first port 261, from the second port 262A, and outputs a microwave, which is input to the second port 262A, from the third port 263A. One end of the wave guide tube 16d is connected to the second port 262A of the circulator 16c. The other end of the wave guide tube 16d is an output unit 16t of the microwave output device 16.

One end of the wave guide tube 16e is connected to the third port 263A of the circulator 16c. The other end of the wave guide tube 16e is connected to the dummy load 16j. The dummy load 16j receives a microwave which propagates through the wave guide tube 16e and absorbs the microwave. For example, the dummy load 16j converts the microwave into heat.

The first directional coupler 16f is provided between one end and the other end of the wave guide tube 16b. The first directional coupler 16f is configured to branch parts of microwaves (that is, travelling waves) which are output from the microwave generation unit 16a and propagate to the output unit 16t, and to output the parts of the travelling waves.

The second directional coupler 16h is provided between one end and the other end of the wave guide tube 16e. The second directional coupler 16h is configured to branch parts of reflected waves transmitted to the third port 263A of the circulator 16c with respect to microwaves (that is, reflected waves) which return to the output unit 16t, and to output the parts of the reflected waves.

The measurement unit 16k determines a first high measured value pf(H) and a first low measured value pf(L) respectively indicating a high level and a low level of power of a travelling wave at the output unit 16t on the basis of parts of travelling waves output from the first directional coupler 16f. The measurement unit 16k determines a second high measured value pr(H) and a second low measured value pr(L) respectively indicating a high level and a low level of power of a reflected wave at the output unit 16t on the basis of parts of reflected waves output from the second directional coupler 16h.

The measurement unit 16k is connected to the power control unit 162. The measurement unit 16k outputs the measured values to the power control unit 162. The power control unit 162 controls the attenuator 163 such that a difference between the measured values of a travelling wave and a reflected wave, that is, load power (effective power) matches setting power designated by the controller 100 (power feedback control).

The tuner 26 includes a tuner control unit 260. The tuner control unit 260 adjusts protrusion positions of the stubs 26a, 26b, and 26c such that impedance on the microwave output device 16 side matches impedance on the antenna 18 on the basis of a signal from the controller 100. The tuner control unit 260 causes a driver circuit and an actuator (not illustrated) to operate the stubs 26a, 26b, and 26c.

The tuner control unit 260 may acquire at least one of the synchronization signal PSS-M for microwave power generated by the pulse generator 162b and the synchronization signal PSS-R for radio frequency power generated by the pulse generator 58a of the radio frequency power supply 58. For example, the tuner control unit 260 acquires the synchronization signal PSS-M from the control unit 162a. The tuner control unit 260 may acquire the synchronization signal PSS-R from the control unit 162a, and may directly acquire the synchronization signal PSS-R from the pulse generator 58a of the radio frequency power supply 58. The tuner control unit 260 may operate the stubs 26a, 26b, and 26c in consideration of a synchronization signal.

Details of Waveform Generator

Figure 3:
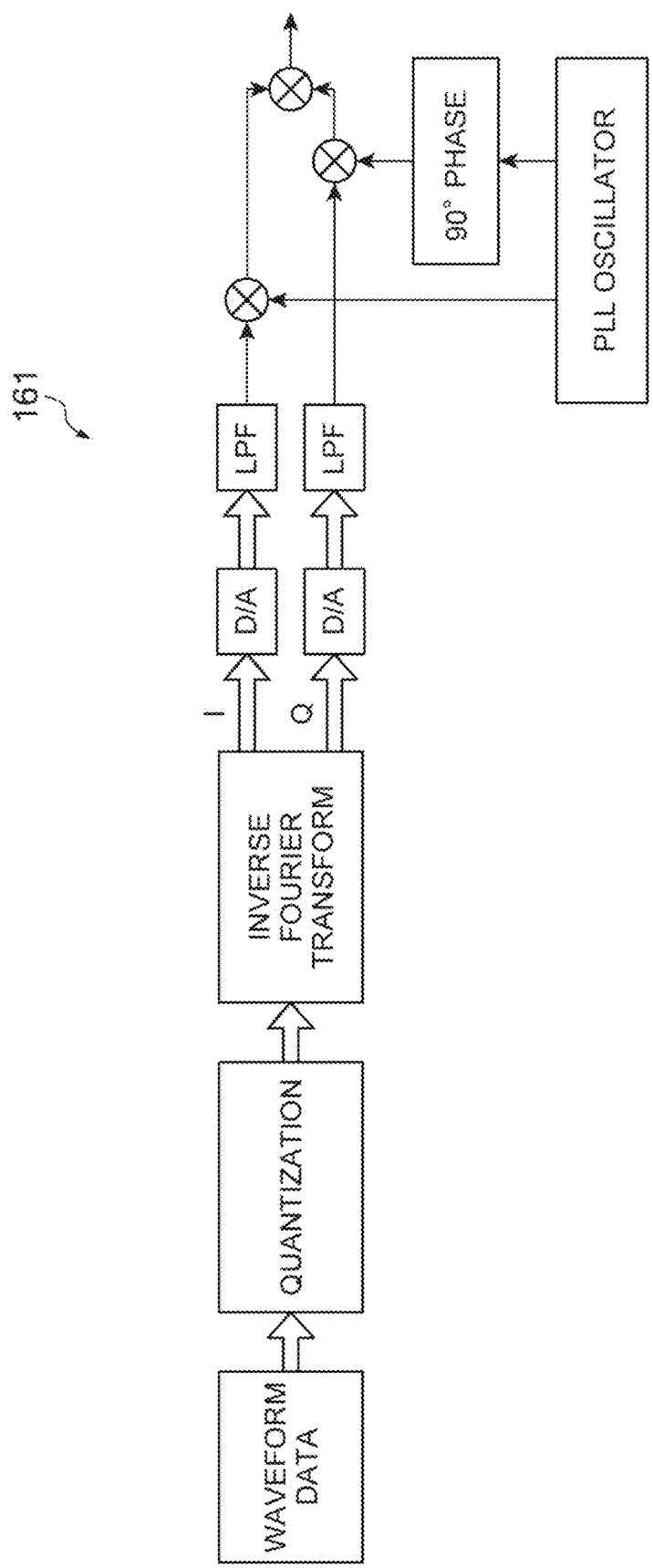
FIG. 3 is a diagram illustrating a microwave generation principle in a waveform generator.

FIG. 3 is a view illustrating a microwave generation principle in the waveform generator. As illustrated in FIG. 3, for example, the waveform generator 161 includes a phase locked loop (PLL) oscillator which can cause a microwave of which a phase is synchronized with that of a reference frequency to oscillate, and an IQ digital modulator which is connected to the PLL oscillator. The waveform generator 161 sets a frequency of a microwave which oscillates in the PLL oscillator to a setting frequency designated by the controller 100. The waveform generator 161 modulates a microwave from the PLL oscillator, and a microwave having a phase difference with the microwave from the PLL oscillator by 90° by using the IQ digital modulator. Consequently, the waveform generator 161 generates a microwave having a plurality of frequency components in a bandwidth or a microwave having a single frequency.

The waveform generator 161 may perform inverse discrete Fourier transform on, for example, N complex data symbols so as to generate a continuous signal and thus to generate a microwave having a plurality of frequency components. A method of generating such a signal may be a method such as an orthogonal frequency-division multiple access (OFDMA) modulation method used for digital TV broadcasting (for example, refer to Japanese Patent No. 5320260).

In an example, the waveform generator 161 has waveform data expressed by a digitalized code sequence in advance. The waveform generator 161 quantizes the waveform data, and applies the inverse Fourier transform to the quantized data so as to generate I data and Q data. The waveform generator 161 applies digital/analog (D/A) conversion to each of the I data and the Q data so as to obtain two analog signals. The waveform generator 161 inputs the analog signals to a low-pass filter (LPF) through which only a low frequency component passes. The waveform generator 161 mixes the two analog signals, which are output from the LPF, with a microwave from the PLL oscillator and a microwave having a phase difference with the microwave from the PLL oscillator by 90°, respectively. The waveform generator 161 combines microwaves which are generated through the mixing with each other. Consequently, the waveform generator 161 generates a frequency-modulated microwave having a single frequency component or a plurality of frequency components.

Example of Microwave

Figure 4:
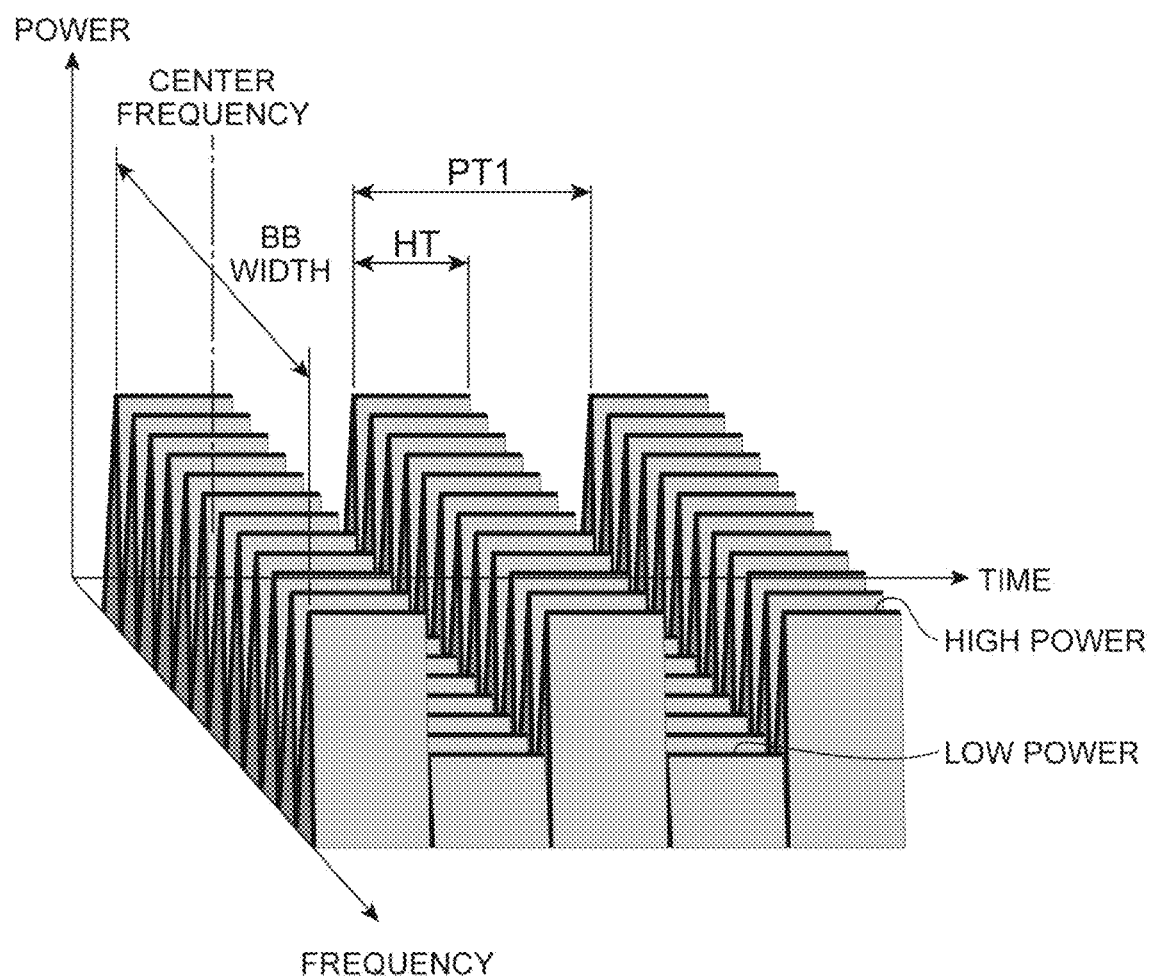
FIG. 4 is a diagram illustrating an example of a microwave of which power is pulse-modulated.

Microwave power output from the microwave generation unit 16a has a waveform modulated in a pulsed shape such that high level power and low level power are repeated. FIG. 4 illustrates an example of a microwave of which power is pulse-modulated. As illustrated in FIG. 4, a microwave has a center frequency and a bandwidth respectively corresponding to a setting frequency and a setting bandwidth for which instructions are given from the controller 100, and has a pulse frequency, a duty ratio, high level power, and low level power respectively corresponding to a pulse frequency, a setting duty ratio, high level setting power, and low level setting power for which instructions are given from the controller 100. The low level power is power lower than the high level power, is power higher than the lowest level required to maintain a plasma generation state.

Example of Microwave Synchronization Signal

Figure 5:
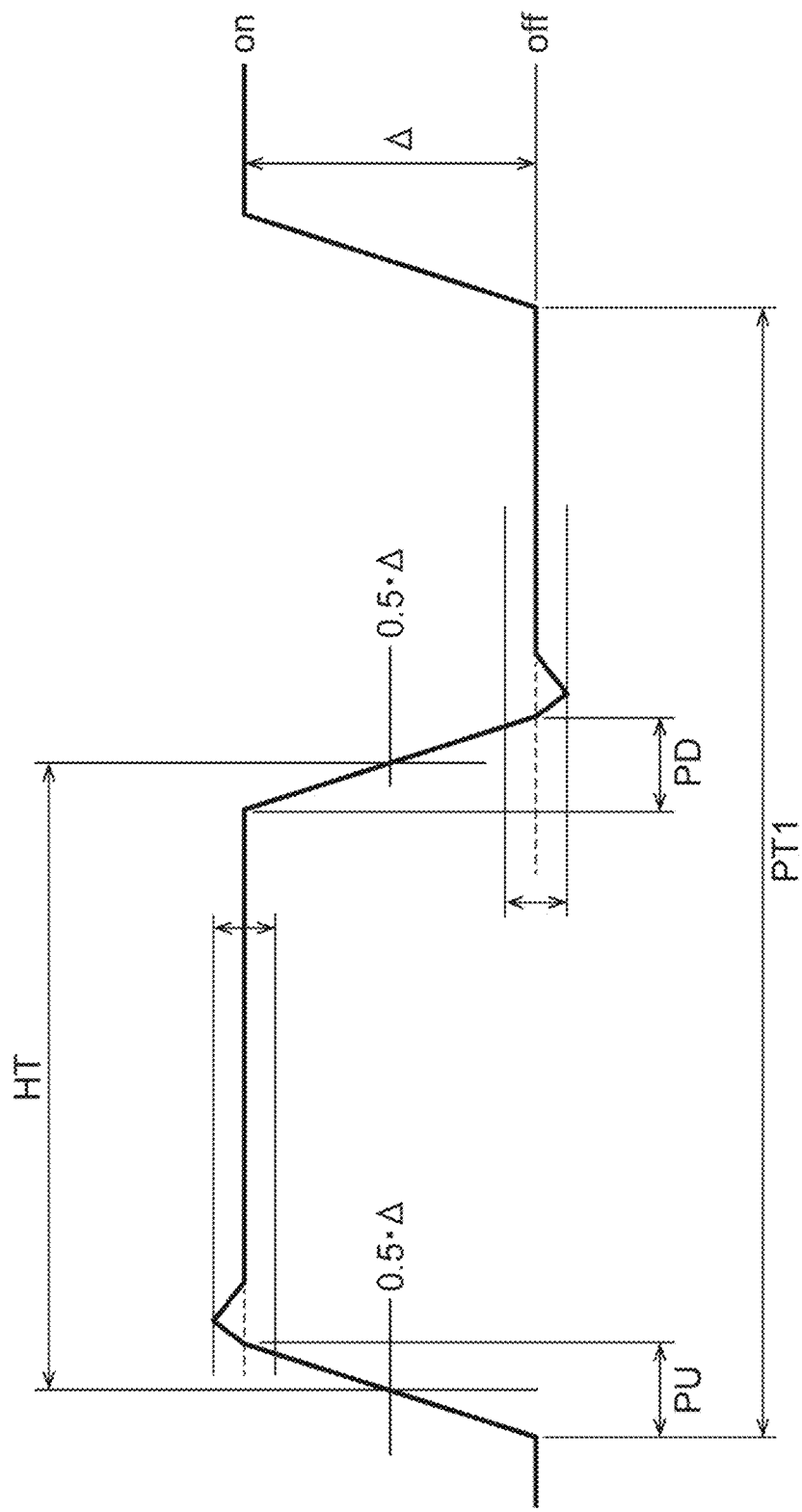
FIG. 5 is a diagram illustrating an example of a synchronization signal for modulating power of a microwave.

FIG. 5 illustrates an example of a synchronization signal for pulse-modulating a microwave. As illustrated in FIG. 5, the synchronization signal PSS-M is a pulse signal of which an ON state (high state) and an OFF state (low state) alternately appear. A pulse cycle PT1 of the synchronization signal PSS-M is defined by an interval between high level timings. When a difference between the high level and the low level is indicated by Δ, a high time HT is defined as a period from a timing at which the difference is 0.5Δ in a rising period PU of a pulse to a timing at which the difference is 0.5Δ in a falling period PD of the pulse. A ratio of the high time HT to the pulse cycle PT1 is the duty ratio. The pulse generator 162b generates a synchronization signal as illustrated in FIG. 5 on the basis of the pulse frequency (1/PT1) and the duty ratio (HT/PT1×100%) designated by the controller 100.

Example of Power Feedback

Figure 6:
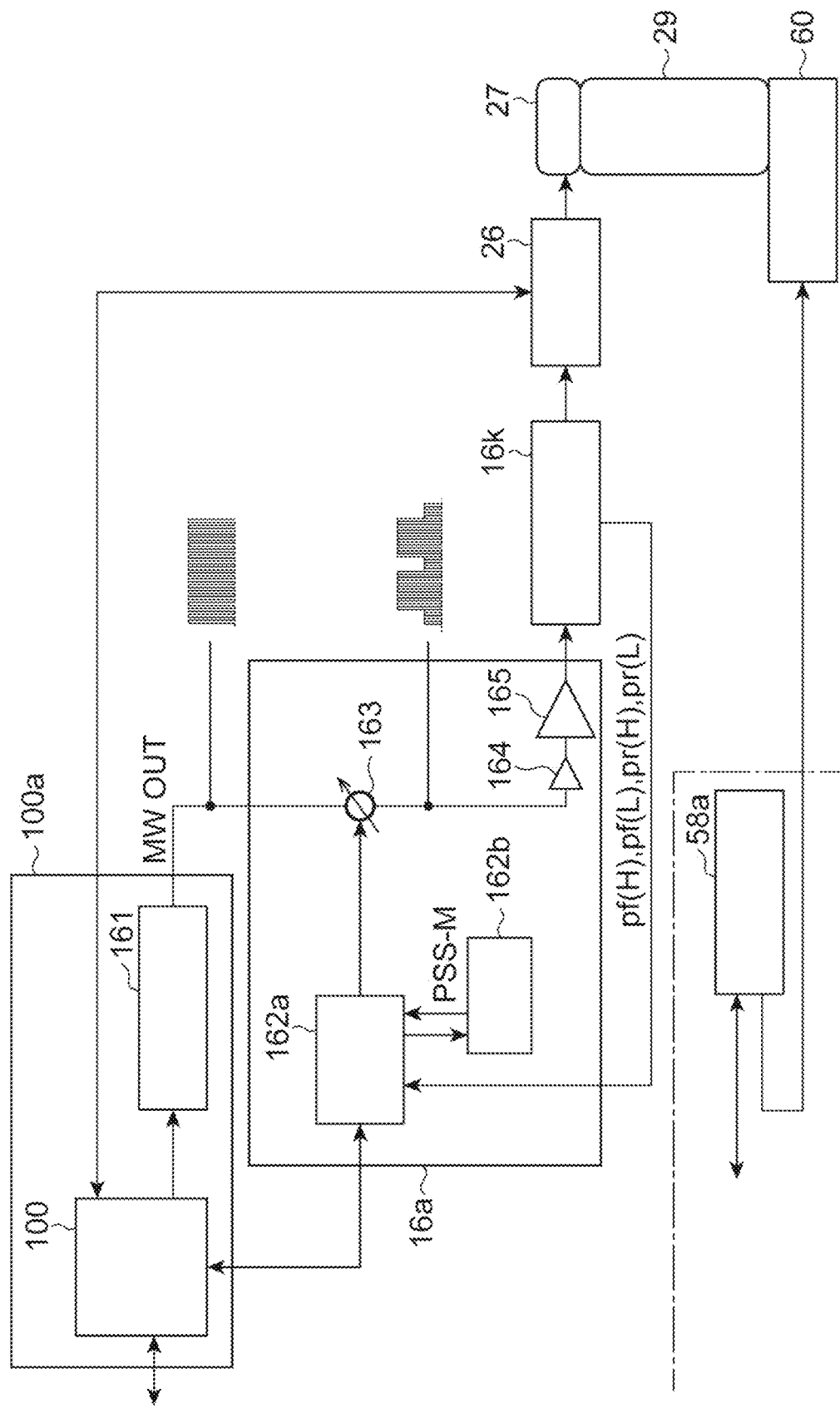
FIG. 6 is a diagram illustrating an example of a configuration regarding power feedback for a microwave.

FIG. 6 is a diagram illustrating an example of a configuration regarding power feedback for a microwave. As illustrated in FIG. 6, power feedback is realized by the measurement unit 16k, the control unit 162a, and the attenuator 163.

As illustrated in FIG. 6, the waveform generator 161 outputs a microwave having a bandwidth. The control unit 162a and the attenuator 163 pulse-modulates a microwave having a bandwidth. The microwave generation unit 16a outputs the pulse-modulated microwave. The measurement unit 16k measures power of a travelling wave and a reflected wave of the microwave, and outputs the power to the control unit 162a. The control unit 162a performed power feedback such that a difference between a power detection value of the travelling wave and a power detection value of the reflected wave is a set value. The set value is realized by the controller 100 through such a feedback loop.

Here, in a case where the power of the microwave is pulse-modulated, it is necessary to individually feedback-control high level power and low level power. In other words, the measurement unit 16k measures the first high measured value pf(H), the first low measured value pf(L), the second high measured value pr(H), and the second low measured value pr(L), and outputs the measured results to the control unit 162a. The control unit 162a switches between feedback of the high level power and feedback of the low level power on the basis of the synchronization signal PSS-M.

The control unit 162a controls the high level power of the pulse-modulated microwave on the basis of the first high measured value pf(H), the second high measured value pr(H), and the high level setting power during feedback of the high level power. The control unit 162a controls the low level power of the pulse-modulated microwave on the basis of the first low measured value pf(L), the second low measured value pr(L), and the low level setting power during feedback of the low level power.

More specifically, during the feedback of the high level power, the control unit 162a controls the high level power of the microwave output from the microwave output device 16 such that a difference between the first high measured value pf(H) and the second high measured value pr(H) comes close to the setting high power designated by the controller 100. During the feedback of the low level power, the control unit 162a controls the low level power of the microwave output from the microwave output device 16 such that a difference between the first low measured value pf(L) and second low measured value pr(L) comes close to the setting low power designated by the controller 100. Consequently, load power of the microwave supplied to a load connected to the output unit 16t can come close to the setting power.

Switching Between Feedback Control Modes

The control unit 162a may change calculation for feedback according to a control mode. A control mode may be designated by the controller 100. For example, in a case where a control mode for which an instruction is given from the controller 100 is a PL mode (an example of a first control mode), the control unit 162a controls the power of the microwave by using a power difference between the travelling wave and the reflected wave as described above. In a case where a control mode for which an instruction is given from the controller 100 is a Pf mode (an example of a second control mode), the control unit 162a controls the power of the microwave by using only the power of the travelling wave. As a more specific example, in a case where a control mode for which an instruction is given from the controller 100 is the Pf mode, the control unit 162a controls the high level power of the pulse-modulated microwave such that the first high measured value pf(H) comes close to the high level setting power, and controls the low level power of the pulse-modulated microwave such that the first low measured value pf(L) comes close to the low level setting power.

Figure 7A:
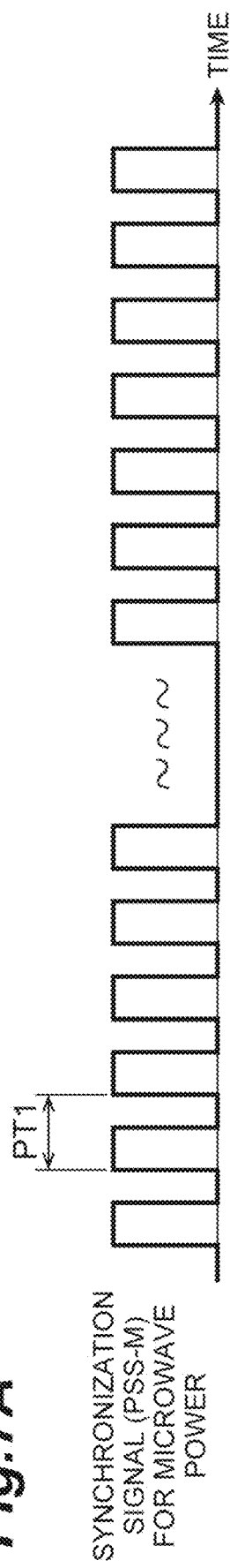
FIGS. 7A and 7B are diagrams illustrating an example of a case where a synchronization signal for modulating power of a microwave is not synchronized with a synchronization signal for modulating power of a radio frequency.
Figure 7B:
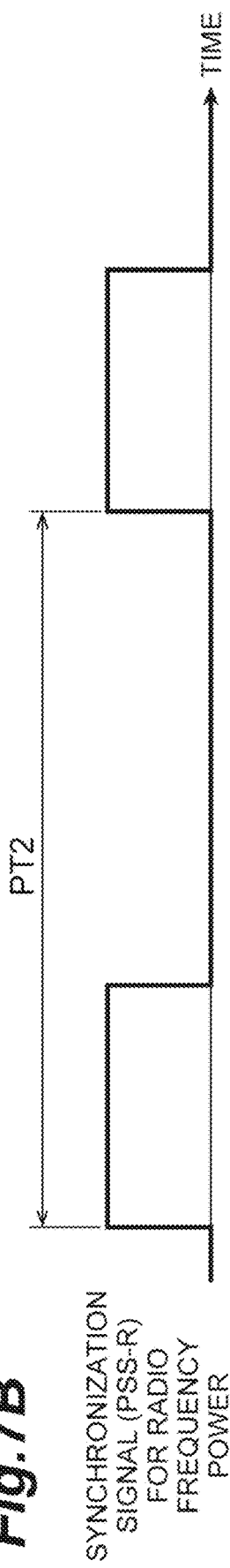

Relationship Between Synchronization Signals for Microwave Power and Radio Frequency Power The microwave power and the radio frequency power are all pulse-controlled. In the configuration illustrated in FIG. 6, the synchronization signal PSS-R for radio frequency power is not input to the control unit 162a. The synchronization signal PSS-M for a microwave is not input to the radio frequency power supply 58. Thus, the microwave power and the radio frequency power are not synchronized with each other. FIGS. 7A and 7B are diagrams illustrating an example of a case where a synchronization signal for modulating power of a microwave is not synchronized with a synchronization signal for modulating power of a radio frequency. A signal in FIG. 7A is the synchronization signal PSS-M for microwave power and a signal in FIG. 7B is the synchronization signal PSS-R for radio frequency power. As illustrated in FIGS. 7A and 7B, the pulse cycle PT1 of the synchronization signal PSS-M for microwave power and a pulse cycle PT2 of the synchronization signal PSS-R for radio frequency power are not synchronized with each other.

Figure 8:
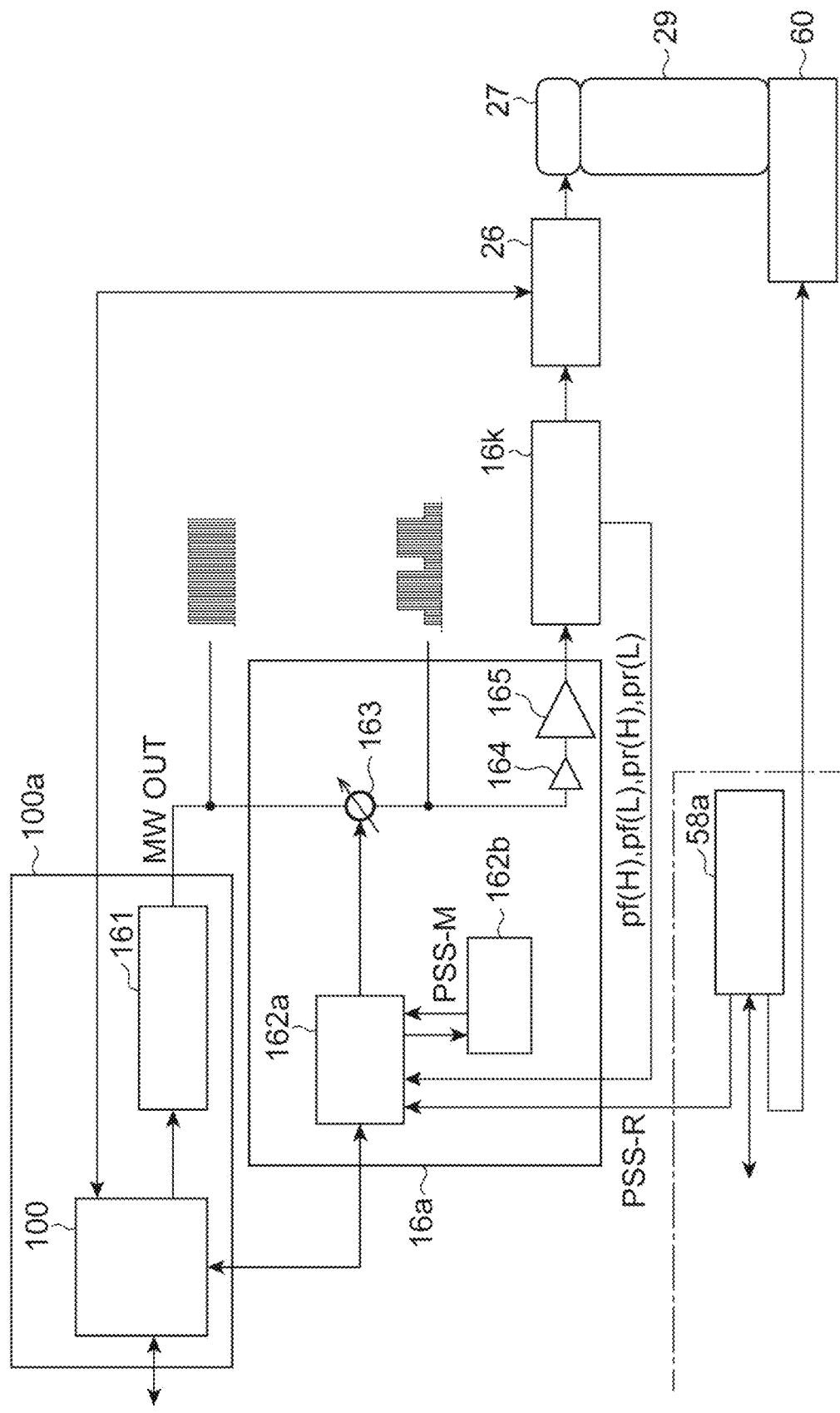
FIG. 8 is a diagram illustrating another example of a configuration regarding power feedback for a microwave.

In an exemplary embodiment, the microwave power and the radio frequency power may be synchronized with each other. In this case, it is possible to reduce the influence of pulse modulation of radio frequency power exerted on the reflected wave of the microwave. FIG. 8 is a diagram illustrating another example of a configuration regarding power feedback for a microwave. When compared with the configuration regarding asynchronous power feedback illustrated in FIG. 6, in another example, there is a difference in that the microwave output device generates a microwave of which power is pulse-modulated to be synchronized with radio frequency power. The pulse generator 58a of the radio frequency power supply 58 outputs the synchronization signal PSS-R for radio frequency power to the control unit 162a. The control unit 162a outputs a synchronization trigger for synchronization with the synchronization signal PSS-R to the pulse generator 162b. The pulse generator 162b generates the synchronization signal PSS-M for microwave power synchronized with the synchronization signal PSS-R on the basis of the synchronization trigger. The control unit 162a controls the attenuator 163 by using the synchronization signal PSS-M. Consequently, a microwave of which power is pulse-modulated is output to be synchronized with the radio frequency power.

First Synchronization Example

Figure 9:
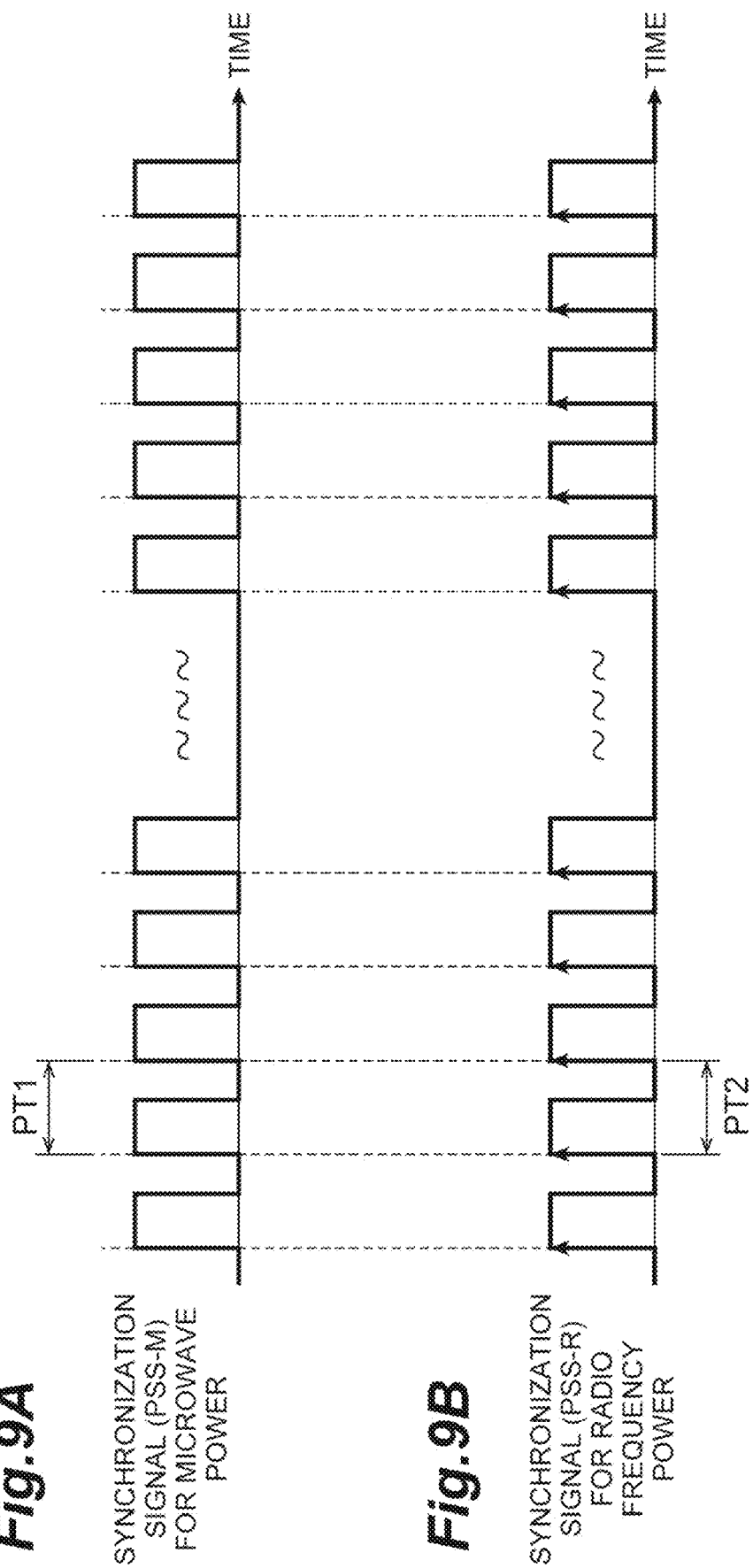
FIGS. 9A and 9B are diagrams illustrating a first synchronization example in which a synchronization signal for modulating power of a microwave is synchronized with a synchronization signal for modulating power of a radio frequency.

FIGS. 9A and 9B are diagrams illustrating a first synchronization example in which a synchronization signal for modulating power of a microwave is not synchronized with a synchronization signal for modulating power of a radio frequency. A signal in FIG. 9A is the synchronization signal PSS-M for microwave power, and a signal in FIG. 9B is the synchronization signal PSS-R for radio frequency power. The control unit 162a acquires a timing at which radio frequency power has a high level on the basis of the synchronization signal PSS-R (an arrow in the figure). The control unit 162a outputs the timing at which radio frequency power has a high level to the pulse generator 162b as a synchronization trigger. The pulse generator 162b synchronizes a timing at which microwave power has a high level with the timing at which radio frequency power has a high level. Consequently, the pulse cycle PT1 for a microwave can be synchronized with the pulse cycle PT2 for radio frequency power. A synchronization number No. 1 is allocated to the first synchronization example.

Second Synchronization Example

Figure 10:
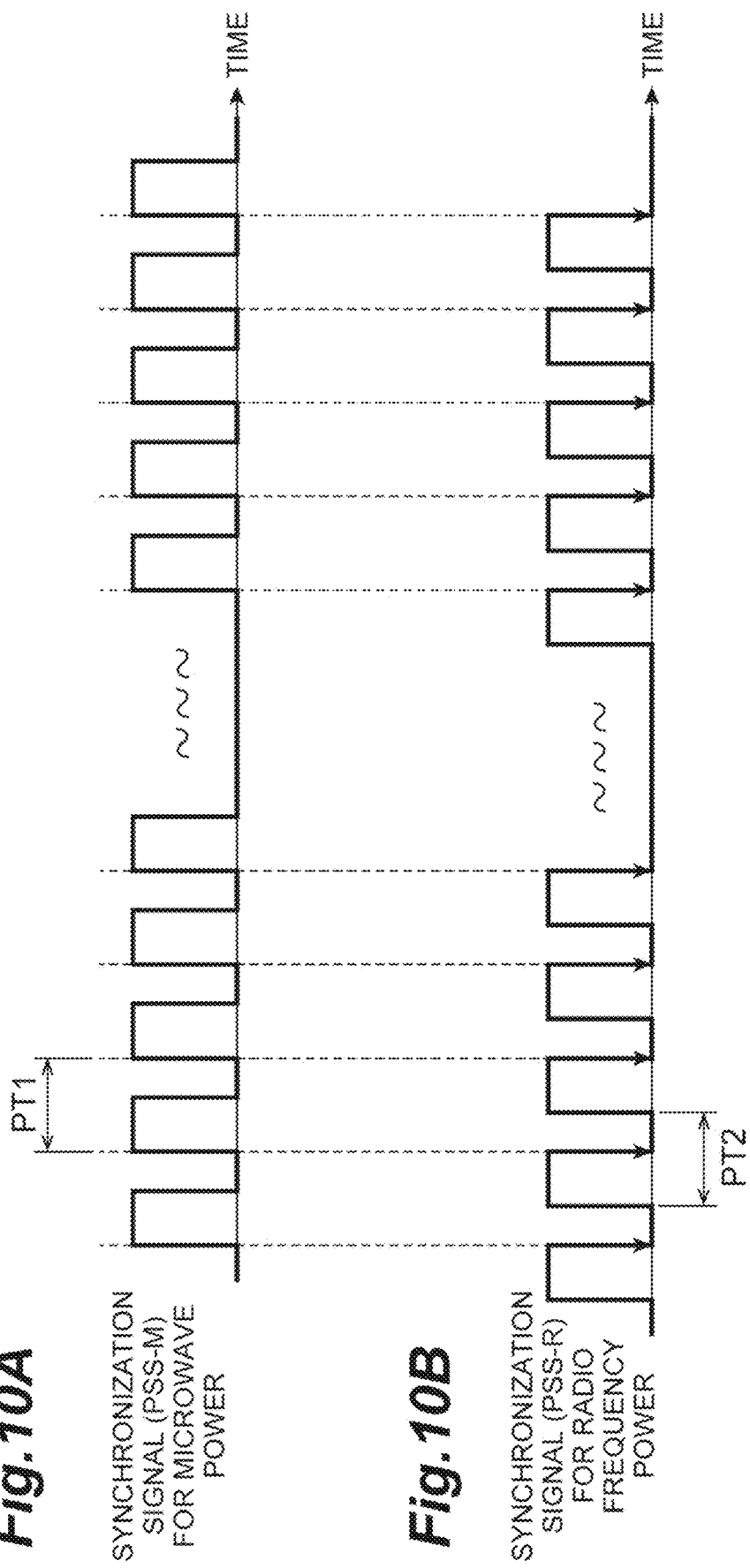
FIGS. 10A and 10B are diagrams illustrating a second synchronization example in which a synchronization signal for modulating power of a microwave is synchronized with a synchronization signal for modulating power of a radio frequency.

FIGS. 10A and 10B are diagrams illustrating a second synchronization example in which a synchronization signal for modulating power of a microwave is not synchronized with a synchronization signal for modulating power of a radio frequency. A signal in FIG. 10A is the synchronization signal PSS-M for microwave power, and a signal in FIG. 10B is the synchronization signal PSS-R for radio frequency power. The control unit 162a acquires a timing at which radio frequency power has a low level on the basis of the synchronization signal PSS-R (an arrow in the figure). The control unit 162a outputs the timing at which radio frequency power has a low level to the pulse generator 162b as a synchronization trigger. The pulse generator 162b synchronizes a timing at which microwave power has a low level with the timing at which radio frequency power has a low level. Consequently, the pulse cycle PT1 for a microwave can be synchronized with the pulse cycle PT2 for radio frequency power. A synchronization number No. 2 is allocated to the second synchronization example.

Detailed Configuration of Power Feedback

First Example of Detailed Configuration

Figure 11:
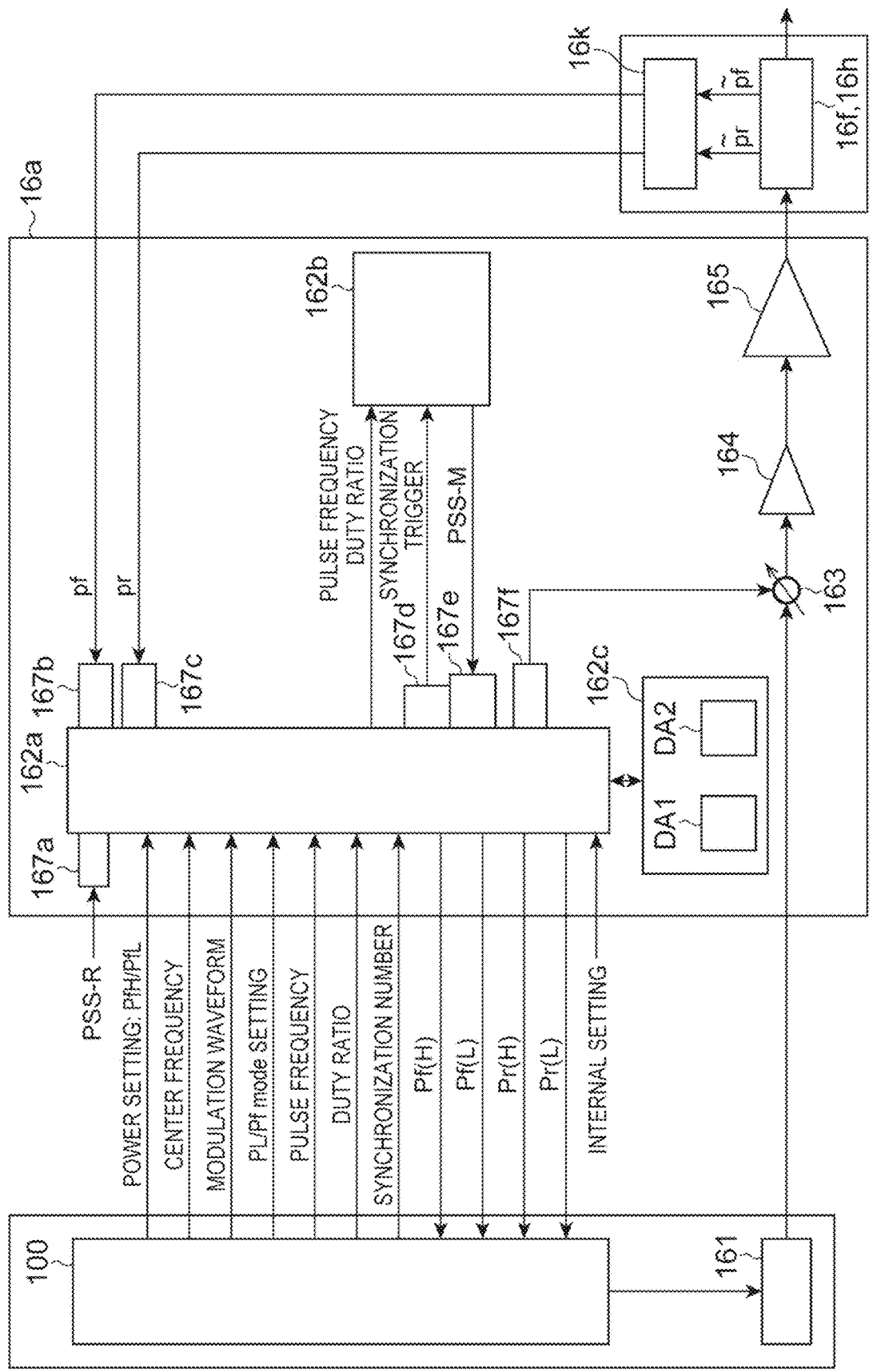
FIG. 11 is a diagram illustrating a first example of a detailed configuration regarding power feedback in the microwave output device.

FIG. 11 is a diagram illustrating a first example of a detailed configuration regarding power feedback of the microwave output device. As illustrated in FIG. 11, the control unit 162a of the microwave generation unit 16a acquires a setting profile from the controller 100. The setting profile includes at least high level setting power NH, low level setting power PfL, a pulse frequency, a duty ratio, and a synchronization number. The synchronization number is an identifier for selecting the type of synchronization, and is, for example, a number for identifying the first synchronization example and the second synchronization example. In a case where the synchronization number is not designated, a synchronization signal for power modulation of a microwave is not synchronized with a synchronization signal for power modulation of a radio frequency. Alternatively, one of synchronization numbers may be allocated to asynchronization. The setting profile may include a center frequency, a modulation waveform, and setting of PL/Pf mode. The modulation waveform is a setting bandwidth. The control unit 162a outputs the pulse frequency and the duty ratio acquired from the controller 100 to the pulse generator 162b.

The control unit 162a includes a pulse input unit 167a. The control unit 162a acquires the synchronization signal PSS-R for radio frequency power via the pulse input unit 167a. The control unit 162a generates a synchronization trigger on the basis of the synchronization signal PSS-R and the synchronization number. In a case where a synchronization number is not designated, the control unit 162a may not generate a synchronization trigger. The control unit 162a includes a pulse output unit 167d. The control unit 162a outputs the synchronization trigger to the pulse generator 162b via the pulse output unit 167d.

The pulse generator 162b generates the synchronization signal PSS-M for a microwave on the basis of the pulse frequency, the duty ratio, and the synchronization trigger. In a case where a synchronization signal for power modulation of a microwave is not synchronized with a synchronization signal for power modulation of a radio frequency, the pulse generator 162b generates the synchronization signal PSS-M for a microwave on the basis of the pulse frequency and the duty ratio.

The control unit 162a determines an applied voltage value for the attenuator 163 on the basis of the synchronization signal PSS-M. The control unit 162a outputs the applied voltage value to a D/A converter 167f. The D/A converter 167f converts a digital signal of the output (set) voltage value into an analog signal. The control unit 162a applies a voltage to the attenuator 163 via the D/A converter 167f. Consequently, a pulse-modulated microwave is output from the microwave generation unit 16a.

The measurement unit 16k outputs travelling wave power and reflected wave power related to microwaves output from the first directional coupler 16f and the second directional coupler 16h, as a measured value pf of the travelling wave power and a measured value pr of the reflected wave power.

The control unit 162a includes A/D converters 167b and 167c which convert an analog signal into a digital signal. The control unit 162a acquires the measured value pf of the travelling wave power and the measured value pr of the reflected wave power from the measurement unit 16k via the A/D converters 167b and 167c.

The control unit 162a is configured to be able to refer to a storage unit 162c. The control unit 162a may specify data to be acquired from the measured values (pf and pr) by referring to definition data DA1 stored in the storage unit 162c. The definition data DA1 includes, for example, a mask (filter) for restricting a period in which a data point is sampled. For example, the definition data DA1 of which internal setting is input by the control unit 162a is stored in the storage unit 162c in advance.

The control unit 162a refers to the definition data DA1, and detects the high level measured value pfH and the low level measured value pfL included in the measured value pf of the travelling wave power, and detects the high level measured value prH and the low level measured value prL included in the measured value pr of the reflected wave power. As an example, the definition data DA1 includes a definition that high level measured values (pfH and prH) cannot be sampled in an H detection mask time (first mask period) until a predetermined time elapses from an high level timing. As an example, the definition data DA1 includes a definition that low level measured values (pfL and prL) cannot be sampled in an L detection mask time (second mask period) until a predetermined time elapses from a low level timing. As an example, the definition data DA1 includes a definition that high level power is measured in an H detection section (first sample period) from the end of the H detection mask time to a low level timing, and low level power is measured in an L detection section (second sample period) from the end of the L detection mask time to a high level timing.

The control unit 162a stores the detected measured values (pfH, pfL, prH, and prL) in the storage unit 162c in a time series. Consequently, a time-series buffer DA2 is generated. The time-series buffer DA2 is used for a measured value averaging process. The control unit 162a calculates movement average times of the respective measured values (pfH, pfL, prH, and prL) by referring to the time-series buffer DA2. The control unit 162a calculates averaged measured values (Pf(H), Pf(L), Pr(H), and Pr(L)) by using the respective movement average times.

The control unit 162a determines an applied voltage value for the attenuator 163 such that an output from the microwave generation unit 16a comes close to the setting power by using the averaged measured values (Pf(H), Pf(L), Pr(H), and Pr(L)), the high level setting power Pal, and the low level setting power PfL. For example, the control unit 162a determines a first signal (an applied voltage value for high level power) for applying a first attenuation amount to microwave power and a second signal (an applied voltage value for low level power) for applying a second attenuation amount to microwave power. The control unit 162a applies a voltage to the attenuator 163 via the D/A converter 167E Consequently, power feedback is performed.

The control unit 162a may output the averaged measured values to the controller 100. The averaged measured values are stored in a storage unit of the controller 100 or are output to the outside of the apparatus as operation information or log information of the apparatus.

Second Example of Detailed Configuration

Figure 12:
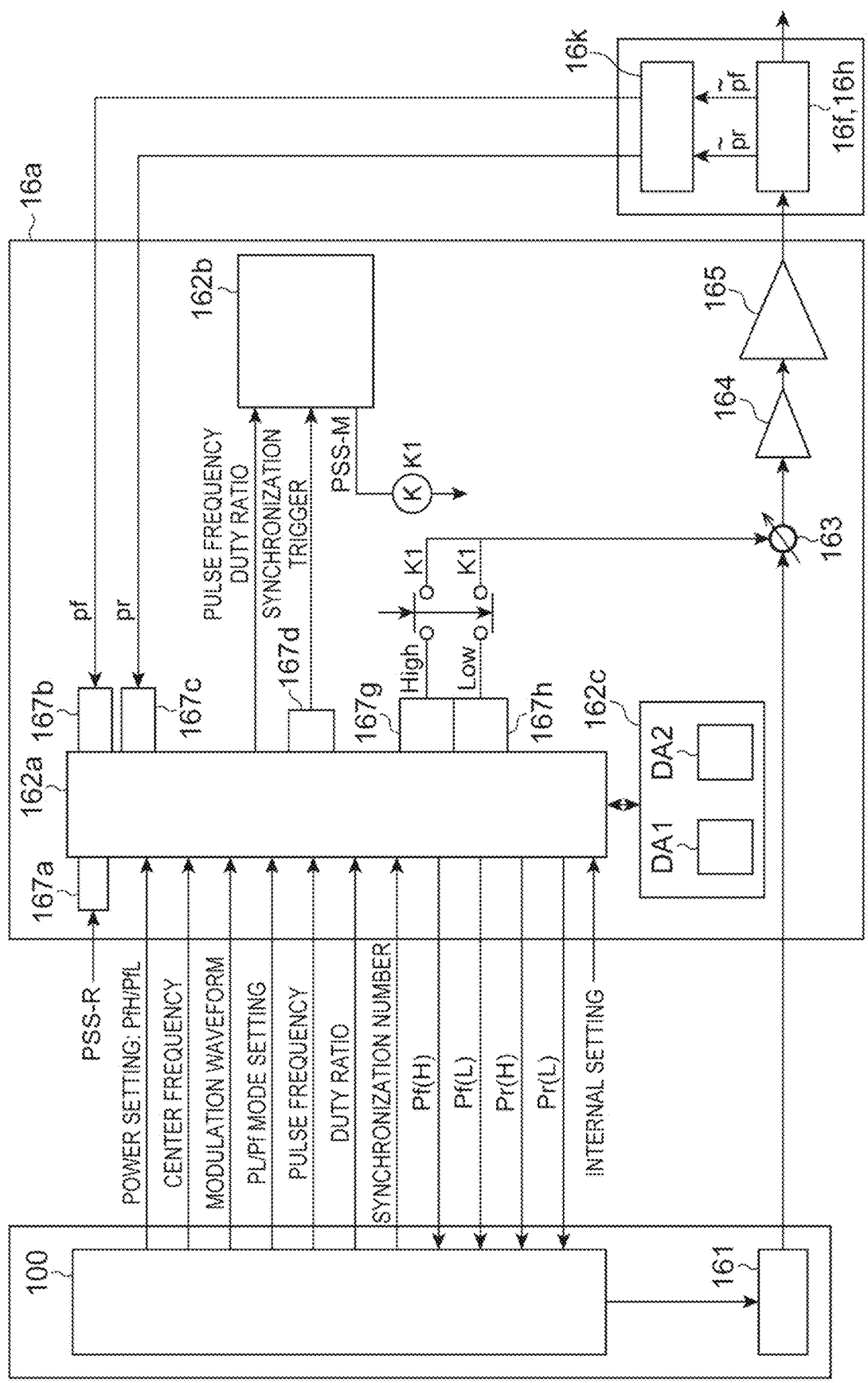
FIG. 12 is a diagram illustrating a second example of a detailed configuration regarding power feedback in the microwave output device.

FIG. 12 is a diagram illustrating a second example of a detailed configuration regarding power feedback of the microwave output device. A configuration related to the second example is the same as the configuration related to the first example illustrated in FIG. 11 except that a D/A converter 167g for a high signal and a D/A converter 167h for a low signal are provided instead of the D/A converter 167f, and the synchronization signal PSS-M is not output from the pulse output unit 167d to the control unit 162a. Thus, a description overlapping FIG. 11 will be omitted.

The control unit 162a is connected to the D/A converter 167g (first converter) which pedal ms D/A conversion on an applied voltage value for high level power and the D/A converter 167h (second converter) which performs D/A conversion on an applied voltage value for low level power. The D/A converter 167g is set in advance to output an analog signal corresponding to an applied voltage value for high level power. The D/A converter 167h is set in advance to output an analog signal corresponding to an applied voltage value for low level power. A solid state relay K1 (switch) which switches between a connection between the D/A converter 167g and the attenuator 163 and a connection between the D/A converter 167h and the attenuator 163 is provided among the D/A converter 167g, the D/A converter 167h, and the attenuator 163. The solid state relay K1 switches between the connections by directly referring to the synchronization signal PSS-M from the pulse output unit 167d. Consequently, the configuration of the second example can rapidly switch between an applied voltage value for high level power and an applied voltage value for low level power compared with the configuration of the first example. In other words, the configuration of the second example can pulse-modulate microwave power in a shorter cycle than the configuration of the first example.

Detection Section

Figure 13A:
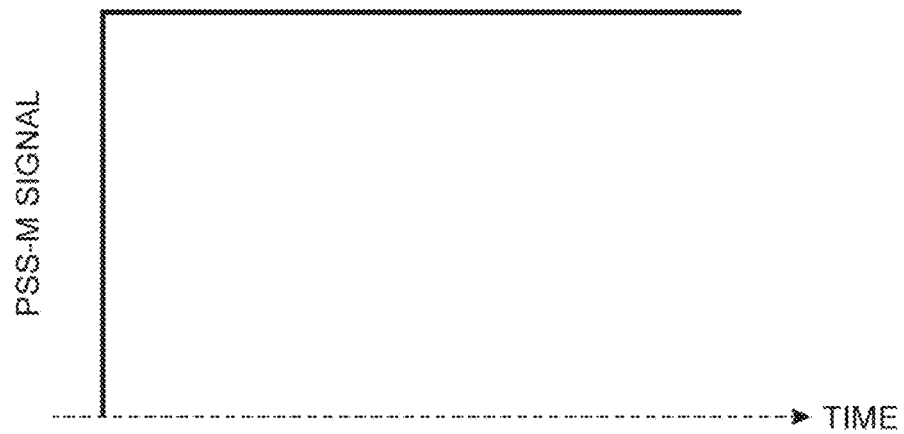
FIGS. 13A and 13B are diagrams illustrating examples of a synchronization signal for and power of a microwave during non-modulation of power.
Figure 13B:
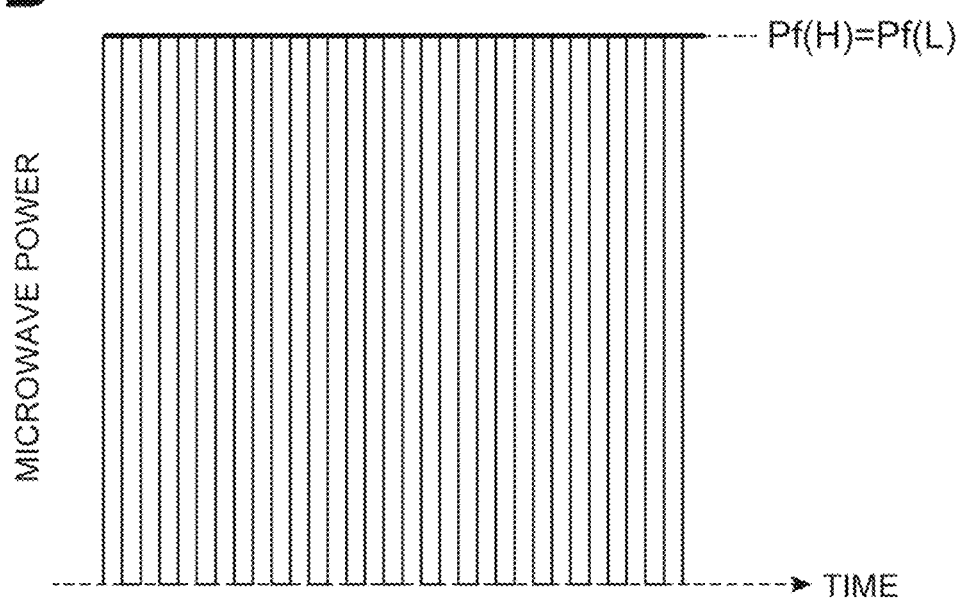

FIGS. 13A and 13B illustrate examples of a synchronization signal for and power of a microwave during non-modulation of power. A signal in FIG. 13A is the synchronization signal PSS-M, and a signal in FIG. 13B indicates travelling wave power of a microwave. As illustrated in FIGS. 13A and 13B, in a case where microwave power is not pulse-modulated, the synchronization signal PSS-M has a constant value. Since the microwave power is also constant, averaged measured values (Pf(H) and Pf(L)) are the same as each other even by using a movement average time in any period. Similarly, for reflected wave power, averaged measured values (Pr(H) and Pr(L)) are the same as each other.

During power modulation, microwave power is periodically modulated. Thus, in order to acquire a high level measured value and a low level measured value, measurement is required to be performed on the basis of the synchronization signal PSS-M. An H detection mask time, an H detection section, an L detection mask time, and an L detection section are stored in the storage unit 162c as the definition data DA1.

Figure 14A:
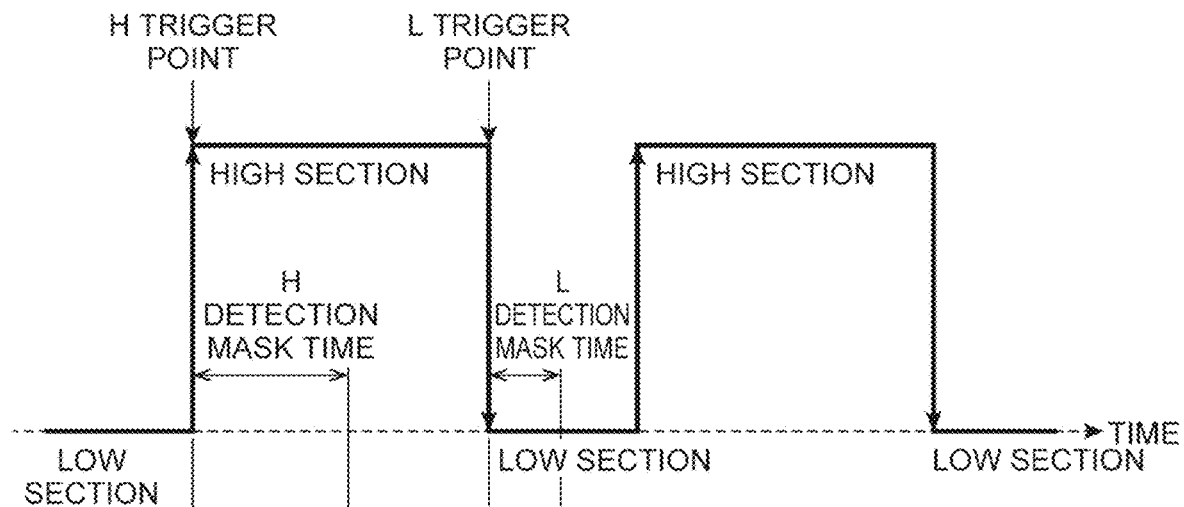
FIGS. 14A and 14B are diagrams for explaining a microwave detection section during power modulation.
Figure 14B:
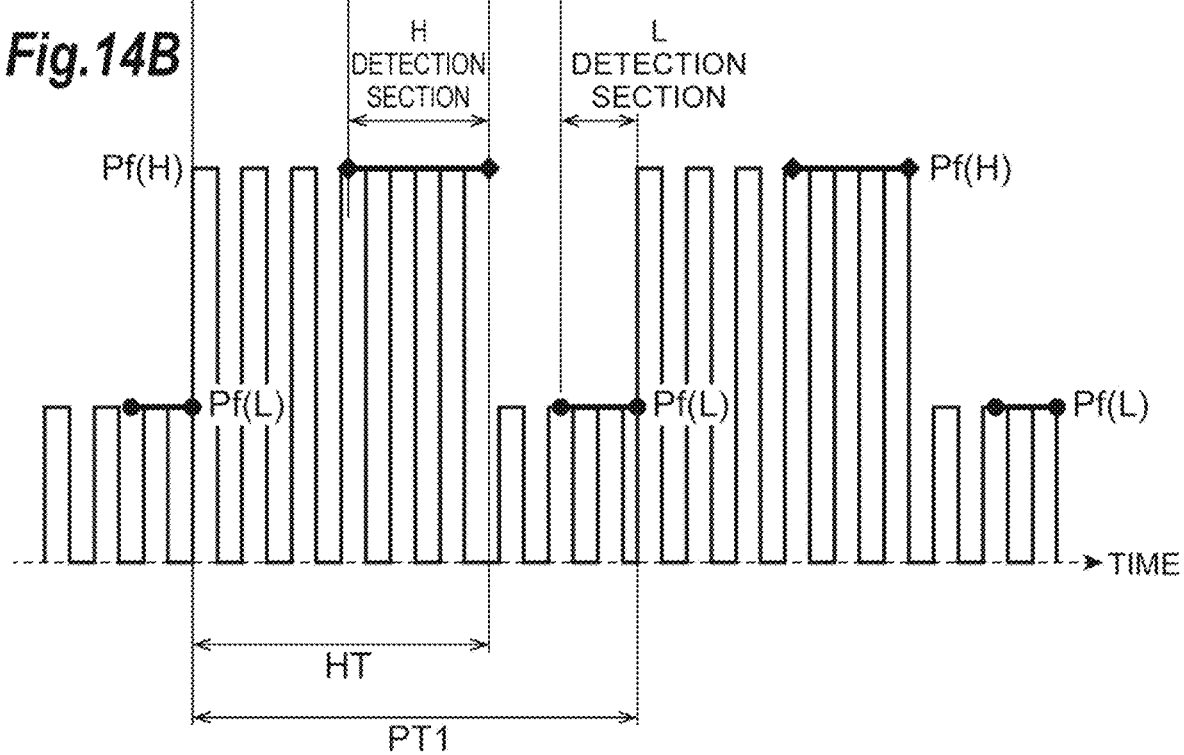

Detection sections are the same as each other for travelling wave power and reflected wave power. Thus, hereinafter, the travelling wave power will be described as an example, and description of the reflected wave power will be omitted. FIGS. 14A and 14B are diagrams for explaining a detection section of a microwave during power modulation. A signal in FIG. 14A is the synchronization signal PSS-M, and a signal in FIG. 14B indicates travelling wave power of a microwave. As illustrated in FIGS. 14A and 14B, an ON section of the synchronization signal PSS-M is set to a high section, and an OFF section is set to a low section. Rising of a pulse of the synchronization signal PSS-M is set to an H trigger point (high level timing), and falling of the pulse is set to an L trigger point (low level timing).

The H detection mask time is a time until a predetermined time elapses from the H trigger point. For the H detection mask time, acquisition of data is prohibited. The H detection mask time is provided such that acquisition of data is prevented in a section in which microwave power is unstable. The H detection section is a section from the end of the H detection mask time to the L trigger point. The H detection section is a section in which a high level measured value pfH of a travelling wave is acquired.

The L detection mask time is a time until a predetermined time elapses from the L trigger point. For the L detection mask time, acquisition of data is prohibited. The L detection mask time is provided such that acquisition of data is prevented in a section in which microwave power is unstable. The L detection section is a section from the end of the L detection mask time to the H trigger point. The L detection section is a section in which a low level measured value pfL of a travelling wave is acquired.

Averaged measured values (Pf(H) and Pf(L)) are calculated on the basis of measured values (pfH and pfL) detected in the H detection section and the L detection section.

Average Value of Power

FIGS. 15A and 15B are diagrams for explaining an average value of power during power modulation. FIG. 15A illustrates the measured value pf of travelling wave power, and FIG. 15B illustrates the measured value pr of reflected wave power.

As the time-series buffer DA2, each of the high level measured value pfH of travelling wave power, the low level measured value pfL of travelling wave power, the high level measured value prH of reflected wave power, and the low level measured value prL of reflected wave power is stored in the storage unit 162c in a time series.

When the high level measured value pfH is described as an example, the measured value pfH may be handled as a measured value in a section obtained by connecting a plurality of H detection sections to each other on the time-series buffer DA2 in the storage unit 162c. The value is data acquired in the past. The control unit 162a determines a movement average time by using the section obtained by connecting a plurality of H detection sections to each other. The control unit 162a calculates the averaged measured value Pf(H) by using the movement average time.

The control unit 162a calculates each movement average time in the same manner for pfL, prH, and prL, and calculates the averaged measured value Pf(L), the averaged measured value Pr(H), and the averaged measured value Pr(L). A power feedback process is performed by using the averaged measured values.

Operation of Microwave Output Device

Hereinafter, a description will be made of an operation of the microwave output device.

Power Control Process During Pulse Modulation

The control unit 162a of the microwave generation unit 16a performs, as a power control process during pulse modulation, five processes such as a process of generating the synchronization signal PSS-M for a microwave, a process of switching voltage values for the attenuator 163 based on the synchronization signal PSS-M, a process of writing travelling wave power Pf and reflected wave power Pr to the storage unit 162c, a measured value averaging process, and a process of setting a control voltage for the attenuator 163 in parallel to each other in a multitasking manner. Hereinafter, details thereof will be described.

Process of Generating Synchronization Signal for Microwave

Figure 16:
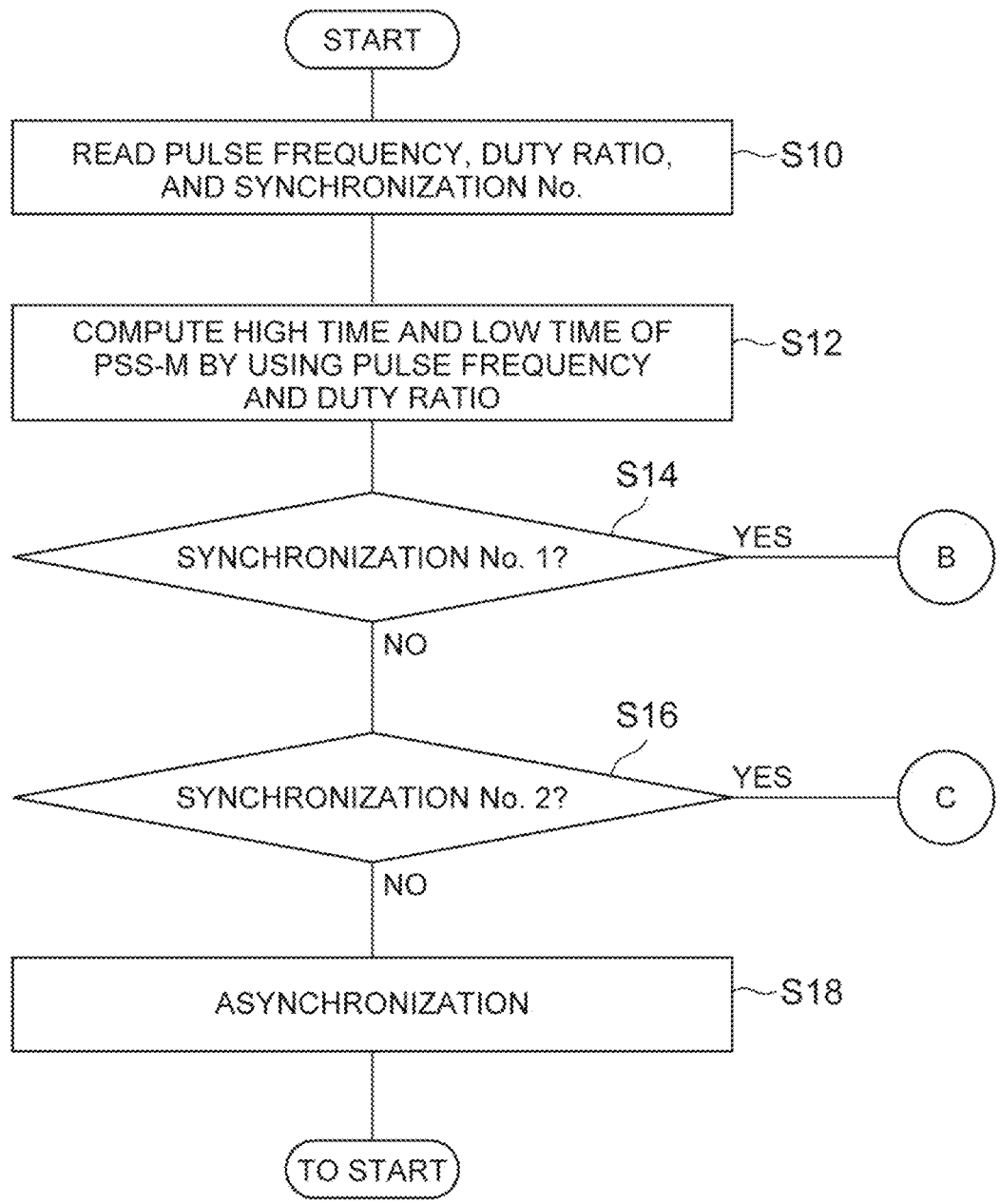
FIG. 16 is a flowchart illustrating an example of a process of generating a synchronization signal for a microwave.

FIG. 16 is a flowchart illustrating a process of generating a synchronization signal for a microwave. The flowchart of FIG. 16 is started at a timing at which, for example, an operator performs an operation of starting the power control process.

As illustrated in FIG. 16, the control unit 162a of the microwave generation unit 16a acquires a pulse frequency, a duty ratio, and a synchronization number from the controller 100 as a reading process (step S10). The control unit 162a outputs the pulse frequency and the duty ratio to the pulse generator 162b.

Next, the control unit 162a calculates a high time at which the synchronization signal PSS-M has a high level and a low time at which the synchronization signal PSS-M has a low level on the basis of the pulse frequency and the duty ratio acquired in the reading process (step S10) as a calculation process (step S12).

Next, the control unit 162a determines whether or not the synchronization number acquired in the reading process (step S10) is No. 1 as a determination process (step S14). The synchronization number No. 1 is a number allocated to the first synchronization example.

In a case where it is determined that the synchronization number is No. 1 (step S14: YES), a process of generating a synchronization signal related to the first synchronization example is started. In the first synchronization example, as illustrated in FIGS. 9A and 9B, the synchronization signal PSS-M synchronized with the synchronization signal PSS-R for radio frequency power is generated. This generation process will be described later with reference to FIG. 17. In a case where it is determined that the synchronization number is not No. 1 (step S14: NO), the control unit 162a determines whether or not the synchronization number acquired in the reading process (step S10) is No. 2 as a determination process (step S16). The synchronization number No. 2 is a number allocated to the second synchronization example.

In a case where it is determined that the synchronization number is No. 2 (step S16: YES), a process of generating a synchronization signal related to the second synchronization example is started. In the second synchronization example, as illustrated in FIGS. 10A and 10B, the synchronization signal PSS-M synchronized with the synchronization signal PSS-R for radio frequency power is generated. This generation process will be described later with reference to FIG. 18. In a case where it is determined that the synchronization number is not No. 2 (step S16: NO), the control unit 162a generates the synchronization signal PSS-M which is not synchronized with the synchronization signal PSS-R for radio frequency power on the basis of the pulse frequency and the duty ratio acquired in the reading process (step S10) as an asynchronization process (step S18).

When the asynchronization process (step S18) is finished, the flowchart of FIG. 16 is finished, and the control unit 162a performs the reading process (step S10) again. As mentioned above, the control unit 162a repeatedly executes the flowchart of FIG. 16 until, for example, an operator performs an operation of finishing the power control process. In the flowchart of FIG. 16, determination of the synchronization numbers No. 1 and No. 2 is performed, but determination processes may be added according to the number of allocated synchronization numbers. For example, in a case where a third synchronization example is allocated to a synchronization number No. 3, a determination process of determining whether or not a synchronization number is No. 3 may be added.

Figure 17:
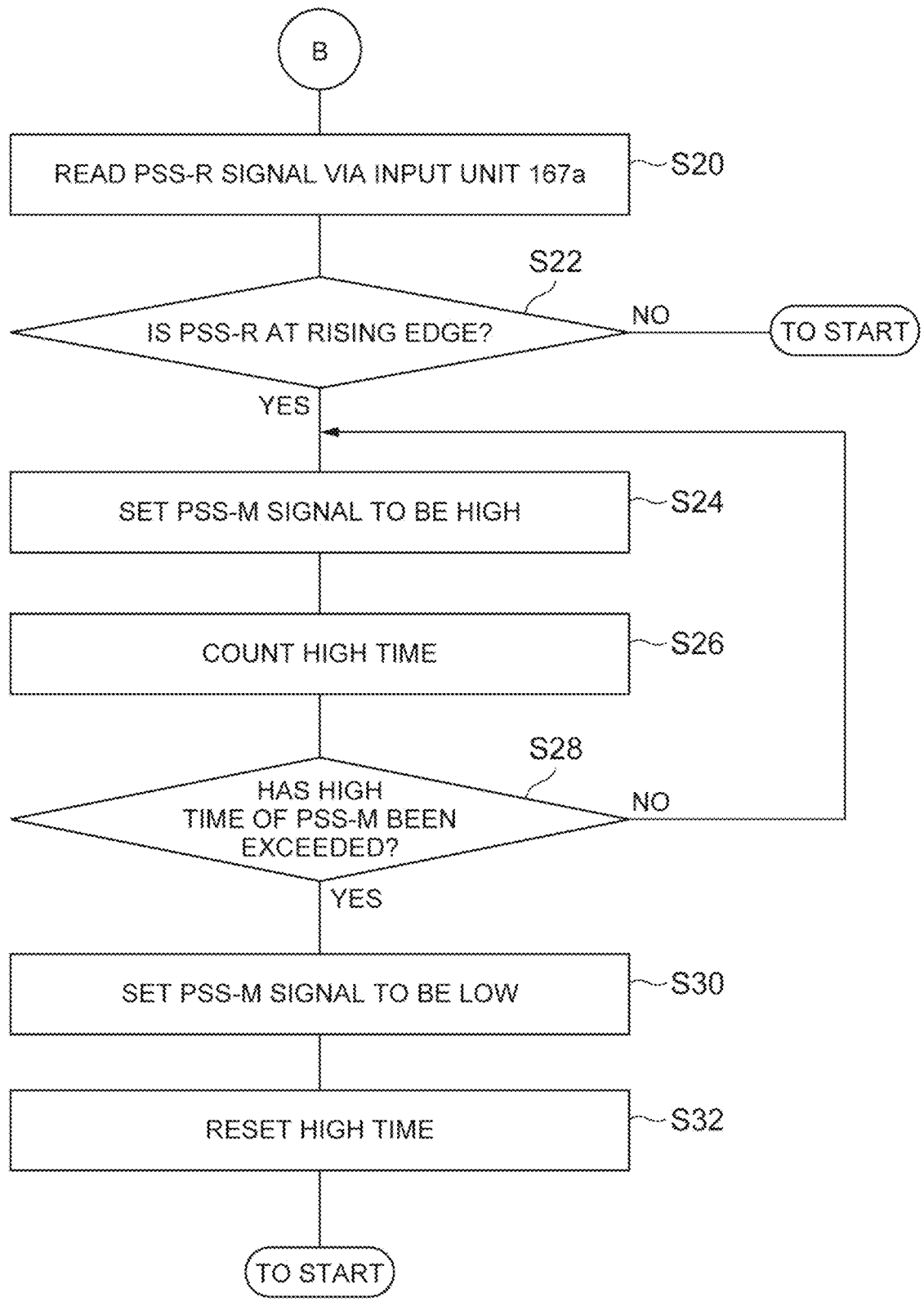
FIG. 17 is a flowchart illustrating an example of a process of generating a synchronization signal related to the first synchronization example.

Process of Generating Synchronization Signal Related to First Synchronization Example In the first synchronization example, as illustrated in FIGS. 9A and 9B, rising of the synchronization signal for radio frequency power is synchronized with rising of the synchronization signal for microwave power. FIG. 17 is a flowchart illustrating an example of a process of generating a synchronization signal related to the first synchronization example. The flowchart of FIG. 17 is started in a case where it is determined that the synchronization number is No. 1 in the determination process (step S14) in FIG. 16 (step S14: YES).

As illustrated in FIG. 17, the control unit 162a of the microwave generation unit 16a acquires the synchronization signal PSS-R for radio frequency power via the pulse input unit 167a as a reading process (step S20).

Next, the control unit 162a determines whether or not the synchronization signal PSS-R for radio frequency power is at a rising edge as a determination process (step S22). In a case where it is determined that the synchronization signal PSS-R for radio frequency power is at the rising edge (step S22: YES), the control unit 162a determines that a synchronization timing comes, and outputs a synchronization trigger to the pulse generator 162b.

The pulse generator 162b sets the synchronization signal PSS-M for microwave power to a high level as a setting process (step S24). The pulse generator 162b counts the high time as a count process (step S26). The pulse generator 162b determines whether or not the high time counted in the count process (step S26) has exceeded the high time of the synchronization signal PSS-M calculated in the calculation process (step S12) in FIG. 16 as an elapse determination process (step S28).

In a case where it is determined that the counted high time does not exceed the high time of the synchronization signal PSS-M (step S28: NO), the pulse generator 162b performs the setting process (step S24) and the count process (step S26) again. In other words, the pulse generator 162b repeatedly performs the setting process (step S24) and the count process (step S26) until it is determined that the counted high time has exceeded the high time of the synchronization signal PSS-M.

In a case where it is determined that the counted high time has exceeded the high time of the synchronization signal PSS-M (step S28: YES), the pulse generator 162b sets the synchronization signal PSS-M to a low level as a setting process (step S30). The pulse generator 162b resets the counted high time as a reset process (step S32).

In a case where the reset process (step S32) is finished, or it is determined that the synchronization signal PSS-R for radio frequency power is not at the rising edge (step S22:

NO), the flowchart of FIG. 17 is finished, and the reading process (step S10) in FIG. 16 is performed again. As mentioned above, rising of the synchronization signal for radio frequency power is synchronized with rising of the synchronization signal for microwave power.

Figure 18:
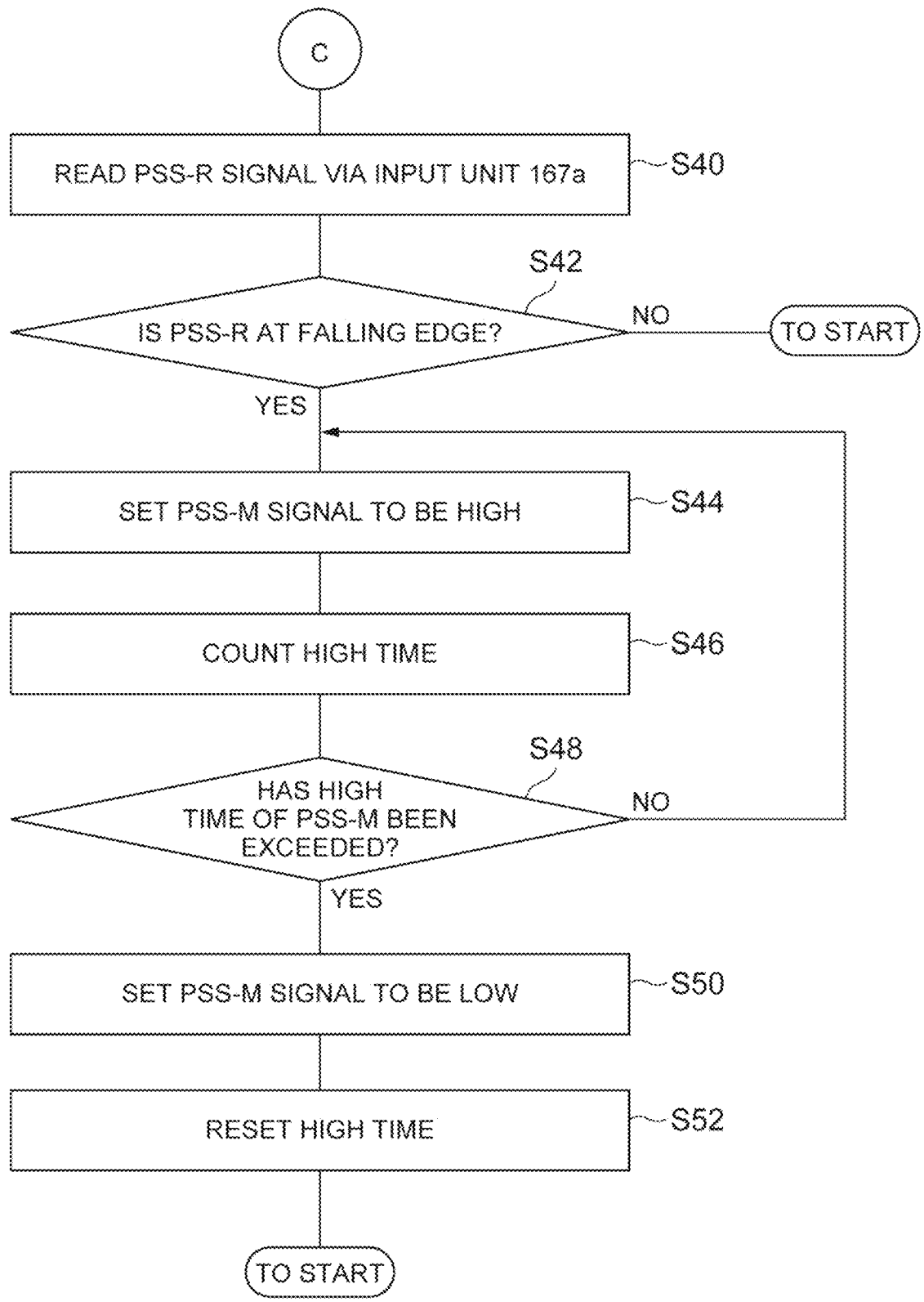
FIG. 18 is a flowchart illustrating an example of a process of generating a synchronization signal related to the second synchronization example.

Process of Generating Synchronization Signal Related to Second Synchronization Example In the second synchronization example, as illustrated in FIGS. 10A and 10B, falling of the synchronization signal for radio frequency power is synchronized with rising of the synchronization signal for microwave power. FIG. 18 is a flowchart illustrating an example of a process of generating a synchronization signal related to the second synchronization example. The flowchart of FIG. 18 is started in a case where it is determined that the synchronization number is No. 2 in the determination process (step S16) in FIG. 16 (step S16: YES).

As illustrated in FIG. 18, the control unit 162a of the microwave generation unit 16a acquires the synchronization signal PSS-R for radio frequency power via the pulse input unit 167a as a reading process (step S40).

Next, the control unit 162a determines whether or not the synchronization signal PSS-R for radio frequency power is at a falling edge as a determination process (step S42). In a case where it is determined that the synchronization signal PSS-R for radio frequency power is at the falling edge (step S42: YES), the control unit 162a determines that a synchronization timing comes, and outputs a synchronization trigger to the pulse generator 162b.

A setting process (step S44), a count process (step S46), an elapse determination process (step S48), a setting process (step S50), and a reset process (step S52) subsequently performed are respectively the same as the setting process (step S24), the count process (step S26), the elapse determination process (step S28), the setting process (step S30), and the reset process (step S32) in FIG. 17.

As mentioned above, falling of the synchronization signal for radio frequency power is synchronized with rising of the synchronization signal for microwave power.

Process of Switching Between Voltage Values for Attenuator

A description will be made of a process of switching between voltage values for the attenuator 163 based on the synchronization signal PSS-M. As described above, the microwave generation unit 16a changes an output voltage from the control unit 162a in a control manner according to the first example (FIG. 11), and changes an output voltage from the control unit 162a by using the solid state relay according to the second example (FIG. 12).

Switching Process Based on Configuration of First Example

Figure 19:
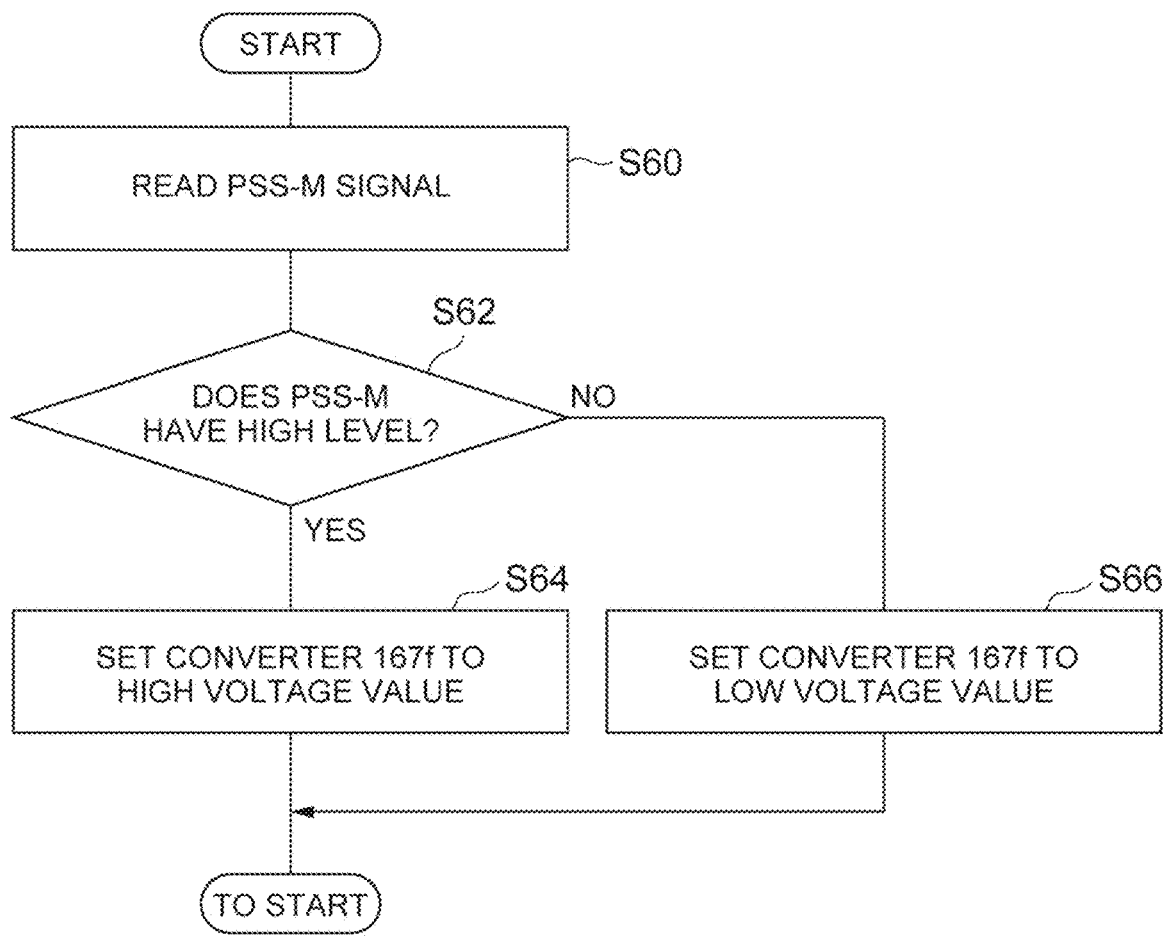
FIG. 19 is a flowchart illustrating an example of a microwave power control process in the microwave output device having the configuration of the first example.

FIG. 19 is a flowchart illustrating an example of a microwave power control process performed by the microwave output device having the configuration of the first example. The flowchart of FIG. 19 is started at a timing at which, for example, an operator performs an operation of starting the power control process.

As illustrated in FIG. 19, the control unit 162a of the microwave generation unit 16a acquires the synchronization signal PSS-M for a microwave from the pulse generator 162b as a reading process (step S60).

Next, the control unit 162a determines the synchronization signal PSS-M for a microwave acquired in the reading process (step S60) has a high level as a determination process (step S62).

In a case where it is determined that the synchronization signal PSS-M for a microwave has the high level (step S62: YES), the control unit 162a sets the D/A converter 167f (FIG. 11) to a voltage value corresponding to the high level as a setting process (step S64). Consequently, power of a microwave is set to the high level by the attenuator 163.

In a case where it is determined that the synchronization signal PSS-M for a microwave has a low level (step S62: NO), the control unit 162a sets the D/A converter 167f (FIG. 11) to a voltage value corresponding to the low level as a setting process (step S66). Consequently, power of a microwave is set to the low level by the attenuator 163.

When the setting process (step S64) and the setting process (step S66) are finished, the flowchart of FIG. 19 is finished, and the control unit 162a performs the reading process (step S60) again. As mentioned above, the control unit 162a repeatedly executes the flowchart of FIG. 19 so as to pulse-modulate power of a microwave until, for example, an operator performs an operation of finishing the power control process.

Switching Process Based on Configuration of Second Example

Figure 20:
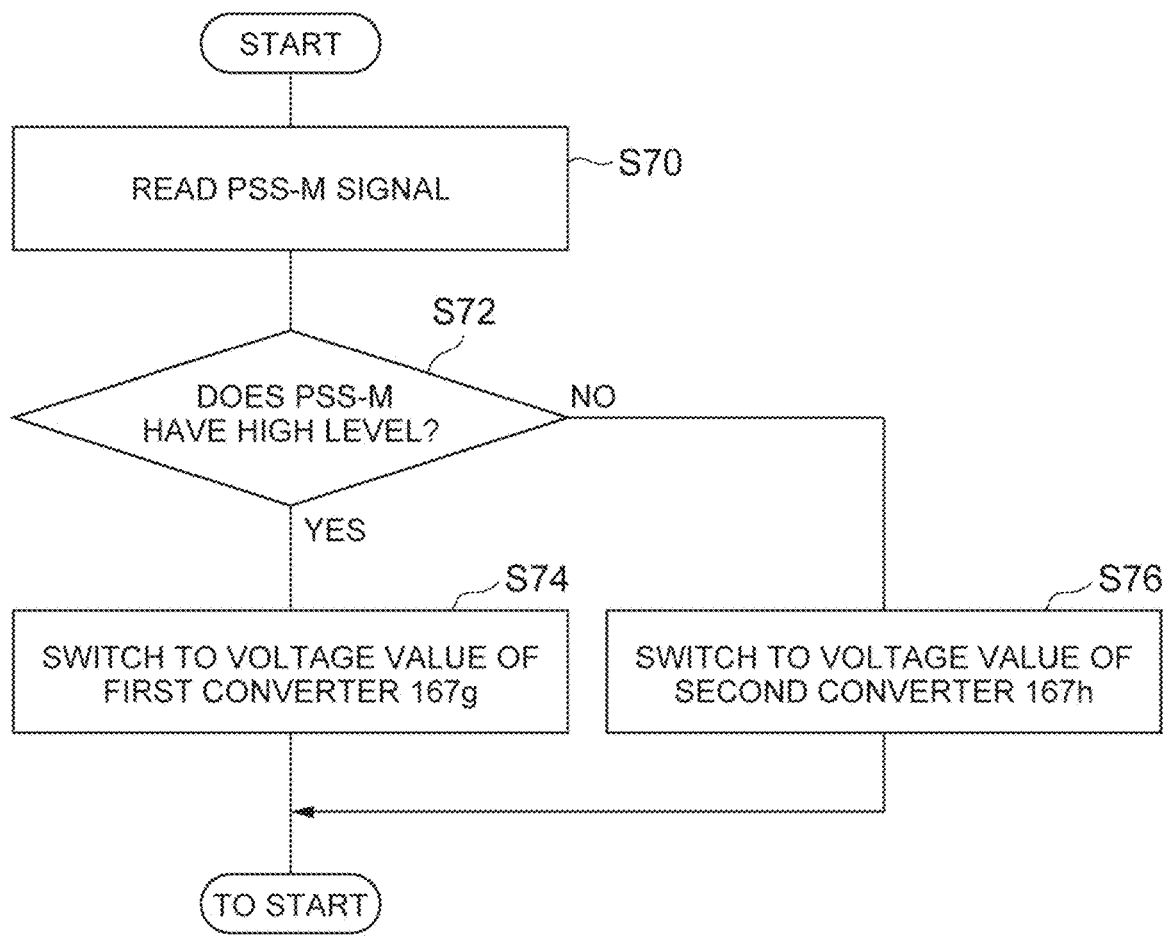
FIG. 20 is a flowchart illustrating an example of a microwave power control process in the microwave output device having the configuration of the second example.

FIG. 20 is a flowchart illustrating an example of a microwave power control process performed by the microwave output device having the configuration of the second example. The flowchart of FIG. 20 is started at a timing at which, for example, an operator performs an operation of starting the power control process.

As illustrated in FIG. 20, the solid state relay K1 of the microwave generation unit 16a acquires the synchronization signal PSS-M for a microwave from the pulse generator 162b as a reading process (step S70).

Next, the solid state relay K1 determines the synchronization signal PSS-M for a microwave acquired in the reading process (step S70) has a high level as a determination process (step S72).

In a case where it is determined that the synchronization signal PSS-M for a microwave has the high level (step S72: YES), the solid state relay K1 switches to a voltage value of the D/A converter 167g (FIG. 12) as a setting process (step S74). Consequently, power of a microwave is set to the high level by the attenuator 163.

In a case where it is determined that the synchronization signal PSS-M for a microwave has a low level (step S72: NO), the solid state relay K1 switches to a voltage value of the D/A converter 167h (FIG. 12) as a setting process (step S76). Consequently, power of a microwave is set to the low level by the attenuator 163.

When the setting process (step S74) and the setting process (step S76) are finished, the flowchart of FIG. 20 is finished, and the control unit 162a performs the reading process (step S60) again. As mentioned above, the control unit 162a repeatedly executes the flowchart of FIG. 20 so as to pulse-modulate power of a microwave until, for example, an operator performs an operation of finishing the power control process.

The switching process may be realized according to one of the configurations of the first example and the second example.

Measured Value Storing Process

Figure 21:
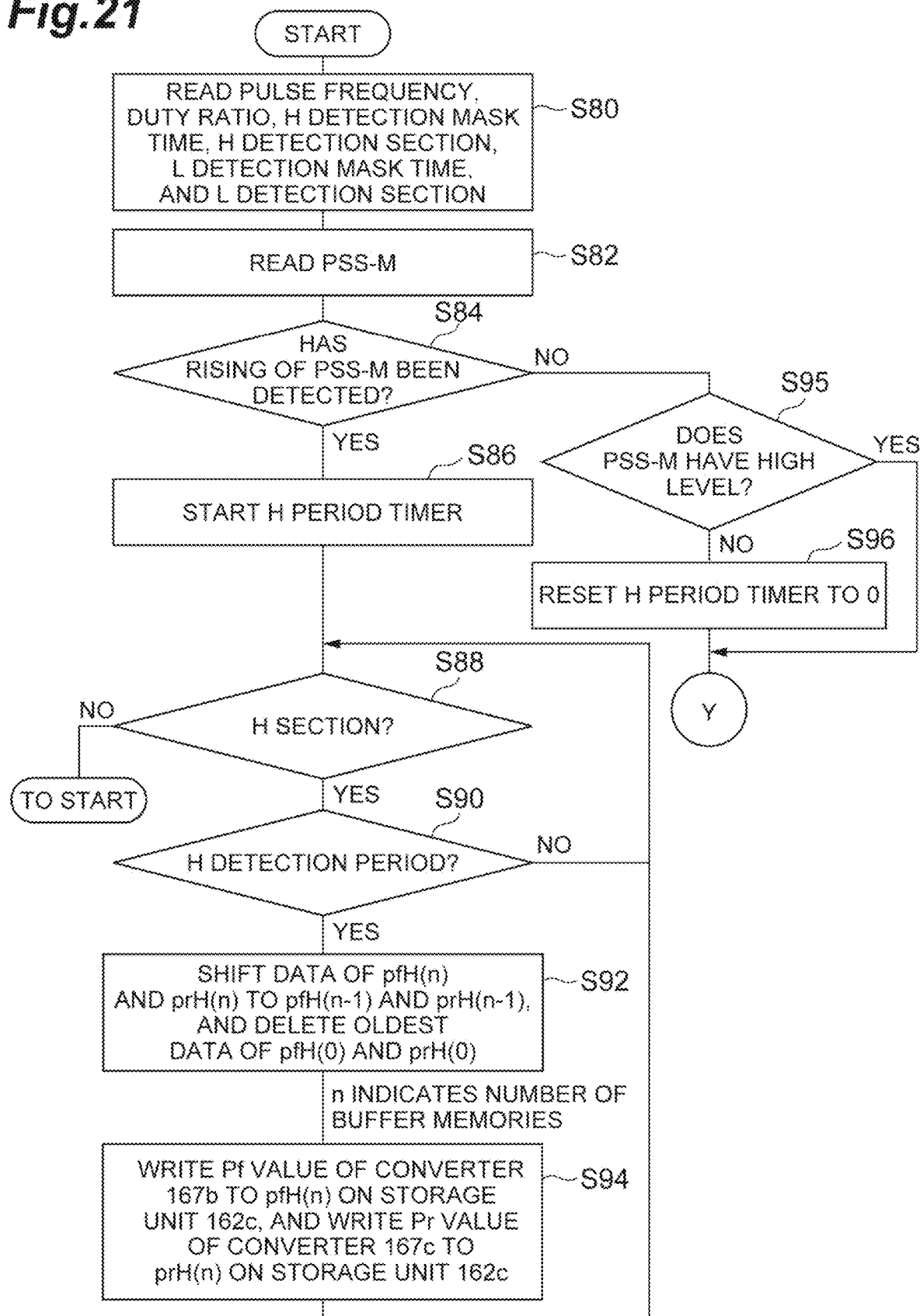
FIG. 21 is a flowchart illustrating an example of a process of storing a power measured value.
Figure 22:
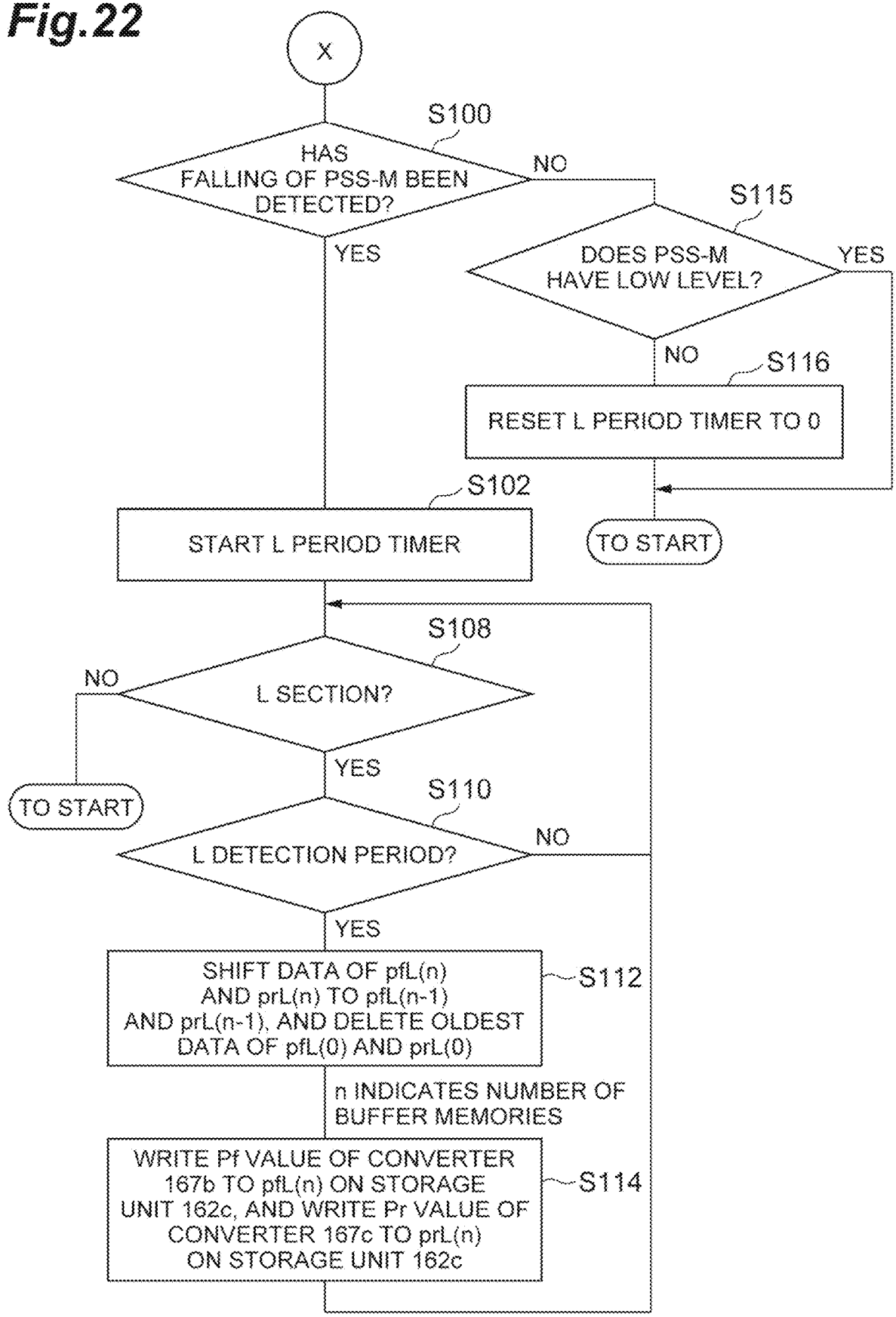
FIG. 22 is a flowchart illustrating an example of a process of storing a power measured value.

Next, a description will be made of a process of writing the travelling wave power Pf and the reflected wave power Pr to the storage unit 162c. FIGS. 21 and 22 are flowcharts illustrating an example of a process of storing a power measured value. The flowchart of FIGS. 21 and 22 are started at a timing at which, for example, an operator performs an operation of starting the power control process.

As illustrated in FIG. 21, as a reading process (step S80), the control unit 162a of the microwave generation unit 16a acquires a pulse frequency and a duty ratio from the controller 100, and acquires the H detection mask time, the H detection section, the L detection mask time, and the L detection section by referring to the storage unit 162c.

Next, as a reading process (step S82), the control unit 162a acquires the synchronization signal PSS-M for a microwave from the pulse generator 162b.

Next, as a determination process (step S84), the control unit 162a determines whether or not rising of the synchronization signal PSS-M acquired in the reading process (step S82) has been detected.

In a case where it is determined that rising of the synchronization signal PSS-M has been detected (step S84: YES), the control unit 162a starts an H period timer as a timer process (step S86). The H period timer is a tinier which counts time elapse from the rising of the synchronization signal PSS-M.

The control unit 162a determines whether or not a section is a high level section as a determination process (step S88). The control unit 162a determines whether or not a section is a high level section by using the H period timer counted in the timer process (step S86) and the pulse frequency and the duty ratio acquired in the reading process (step S80).

In a case where it is determined that a section is a high level section (step S88: YES), the control unit 162a determines whether or not a period is an H detection period as a determination process (step S90). The control unit 162a determines whether or not a period is an H detection period by using the H period timer counted in the timer process (step S86).

In a case where it is determined that a period is an H detection period (step S90: YES), the control unit 162a deletes the oldest data of data stored in the storage unit 162c as an arrangement process (step S92). When the number of buffer memories is indicated by n, the control unit 162a deletes a measured value pfH(0) of travelling wave power and a measured value prH(0) of reflected wave power. The control unit 162a shifts storage positions on data of a measured value pfH(n) of travelling wave power and a measured value prH(n) of reflected wave power to storage positions of a measured value pfH(n−1) and a measured value prH(n−1).

Next, the control unit 162a stores the measured values in the storage unit 162c as a writing process (step S94). The control unit 162a stores the measured value Pf of travelling wave power detected by the A/D converter 167b (FIGS. 11 and 12) in pfH(n) of the storage unit 162c. The control unit 162a stores the measured value Pr of reflected wave power detected by the A/D converter 167c (FIGS. 11 and 12) in prH(n) of the storage unit 162c.

In a case where it is determined that a period is not an H detection period (step S90: NO), or the writing process (step S94) is finished, the control unit 162a performs the determination process (step S88) again. As mentioned above, the arrangement process (step S92) and the writing process (step S94) are performed only in the high level section and the H detection section. Consequently, the measured value pfH(n) of high level power of a travelling wave and the measured value prH(n) of high level power of a reflected wave are stored in the storage unit 162c in a time series.

In a case where it is determined that a section is not a high level section (step S88: NO), the control unit 162a performs the reading process (step S80) again. In a case where it is determined that a section is not a high level section after rising of the synchronization signal PSS-M is detected, this indicates that a single pulse ends. Thus, a new process is performed from the reading process (step S80).

In a case where it is determined that rising of the synchronization signal PSS-M is not detected (step S84: NO), the control unit 162a determines whether or not the synchronization signal PSS-M has a high level as a determination process (step S95). In a case where it is determined that the synchronization signal PSS-M does not have a high level (step S95: NO), the control unit 162a resets the H period timer to 0 as a reset process (step S96). In a case where it is determined that the synchronization signal PSS-M has a high level (step S95: YES), the control unit 162a skips the reset process (step S96).

Next, as illustrated in FIG. 22, the control unit 162a determines whether or not falling of the synchronization signal PSS-M acquired in the reading process (step S82) has been detected as a determination process (step S100).

In a case where it is determined that falling of the synchronization signal PSS-M has been detected (step S100: YES), the control unit 162a starts an L period timer as a timer process (step S102). The L period timer is a timer which counts time elapse from the falling of the synchronization signal PSS-M.

The control unit 162a determines whether or not a section is a low level section as a determination process (step S108). The control unit 162a determines whether or not a section is a low level section by using the L period timer counted in the timer process (step S102) and the pulse frequency and the duty ratio acquired in the reading process (step S80).

In a case where it is determined that a section is a low level section (step S108: YES), the control unit 162a determines whether or not a period is an L detection period as a determination process (step S110). The control unit 162a determines whether or not a period is an L detection period by using the L period timer counted in the timer process (step S102).

In a case where it is determined that a period is an L detection period (step S110: YES), the control unit 162a deletes the oldest data of data stored in the storage unit 162c as an arrangement process (step S112). When the number of buffer memories is indicated by n, the control unit 162a deletes a measured value pfL(0) of travelling wave power and a measured value prL(0) of reflected wave power. The control unit 162a shifts storage positions on data of a measured value pfL(n) of travelling wave power and a measured value prL(n) of reflected wave power to storage positions of a measured value pfL(n−1) and a measured value prL(n−1).

Next, the control unit 162a stores the measured values in the storage unit 162c as a writing process (step S114). The control unit 162a stores the measured value Pf of travelling wave power detected by the A/D converter 167b (FIGS. 11 and 12) in pfL(n) of the storage unit 162c. The control unit 162a stores the measured value Pr of reflected wave power detected by the A/D converter 167c (FIGS. 11 and 12) in prL(n) of the storage unit 162c.

In a case where it is determined that a period is not an L detection period (step S110: NO), or the writing process (step S114) is finished, the control unit 162a performs the determination process (step S108) again. As mentioned above, the arrangement process (step S112) and the writing process (step S114) are performed only in the low level section and the L detection section. Consequently, the measured value pfL(n) of low level power of a travelling wave and the measured value prL(n) of low level power of a reflected wave are stored in the storage unit 162c in a time series.

In a case where it is determined that a section is not a low level section (step S108: NO), the control unit 162a performs the reading process (step S80) again. In a case where it is determined that a section is not a low level section after falling of the synchronization signal PSS-M is detected, this indicates that a new high level pulse starts. Thus, the control unit 162a performs a new process from the reading process (step S80).

In a case where it is determined that falling of the synchronization signal PSS-M is not detected (step S100: NO), the control unit 162a determines whether or not the synchronization signal PSS-M has a low level as a determination process (step S115). In a case where it is determined that the synchronization signal PSS-M does not have a low level (step S115: NO), the control unit 162a resets the L period timer to 0 as a reset process (step S116). In a case where it is determined that the synchronization signal PSS-M has a low level (step S115: YES), the control unit 162a skips the reset process (step S116). The control unit 162a performs the reading process (step S80) again. As mentioned above, the control unit 162a repeatedly executes the flowcharts of FIGS. 21 and 22 until, for example, an operator performs an operation of finishing the power control process.

Time-Series Buffer Data

FIG. 23 illustrates an example of time-series buffer data. The time-series buffer DA2 illustrated in FIG. 23 may be obtained by executing the flowcharts of FIGS. 21 and 22. As illustrated in FIG. 23, the high level measured value pfH of travelling wave power, the low level measured value pfL of travelling wave power, the high level measured value prH of reflected wave power, and the low level measured value prL of reflected wave power are stored in a time series in a period corresponding to several samples before the current time.

Measured Value Averaging Process

Figure 24:
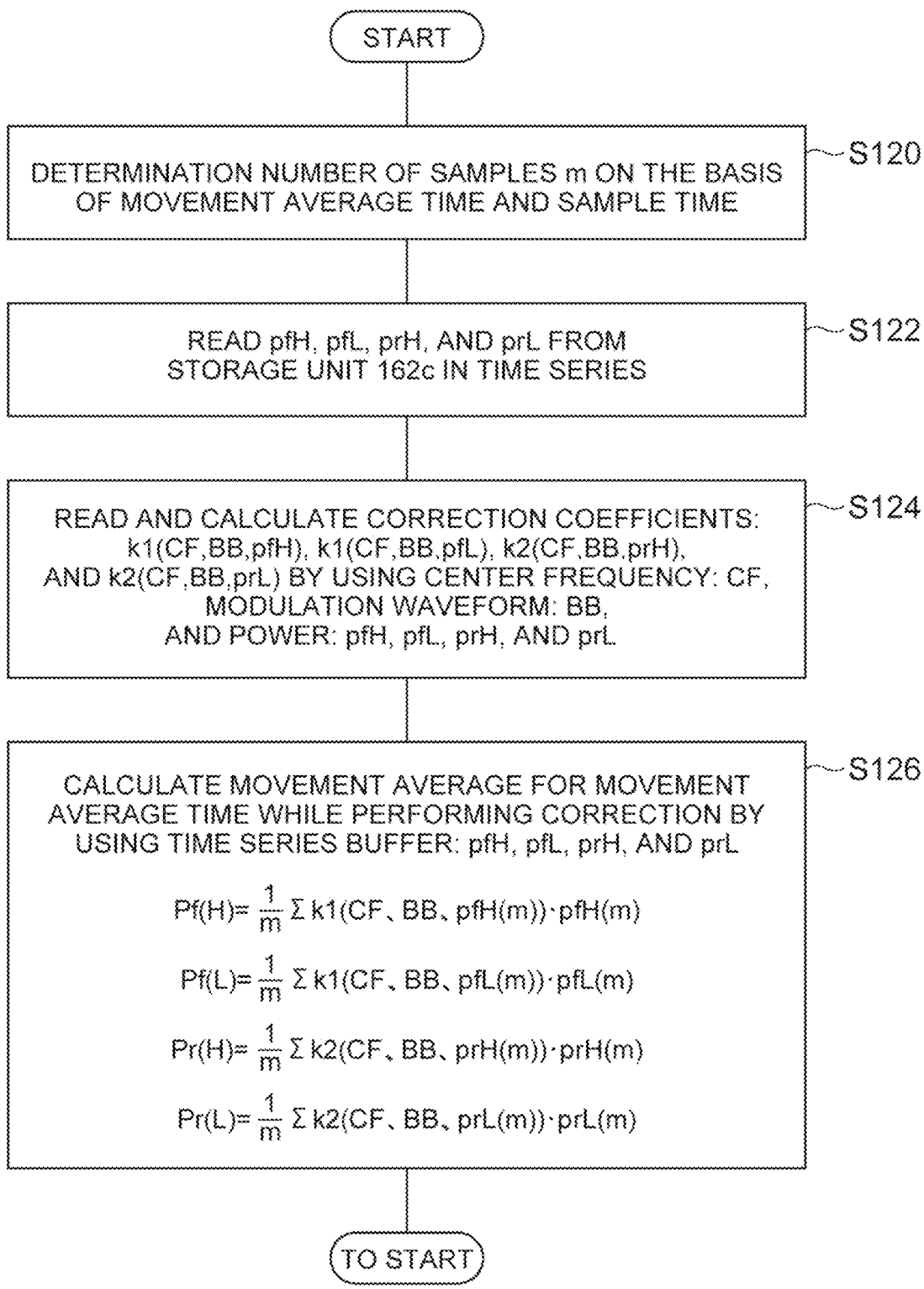
FIG. 24 is a flowchart illustrating an example of a process of averaging power of a reflected wave and a travelling wave.

Next, a description will be made of a measured value averaging process using the time-series buffer DA2. FIG. 24 is a flowchart illustrating an example of a process of averaging reflected wave power and travelling wave power. The flowchart of FIG. 24 is started at a timing at which, for example, an operator performs an operation of starting the power control process.

As illustrated in FIG. 24, the control unit 162a of the microwave generation unit 16a determines the number of samples m as a determination process (step S120). The control unit 162a determines the number of samples m on the basis of a movement average time (FIGS. 15A and 15B) obtained by connecting a plurality of H detection sections to each other and a predetermined sample time (sampling interval).

Next, as a reading process (step S122), the control unit 162a refers to the storage unit 162c, and acquires the measured values pfH, pfL, prH, and prL in a time series.

Next, the control unit 162a calculates a correction coefficient as a calculation process (step S124). The correction coefficient is stored in a storage unit (for example, a storage unit of the microwave generation unit 16a) in correlation with a center frequency, a modulation waveform (setting bandwidth), and power. The control unit 162a selects correction coefficients respectively correlated with a center frequency and a modulation waveform designated by the controller 100, and the measured values pfH, pfL, prH, and prL acquired in the reading process (step S122) from among a plurality of correction coefficients prepared in advance. When the center frequency is indicated by CF, and the modulation waveform is indicated by BB, the control unit 162a acquires a high level correction coefficient k1(CF,BB, pfH) of travelling wave power from the storage unit. Similarly, the control unit 162a acquires a low level correction coefficient k1(CF,BB,pfL) of travelling wave power, a high level correction coefficient k2(CF,BB,prH) of reflected wave power, and a low level correction coefficient k2(CF,BB,prL) of reflected wave power.

Next, as an averaging process (step S126), the control unit 162a calculates movement averages for movement average times while performing correction, by using the measured values pfH, pfL, prH, and prL acquired in the reading process (step S122) and the correction coefficients calculated in the calculation process (step S124). Consequently, the averaged measured values Pf(H), Pf(L), Pr(H), and Pr(L) are calculated. Specifically, the averaged measured values are calculated according to the following equations (where n>=m).

$$Pf(H) = \frac{1}{m}\sum k1(CF, BB, pfH(m)) \cdot pfH(m)$$

$$Pf(L) = \frac{1}{m}\sum k1(CF, BB, pfL(m)) \cdot pfL(m)$$

$$Pr(H) = \frac{1}{m}\sum k2(CF, BB, prH(m)) \cdot prH(m)$$

$$Pr(L) = \frac{1}{m}\sum k2(CF, BB, prL(m)) \cdot prL(m)$$

When the averaging process (step S126) is finished, the flowchart of FIG. 24 is finished, and the control unit 162a performs the determination process (step S120) again. As mentioned above, the control unit 162a repeatedly executes the flowchart of FIG. 24 until, for example, an operator performs an operation of finishing the power control process.

Process of Setting Control Voltage for Attenuator

Next, a description will be made of a process of pulse-modulating microwave power by using the averaged measured values. As described above, the microwave generation unit 16a changes an output voltage from the control unit 162a in a control manner according to the first example (FIG. 11), and changes an output voltage from the control unit 162a by using the solid state relay according to the second example (FIG. 12).

Setting Process Based on Configuration of First Example

Figure 25:
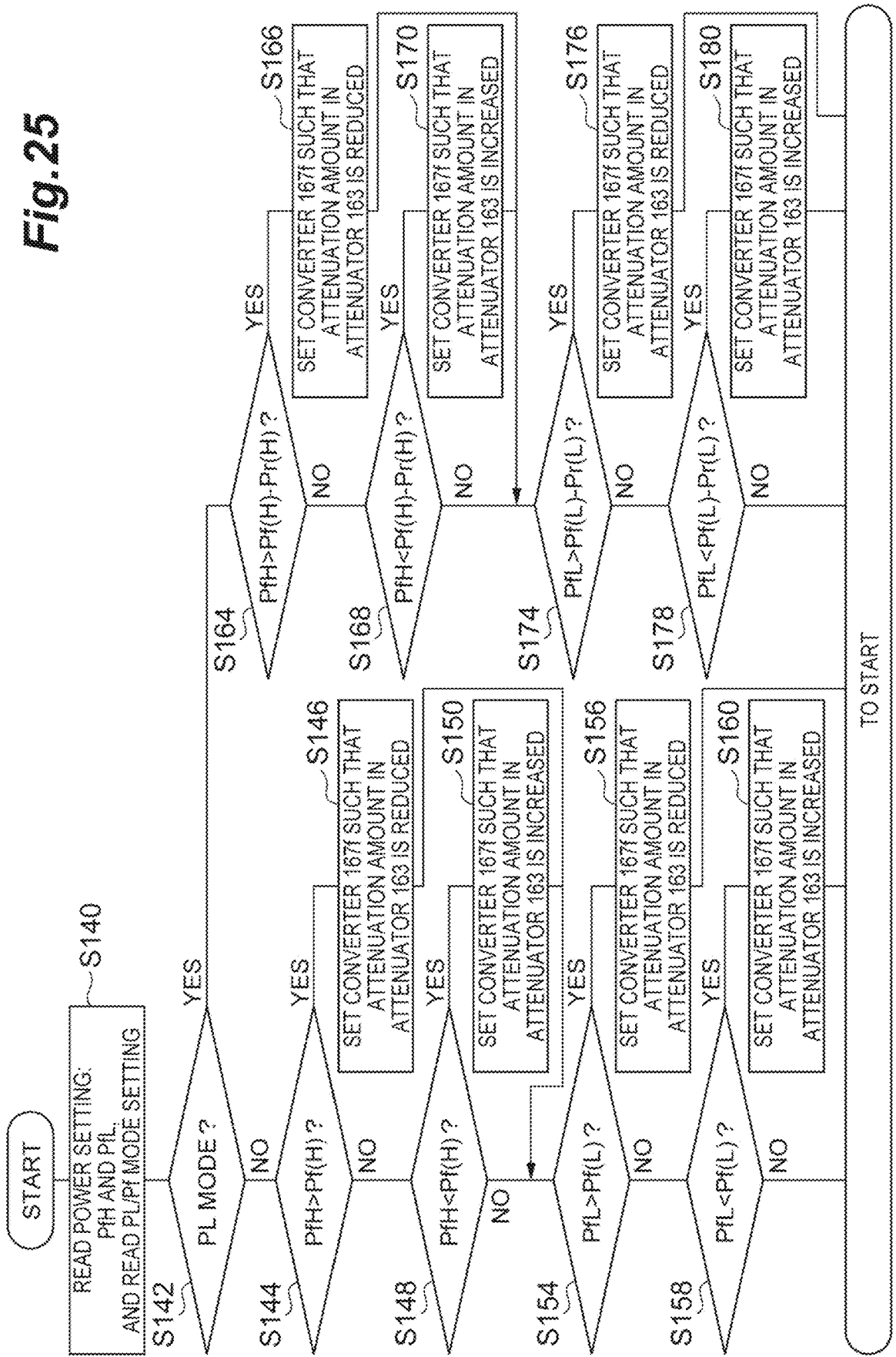
FIG. 25 is a flowchart illustrating an example of a process of controlling an attenuator in the microwave output device having the configuration of the first example.

FIG. 25 is a flowchart illustrating an example of an attenuator control process performed by the microwave output device having the configuration of the first example. The flowchart of FIG. 25 is started at a timing at which, for example, an operator performs an operation of starting the power control process.

As illustrated in FIG. 25, the control unit 162a of the microwave generation unit 16a acquires the high level setting power NH, the low level setting power PfL, and a control mode (the PL mode or Pf mode) from the controller 100 as a reading process (step S140).

Next, as a determination process (step S142), the control unit 162a determines whether or not the control mode acquired in the reading process (step S140) is the PL mode.

In a case where it is determined that the control mode is not the PL mode (step S142: NO), the control unit 162a determines whether or not the averaged measured value Pf(H) is less than the setting power PfH as a determination process (step S144).

In a case where it is determined that the averaged measured value Pf(H) is less than the setting power PfH (step S144: YES), as a setting process (step S146), the control unit 162a sets an applied voltage value for the D/A converter 167f (FIG. 11) such that an attenuation amount in the attenuator 163 (an attenuation amount applied to a microwave by the attenuator 163) is reduced.

In a case where it is determined that the averaged measured value Pf(H) is not less than the setting power PM (step S144: NO), as a determination process (step S148), the control unit 162a determines whether or not the averaged measured value Pf(H) is more than the setting power PM.

In a case where it is determined that the averaged measured value Pf(H) is more than the setting power PM (step S148: YES), as a setting process (step S150), the control unit 162a sets an applied voltage value for the D/A converter 167f (FIG. 11) such that an attenuation amount in the attenuator 163 is increased.

In a case where it is determined that the averaged measured value Pf(H) is not more than the setting power PM (step S148: NO), or the setting process (step S146) or the setting process (step S150) is finished, as a determination process (step S154), the control unit 162a determines whether or not the averaged measured value Pf(L) is less than the setting power PfL.

In a case where it is determined that the averaged measured value Pf(L) is less than the setting power PfL (step S154: YES), as a setting process (step S156), the control unit 162a sets an applied voltage value for the D/A converter 167f (FIG. 11) such that an attenuation amount in the attenuator 163 is reduced.

In a case where it is determined that the averaged measured value Pf(L) is not less than the setting power PfL (step S154: NO), as a determination process (step S158), the control unit 162a determines whether or not the averaged measured value Pf(L) is more than the setting power PfL.

In a case where it is determined that the averaged measured value Pf(L) is more than the setting power PfL (step S158: YES), as a setting process (step S160), the control unit 162a sets an applied voltage value for the D/A converter 167f (FIG. 11) such that an attenuation amount in the attenuator 163 is increased.

In a case where it is determined that the averaged measured value Pf(L) is not more than the setting power PfL (step S158: NO), or the setting process (step S156) or the setting process (step S160) is finished, the flowchart of FIG. 25 is finished, and the control unit 162a performs the reading process (step S140) again. As mentioned above, the control unit 162a repeatedly executes the flowchart of FIG. 25 until, for example, an operator performs an operation of finishing the power control process.

On the other hand, in a case where it is determined that the control mode is the PL mode (step S142: YES), as a determination process (step S164), the control unit 162a determines whether or not a first difference value obtained by subtracting the averaged measured value Pr(H) from the averaged measured value Pf(H) is less than the setting power PtH.

In a case where it is determined that the first difference value is less than the setting power PfH (step S164: YES), as a setting process (step S166), the control unit 162a sets an applied voltage value for the D/A converter 167f (FIG. 11) such that an attenuation amount in the attenuator 163 is reduced.

In a case where it is determined that the first difference value is not less than the setting power PM (step S164: NO), as a determination process (step S168), the control unit 162a determines whether or not the first difference value is more than the setting power NE.

In a case where it is determined that the first difference value is more than the setting power PfH (step S168: YES), as a setting process (step S170), the control unit 162a sets an applied voltage value for the D/A converter 167f (FIG. 11) such that an attenuation amount in the attenuator 163 is increased.

In a case where it is determined that the first difference value is not more than the setting power pfH (step S168: NO), or the setting process (step S166) or the setting process (step S170) is finished, as a determination process (step S174), the control unit 162a determines whether or not a second difference value obtained by subtracting the averaged measured value Pr(L) from the averaged measured value Pf(L) is less than the setting power PfL.

In a case where it is determined that the second difference value is less than the setting power PfL, (step S174: YES), as a setting process (step S176), the control unit 162a sets an applied voltage value for the D/A converter 167f (FIG. 11) such that an attenuation amount in the attenuator 163 is reduced.

In a case where it is determined that the second difference value is not less than the setting power PfL (step S174: NO), as a determination process (step S178), the control unit 162a determines whether or not the second difference value is more than the setting power PfL.

In a case where it is determined that the second difference value is more than the setting power PfL (step S178: YES), as a setting process (step S180), the control unit 162a sets an applied voltage value for the D/A converter 167f (FIG. 11) such that an attenuation amount in the attenuator 163 is increased.

In a case where it is determined that the second difference value is not more than the setting power PfL (step S178: NO), or the setting process (step S176) or the setting process (step S180) is finished, the flowchart of FIG. 25 is finished, and the control unit 162a performs the reading process (step S140) again. As mentioned above, the control unit 162a repeatedly executes the flowchart of FIG. 25 until, for example, an operator performs an operation of finishing the power control process.

The flowchart of FIG. 25 is executed, and thus the magnitude of pulse-modulated microwave power is controlled.

Setting Process Based on Configuration of Second Example

Figure 26:
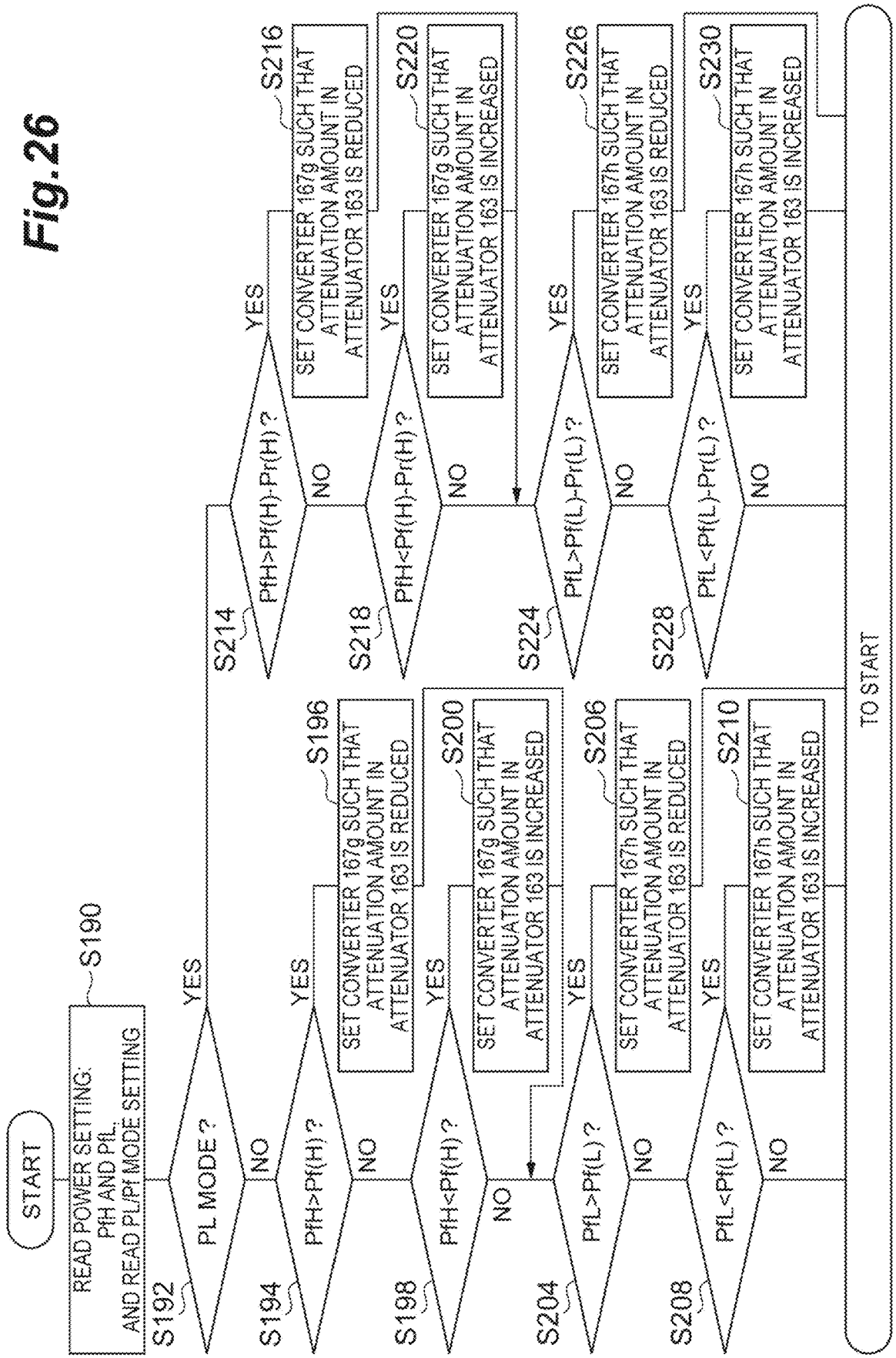
FIG. 26 is a flowchart illustrating an example of a process of controlling an attenuator in the microwave output device having the configuration of the first example.

FIG. 26 is a flowchart illustrating an example of an attenuator control process performed by the microwave output device having the configuration of the second example. The flowchart of FIG. 26 is started at a timing at which, for example, an operator performs an operation of starting the power control process.

The flowchart of FIG. 26 is the same as the flowchart of FIG. 25 except for a setting target converter.

Setting processes (step S196, step S200, step S216, and step S220) in FIG. 26 are the same as the setting processes (step S146, step S150, step S166, and step S170) in FIG. 25 except that a setting target is the D/A converter 167g (FIG. 12) instead of the D/A converter 167f.

Setting processes (step S206, step S210, step S226, and step S230) in FIG. 26 are the same as the setting processes (step S146, step S150, step S176, and step S180) in FIG. 25 except that a setting target is the D/A converter 167h (FIG. 12) instead of the D/A converter 167f.

The flowchart of FIG. 26 is executed, and thus the magnitude of pulse-modulated microwave power is controlled.

Summary of Power Feedback

In the microwave output device 16, power of a microwave having a bandwidth is pulse-modulated. In the Pr mode, pulse-modulated high level power of a microwave is controlled on the basis of the high level averaged measured value pf(H) (averaged first high measured value) of travelling wave power and the high level setting power PfH. Pulse-modulated low level power of a microwave is controlled on the basis of the low level averaged measured value pf(L) (averaged first low measured value) of travelling wave power and the low level setting power PfL. As mentioned above, since the microwave power is pulse-modulated, and the high level power and the low level power are controlled on the basis of setting power, pulse-modulated power of a microwave having a bandwidth can be controlled.

In the PL mode, pulse-modulated high level power of a microwave is controlled on the basis of the high level averaged measured value pf(H) of travelling wave power, the high level averaged measured value pr(H) of reflected wave power, and the high level setting power PM. Pulse-modulated low level power of a microwave is controlled on the basis of the low level averaged measured value pf(L) (averaged first low measured value) of travelling wave power, the low level averaged measured value pr(L) (averaged second low measured value) of reflected wave power, and the low level setting power PfL. As mentioned above, since the microwave power is pulse-modulated, and the high level power and the low level power are controlled on the basis of setting power, pulse-modulated power of a microwave having a bandwidth can be controlled.

Even in a case where microwave power is pulse-modulated, the microwave output device 16 can acquire a movement average time by connecting only H detection sections or L detection sections to each other. Thus, the microwave output device 16 can appropriately average pulsed power.

The microwave output device 16 can switch between the Pr mode and the PL mode. In other words, the microwave output device 16 can switch between execution and non-execution of load control depending on process conditions.

The microwave output device 16 can measure travelling wave power and reflected wave power by appropriately setting the H detection mask time, the L detection mask time, the H detection section, and the L detection section so as to avoid a period in which microwave power greatly changes. Therefore, it is possible to reduce a power measurement error. As a result, it is possible to improve the accuracy of power control.

The microwave output device 16 can switch between a high level voltage and a low level voltage for the attenuator 163 at a high speed with the solid state relay K1. Thus, it is possible to realize a waveform with a shorter pulse cycle or a waveform with a low duty ratio.

The microwave output device 16 performs pulse modulation of microwave power in synchronization with pulse modulation of radio frequency power, and can thus reduce the influence of a radio frequency pulse exerted on a reflected wave of the microwave.

Details of Tuner

Figure 27:
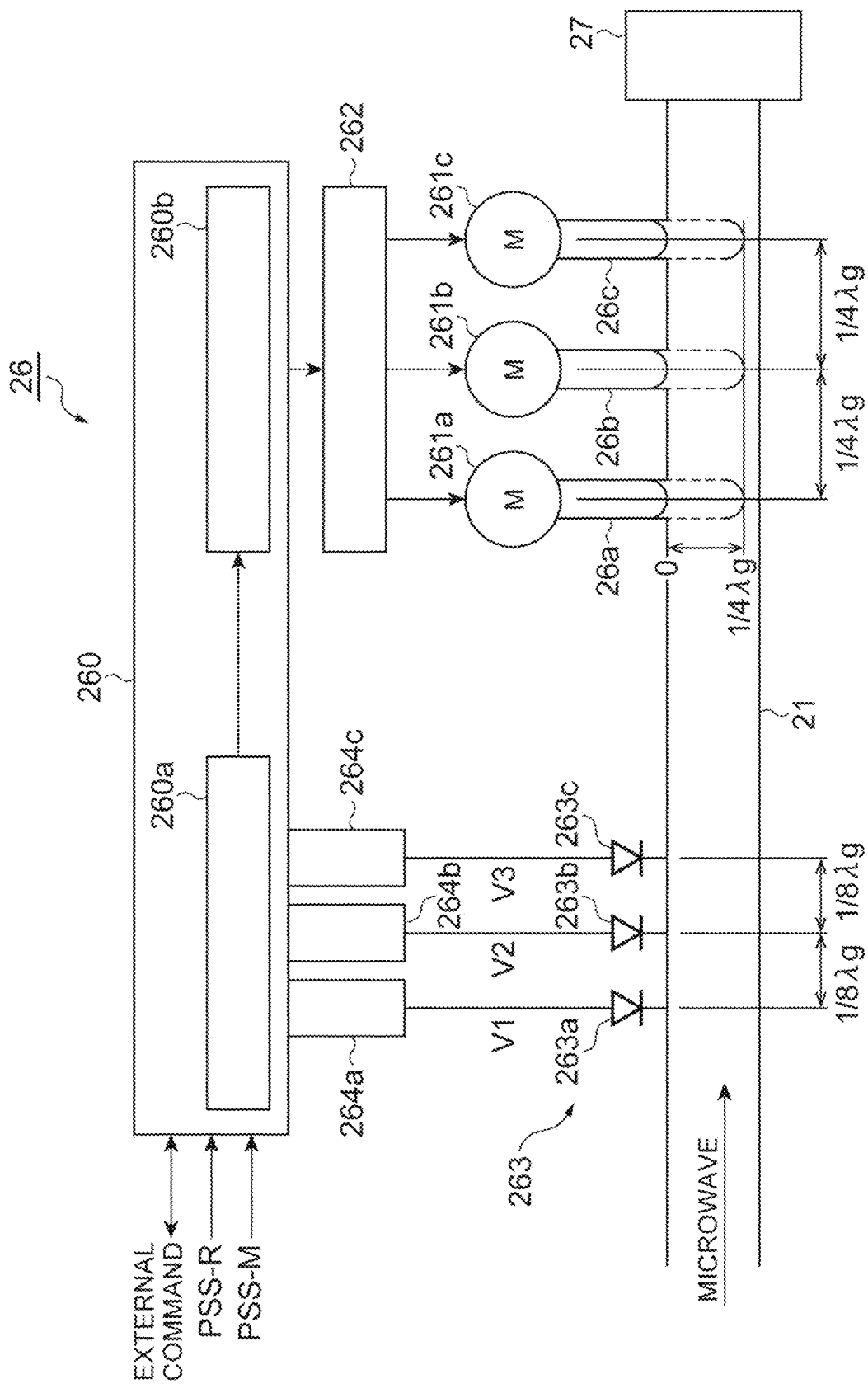
FIG. 27 is a diagram illustrating an example of a detailed configuration of a tuner.

FIG. 27 illustrates an example of a detailed configuration of the tuner. As illustrated in FIG. 27, the tuner 26 is formed of a 3E tuner. The 3E tuner has three branch wave guide tubes. When a wavelength in the tube is indicated by λg, the three branch wave guide tubes are provided in the wave guide tube 21 at the interval of λg/4 in a traveling direction of a microwave. The stubs 26a, 26b, and 26c are disposed in the branch wave guide tubes. The stubs 26a, 26b, and 26c can adjust a protrusion amount of the wave guide tube 21 with respect to the internal space in the range of 0 to λg/4. The stubs 26a, 26b, and 26c are respectively connected to corresponding motors 261a, 261b, and 261c. Protrusion amounts of the stubs 26a, 26b, and 26c are adjusted on the basis of control signals from a drive circuit 262 driving the motors 261a, 261b, and 261c. When positions of the stubs 26a, 26b, and 26c are changed in the branch wave guide tubes, characteristic impedance of the wave guide tube 21 changes. By using such a principle, impedance on a load obtained by adding the impedance of the tuner 26 to the load can be matched with impedance of the microwave output device 16.

The tuner 26 includes a tuner wave detection unit 263 and the tuner control unit 260. The tuner wave detection unit 263 is attached to the wave guide tube 21 located further toward the microwave output device 16 side than the stubs 26a, 26b, and 26c. The tuner wave detection unit 263 is a three-probe wave detector as an example, and has probes 263a, 263b, and 263c with diodes. The probes 263a, 263b, and 263c with diodes are provided in the wave guide tube 21 at the interval of λg/8 in the travelling direction of a microwave. The probes 263a, 263b, and 263c with diodes respectively output voltage signals V1, V2, and V3. The voltage signals V1, V2, and V3 are output to the tuner control unit 260 via corresponding A/D converters 264a, 264b, and 264c.

The tuner control unit 260 includes a calculation circuit 260a and a motor command circuit 260b. The calculation circuit 260a obtains a measured value of a reflection coefficient on the basis of the voltage signals V1, V2, and V3. When a reflection coefficient (complex reflection coefficient) observed at a position of the tuner wave detection unit 263 with respect to standing waves (a travelling wave and a reflected wave) of a microwave which propagates through the wave guide tube 21 is indicated by Γ, the voltage signals V1, V2, and V3 are expressed by the following equations.

$$V1 = K|Vi|^2(1+|\Gamma|^2+2|\Gamma|\cos\theta)$$

$$V2 = K|Vi|^2(1+|\Gamma|^2-2|\Gamma|\sin\theta)$$

$$V3 = K|Vi|^2(1+|\Gamma|^2-2|\Gamma|\cos\theta)$$

Here, K is a proportion constant (wave detection sensitivity), Vi is an incident wave amplitude, and |Γ| and θ are respectively an absolute value and a phase of the reflection coefficient Γ. The calculation circuit 260a performs calculation expressed by the following equations on the voltage signals V1, V2, and V3, so as to obtain a cosine product Vc and a sine product Vs regarding the reflection coefficient Γ.

$$Vc = V1 - V3 = 4 \cdot K \cdot |Vi|^2 |\Gamma| \cos\theta$$

$$Vs = V1 + V3 - 2 \cdot V2 = 4 \cdot K \cdot |Vi|^2 |\Gamma| \sin\theta$$

The motor command circuit 260b operates the drive circuit 262 on the basis of the cosine product Vc and the sine product Vs such that adjustment of impedance is performed in a feedback manner. The synchronization signal PSS-M for microwave power and the synchronization signal PSS-R for radio frequency power may be input to the tuner control unit 260.

Here, a description will be made of a problem in a case where pulse-modulated microwaves are matched with each other. FIGS. 28A and 28B illustrate an example of comparison between a synchronization signal for a microwave and a tuner operation. FIG. 28A illustrates the synchronization signal PSS-M for microwave power, and FIG. 28B is a time chart of a tuner operation. As illustrated in FIGS. 28A and 28B, in a case where the tuner receives a matching start command at rising of a pulse of the synchronization signal PSS-M for microwave power, a process of determining positions of the stubs (tuner positions) is started, and the stubs start to be moved therefrom. As an example, the high time HT of microwave power is 0.9 μs to 5 μs, and the pulse cycle PT1 is 1 μs to 50 μs. On the other hand, tuner position determination process starting of tuner positions requires 100 ms or more. Thus, it is hard to operate the stubs in tracking of the synchronization signal PSS-M for microwave power.

There is a case where the tuner positions are not appropriate. FIGS. 29A, 29B and 29C illustrate an example of comparison between synchronization signals for a microwave and a radio frequency and a tuner operation. FIG. 29A illustrates the synchronization signal PSS-M for microwave power, FIG. 29B illustrates the synchronization signal PSS-R for radio frequency power, not synchronized with the synchronization signal PSS-M, and FIG. 29C is a time chart of a tuner operation, and illustrates three patterns. A pattern 1 corresponds to a case of automatic matching (general tuner operation). A pattern 2 corresponds to a case where tuner positions matched with the time of a high level of the synchronization signal PSS-M for microwave power are prepared in advance, and the stubs are set at the tuner positions. A pattern 3 corresponds to a case where tuner positions matched with the time of a low level of the synchronization signal PSS-M for microwave power are prepared in advance, and the stubs are set at the tuner positions. In the pattern 1, since a high level and a low level of microwave power are processed on the average, an average tuner position between the high level and the low level is settled, and thus there is concern that a tuner position suitable for each of the high level and the low level may not be calculated. The patterns 2 and 3 employ the preset tuner positions, and thus a load change cannot be taken into consideration.

Figure 30:
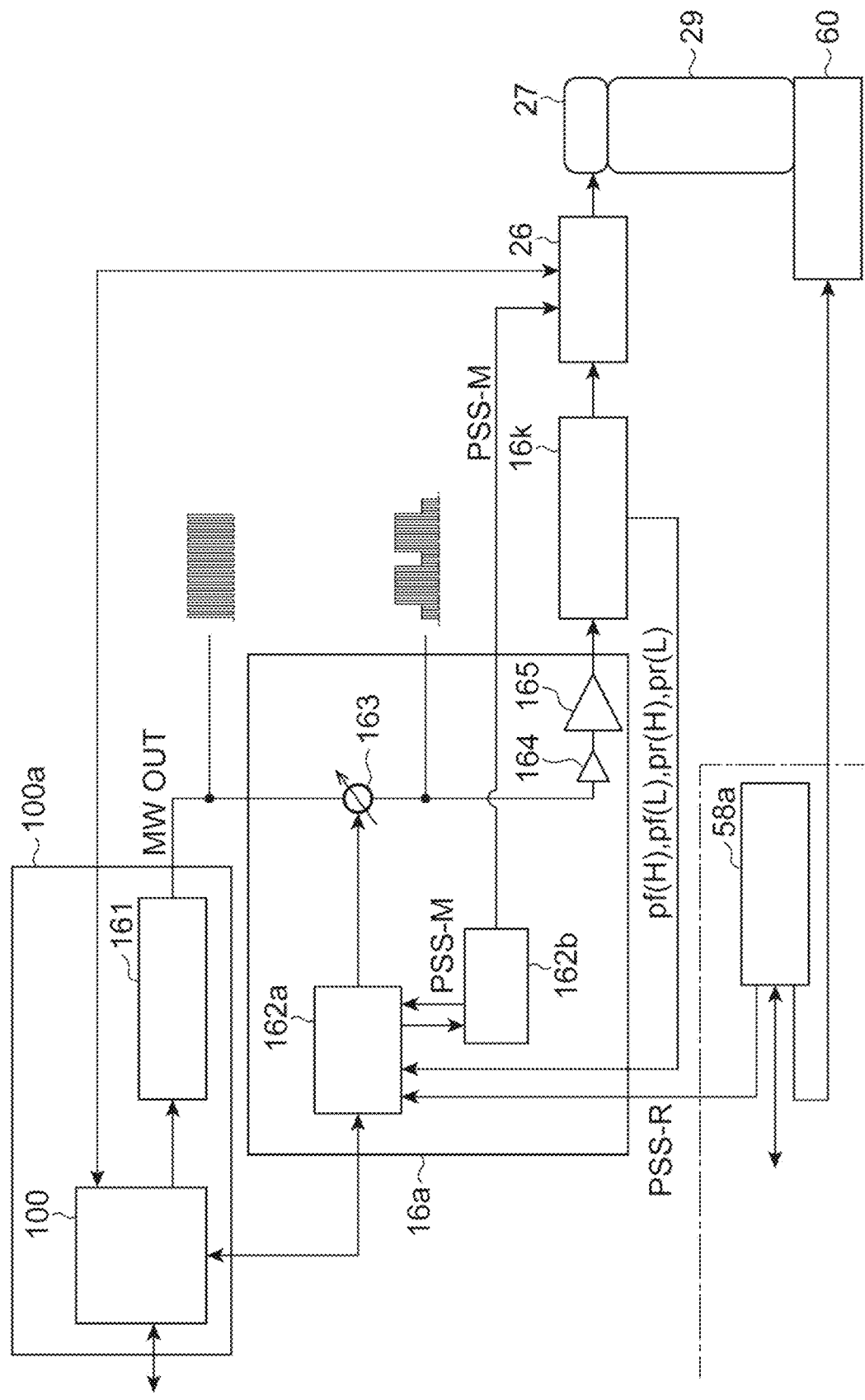
FIG. 30 is a diagram illustrating an example of a tuner performing an operation corresponding to a synchronization signal for a microwave.

A description will be made of a configuration for solving the above-described problem. FIG. 30 is a diagram illustrating an example of a tuner performing an operation corresponding to a synchronization signal for a microwave. The configuration illustrated in FIG. 30 is the same as the configuration illustrated in FIG. 6 except that the synchronization signal PSS-M for microwave power is input to the tuner 26 from the pulse generator 162b. The tuner 26 selects a measured value in the tuner wave detection unit 263 by using the synchronization signal PSS-M, so as to solve the above-described problem.

Figure 31A:
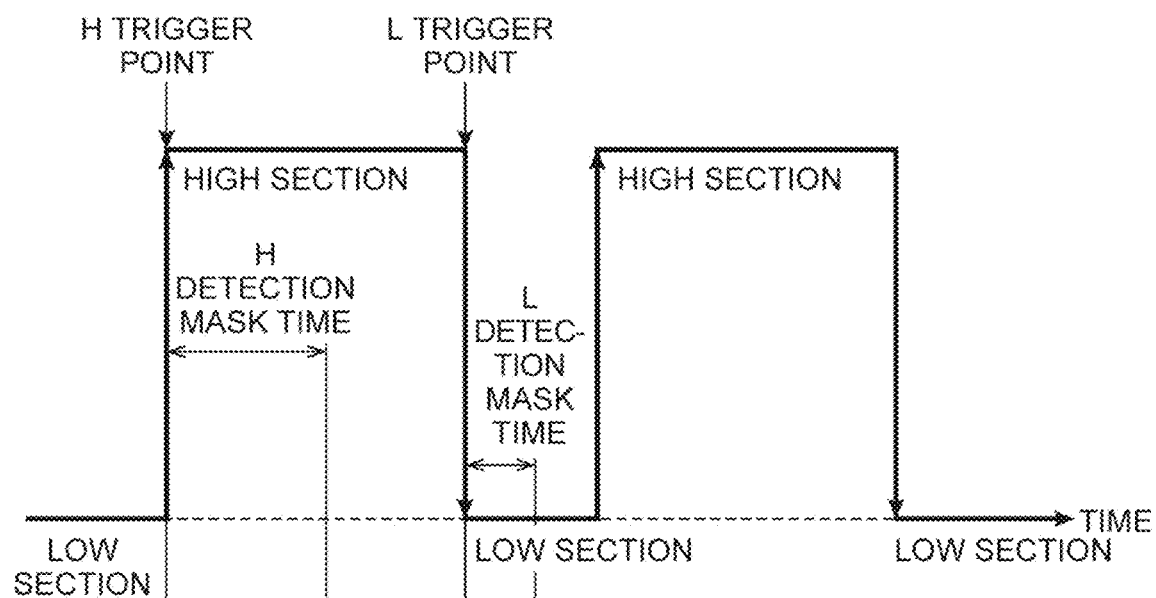
FIGS. 31A and 31B are diagrams for explaining a detection section in a wave detection unit of the tuner.
Figure 31B:
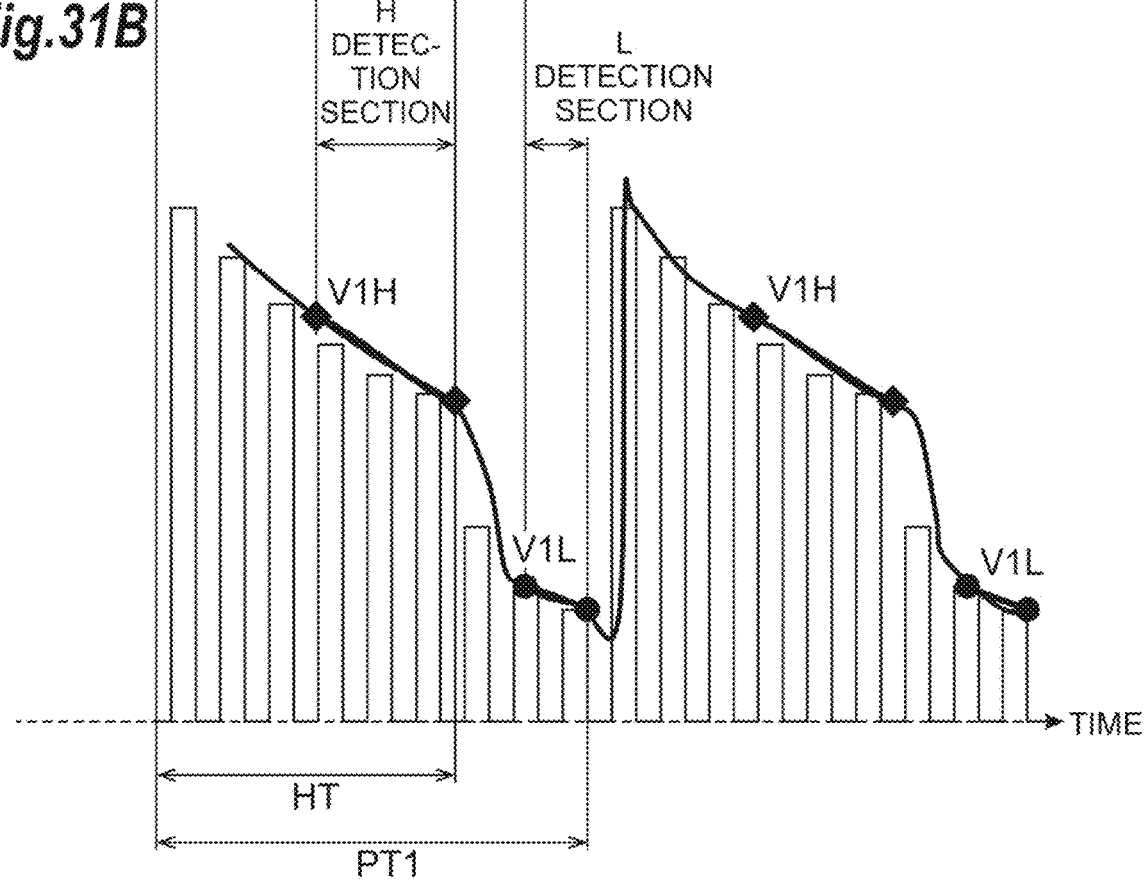

FIGS. 31A and 31B are diagrams for explaining a detection section in the tuner wave detection unit. FIG. 31A illustrates the synchronization signal PSS-M for microwave power, and FIG. 31B illustrates a measured value which is measured by the probe 263a with the diode of the tuner wave detection unit 263. As illustrated in FIGS. 31A and 31B, an ON section of the synchronization signal PSS-M is set to a high section, and an OFF section is set to a low section. Rising of a pulse of the synchronization signal PSS-M is set to an H trigger point (high level timing), and falling of the pulse is set to an L trigger point (low level timing).

The H detection mask time (first period) is a time until a predetermined time elapses from the H trigger point. For the H detection mask time, acquisition of data is prohibited. The H detection mask time is provided such that acquisition of data is prevented in a section in which microwave power is unstable. The H detection section (first measurement period) is a section from the end of the H detection mask time to the L trigger point. The H detection section is a section in which a high level measured value V1H of a travelling wave is acquired. The H detection mask time and the H detection section are stored in a storage unit of the tuner 26 in advance.

The L detection mask time (second period) is a time until a predetermined time elapses from the L trigger point. For the L detection mask time, acquisition of data is prohibited. The L detection mask time is provided such that acquisition of data is prevented in a section in which microwave power is unstable. The L detection section (second measurement period) is a section from the end of the L detection mask time to the H trigger point. The L detection section is a section in which a low level measured value V1L of a travelling wave is acquired. The L detection mask time and the L detection section are stored in the storage unit of the tuner 26 in advance.

Measured values V2H, V2L, V3H, and V3L are acquired in the same method for the probes 263b and 263c with the diodes. The measured values are stored in the storage unit of the tuner 26.

Pulse Synchronization in Tuner

Figure 32:
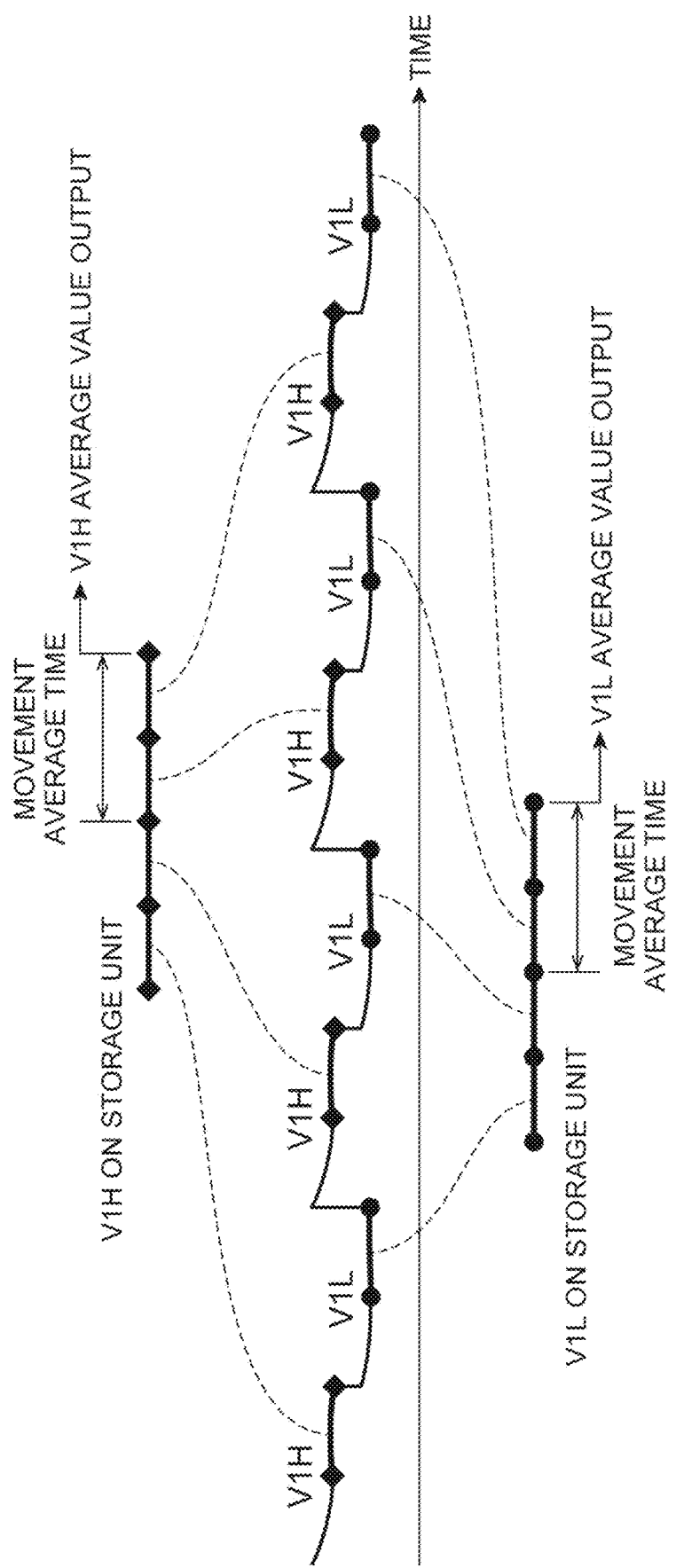
FIG. 32 is a diagram for explaining an example of averaging measured values in the wave detection unit of the tuner during power modulation.

FIG. 32 is a diagram illustrating an example of averaging measured values in the tuner wave detection unit during power modulation.

Each of the high level measured value V1H and the low level measured value V1L of microwave power is stored in the storage unit of the tuner 26 in a time series as a time-series buffer.

When the high level measured value V1H is described as an example, the measured value V1H may be handled as a measured value in a section obtained by connecting a plurality of H detection sections to each other on the time-series buffer in the storage unit. The value is data acquired in the past. The tuner control unit 260 determines a movement average time by using the section obtained by connecting a plurality of H detection sections to each other. The tuner control unit 260 calculates the averaged measured value V1H by using the movement average time. The tuner control unit 260 calculates an average movement time in the same method for the measured value V1L, and calculates an averaged measured value V1L. Pulse synchronization is performed in the tuner by using the averaged measured values.

Matching Process in Tuner During Pulse Modulation of Microwave Power

The tuner 26 performs three processes such as a process of writing a measured value of microwave power, a measured value averaging process and a reflection coefficient computation process, and a motor drive process as a matching process during pulse modulation of microwave power in parallel in a multitasking manner. Since the motor drive process is the same as a motor drive process of the related art, hereinafter, details of the writing process, and the measured value averaging process and the reflection coefficient computation process will be described.

Process of Writing Measured Value of Microwave Power

Figure 33:
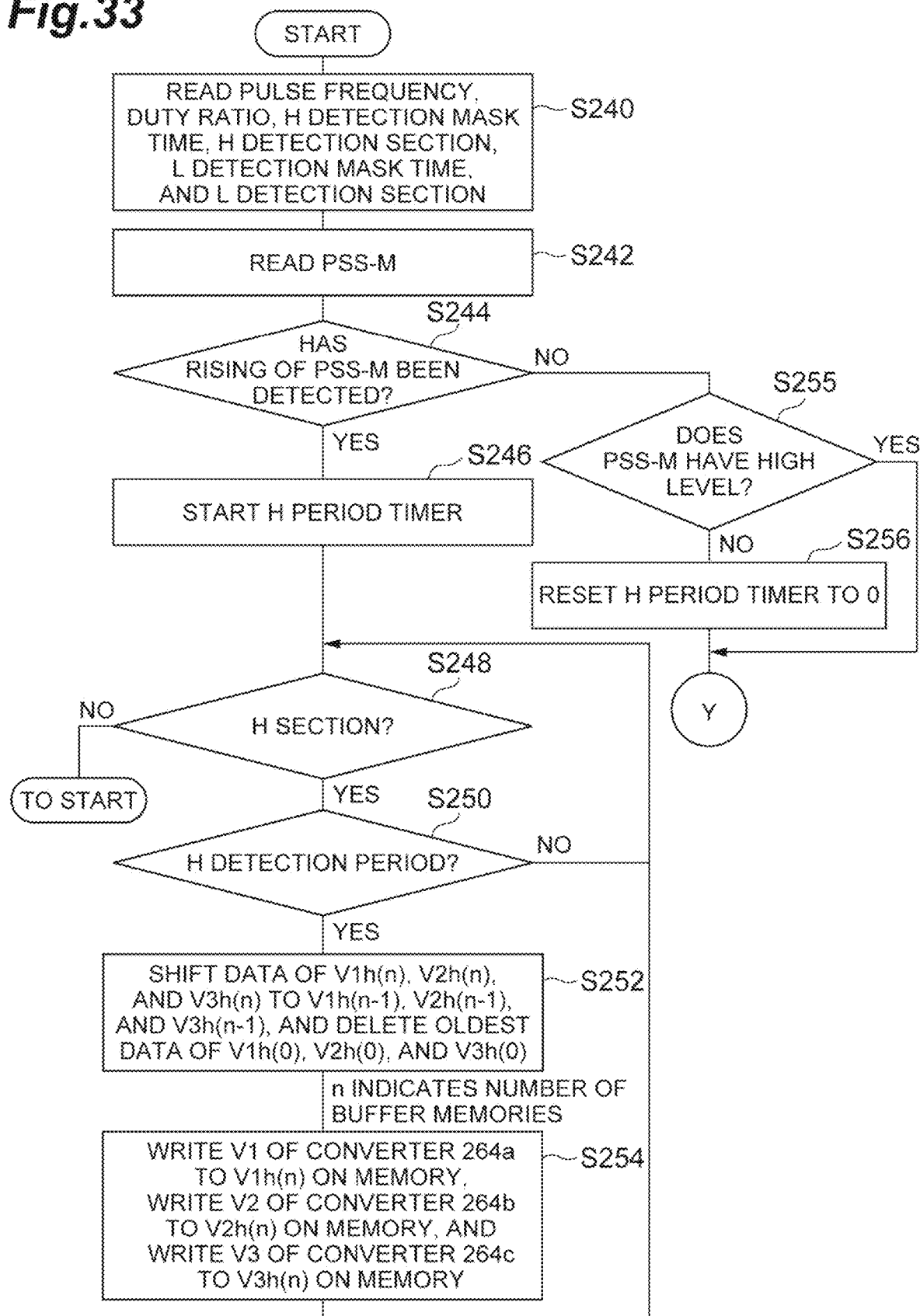
FIG. 33 is a flowchart illustrating an example of a writing process on a storage unit of the tuner during power modulation.
Figure 34:
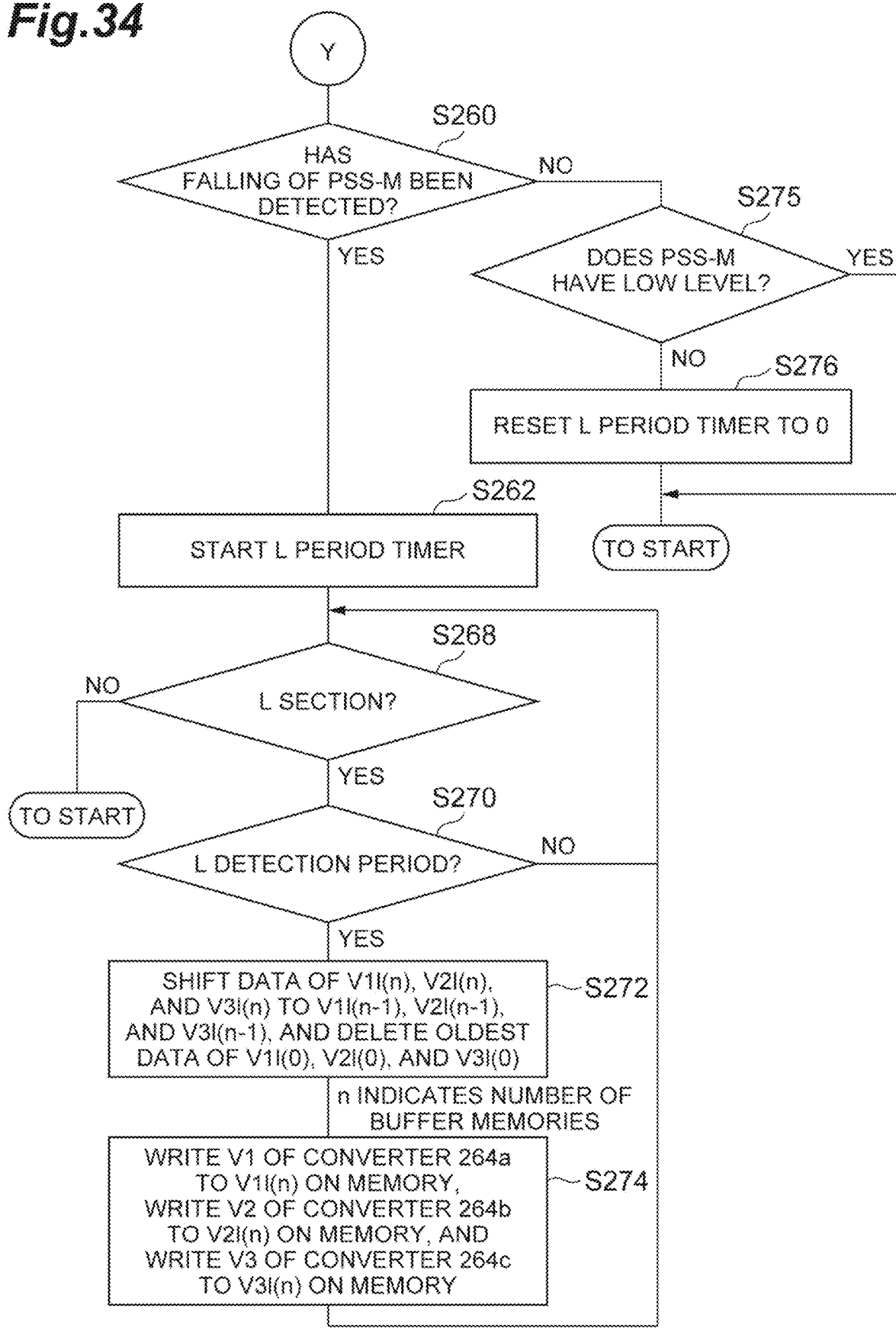
FIG. 34 is a flowchart illustrating an example of a writing process on the storage unit of the tuner during power modulation.

FIGS. 33 and 34 are flowcharts illustrating an example of a writing process on the storage unit of the tuner during power modulation. The flowcharts of FIGS. 33 and 34 are started at a timing at which, for example, an operator performs an operation of starting the microwave power control process.

As illustrated in FIG. 33, as a reading process (step S240), the tuner control unit 260 acquires a pulse frequency and a duty ratio from the controller 100, and acquires the H detection mask time, the H detection section, the L detection mask time, and the L detection section by referring to the storage unit.

Next, as a reading process (step S242), the tuner control unit 260 acquires the synchronization signal PSS-M for a microwave from the pulse generator 162b.

Next, as a determination process (step S244), the tuner control unit 260 determines whether or not rising of the synchronization signal PSS-M acquired in the reading process (step S242) has been detected.

In a case where it is determined that rising of the synchronization signal PSS-M has been detected (step S244: YES), the tuner control unit 260 starts an H period timer as a timer process (step S246). The H period timer is a timer which counts time elapse from the rising of the synchronization signal PSS-M.

The tuner control unit 260 determines whether or not a section is a high level section as a determination process (step S248). The tuner control unit 260 determines whether or not a section is a high level section by using the H period timer counted in the timer process (step S246) and the pulse frequency and the duty ratio acquired in the reading process (step S240).

In a case where it is determined that a section is a high level section (step S248: YES), the tuner control unit 260 determines whether or not a period is an H detection period as a determination process (step S250). The tuner control unit 260 determines whether or not a period is the H detection period by using the H period timer counted in the timer process (step S246).

In a case where it is determined that a period is the H detection period (step S250: YES), the tuner control unit 260 deletes the oldest data of data stored in the storage unit of the tuner 26 as an arrangement process (step S252). When the number of buffer memories is indicated by n, the tuner control unit 260 deletes high level measured values $V1h(0)$, $V2h(0)$, and $V3h(0)$ of microwave power. The tuner control unit 260 shifts storage positions on data of the measured values $V1h(n)$, $V2h(n)$, and $V3h(n)$ to storage positions of measured values $V1h(n-1)$, $V2h(n-1)$, and $V3h(n-1)$.

Next, the tuner control unit 260 stores the measured values in the storage unit of the tuner 26 as a writing process (step S254). The tuner control unit 260 stores the measured value V1 of microwave power detected by the A/D converter 264a (FIG. 27) in $V1h(n)$ of the storage unit of the tuner 26. The tuner control unit 260 stores the measured value V2 of microwave power detected by the A/D converter 264b (FIG. 27) in $V2h(n)$ of the storage unit of the tuner 26. The tuner control unit 260 stores the measured value V3 of microwave power detected by the A/D converter 264c (FIG. 27) in $V3h(n)$ of the storage unit of the tuner 26.

In a case where it is determined that a period is not the H detection period (step S250: NO), or the writing process (step S254) is finished, the tuner control unit 260 performs the determination process (step S248) again. As mentioned above, the arrangement process (step S252) and the writing process (step S254) are performed only in the high level section and the H detection section. Consequently, the high level power measured values $V1h(n)$, $V2h(n)$, and $V3h(n)$ of a microwave are stored in the storage unit of the tuner 26 in a time series.

In a case where it is determined that a section is not a high level section (step S248: NO), the tuner control unit 260 performs the reading process (step S240) again. In a case where it is determined that a section is not a high level section after rising of the synchronization signal PSS-M is detected, this indicates that a single pulse ends. Thus, a new process is performed from the reading process (step S240).

In a case where it is determined that rising of the synchronization signal PSS-M is not detected (step S244: NO), the tuner control unit 260 determines whether or not the synchronization signal PSS-M has a high level as a determination process (step S255). In a case where it is determined that the synchronization signal PSS-M does not have a high level (step S255: NO), the tuner control unit 260 resets the H period timer to 0 as a reset process (step S256). In a case where it is determined that the synchronization signal PSS-M has a high level (step S255: YES), the tuner control unit 260 skips the reset process (step S256).

Next, as illustrated in FIG. 34, the tuner control unit 260 determines whether or not falling of the synchronization signal PSS-M acquired in the reading process (step S242) has been detected as a determination process (step S260).

In a case where it is determined that falling of the synchronization signal PSS-M has been detected (step S260: YES), the tuner control unit 260 starts an L period timer as a timer process (step S262). The L period timer is a timer which counts time elapse from the falling of the synchronization signal PSS-M.

The tuner control unit 260 determines whether or not a section is a low level section as a determination process (step S268). The tuner control unit 260 determines whether or not a section is a low level section by using the L period timer counted in the timer process (step S262) and the pulse frequency and the duty ratio acquired in the reading process (step S240).

In a case where it is determined that a section is a low level section (step S268: YES), the tuner control unit 260 determines whether or not a period is an L detection period as a determination process (step S270). The tuner control unit 260 determines whether or not a period is an L detection period by using the L period timer counted in the timer process (step S262).

In a case where it is determined that a period is an L detection period (step S270: YES), the tuner control unit 260 deletes the oldest data of data stored in the storage unit of the tuner 26 as an arrangement process (step S272). When the number of buffer memories is indicated by n, the tuner control unit 260 deletes low level measured values $V1l(0)$, $V2l(0)$, and $V3l(0)$ of microwave power. The tuner control unit 260 shifts storage positions on data of the measured values $V1l(n)$, $V2l(n)$, and $V3l(n)$ to storage positions of measured values $V1l(n-1)$, $V2l(n-1)$, and $V3l(n-1)$.

Next, the tuner control unit 260 stores the measured values in the storage unit of the tuner 26 as a writing process (step S274). The tuner control unit 260 stores the measured value V1 of microwave power detected by the A/D converter 264a (FIG. 27) in $V1l(n)$ of the storage unit of the tuner 26. The tuner control unit 260 stores the measured value V2 of microwave power detected by the A/D converter 264b (FIG. 27) in $V2l(n)$ of the storage unit of the tuner 26. The tuner control unit 260 stores the measured value V3 of microwave power detected by the A/D converter 264c (FIG. 27) in $V3l(n)$ of the storage unit of the tuner 26.

In a case where it is determined that a period is not an L detection period (step S270: NO), or the writing process (step S274) is finished, the tuner control unit 260 performs the determination process (step S268) again. As mentioned above, the arrangement process (step S272) and the writing process (step S274) are performed only in the low level section and the L detection section. Consequently, the low level power measured values $V1l(n)$, $V2l(n)$, and $V3l(n)$ of a microwave are stored in the storage unit of the tuner 26 in a time series.

In a case where it is determined that a section is not a low level section (step S268: NO), the tuner control unit 260 performs the reading process (step S240) again. In a case where it is determined that a section is not a low level section after falling of the synchronization signal PSS-M is detected, this indicates that a new high level pulse starts. Thus, the tuner control unit 260 performs a new process from the reading process (step S240).

In a case where it is determined that falling of the synchronization signal PSS-M is not detected (step S260: NO), the tuner control unit 260 determines whether or not the synchronization signal PSS-M has a low level as a determination process (step S275). In a case where it is determined that the synchronization signal PSS-M does not have a low level (step S275: NO), the tuner control unit 260 resets the L period timer to 0 as a reset process (step S276). In a case where it is determined that the synchronization signal PSS-M has a low level (step S275: YES), the tuner control unit 260 skips the reset process (step S276). The tuner control unit 260 performs the reading process (step S240) again. As mentioned above, the tuner control unit 260 repeatedly executes the flowcharts of FIGS. 33 and 34 until, for example, an operator performs an operation of finishing the power control process.

Time-Series Buffer Data

FIG. 35 illustrates an example of time-series buffer data. The time-series data illustrated in FIG. 35 may be obtained by executing the flowcharts of FIGS. 33 and 34. As illustrated in FIG. 35, for example, the high level measured value V1H and the low level measured value V1L of a microwave are stored in a time series in a period corresponding to several samples before the current time. The time-series buffer data is stored in a time series in the same manner for V2H, V2L, V3H, and V3L.

Measured Value Averaging Process and Reflection Coefficient Calculation Process

Figure 36:
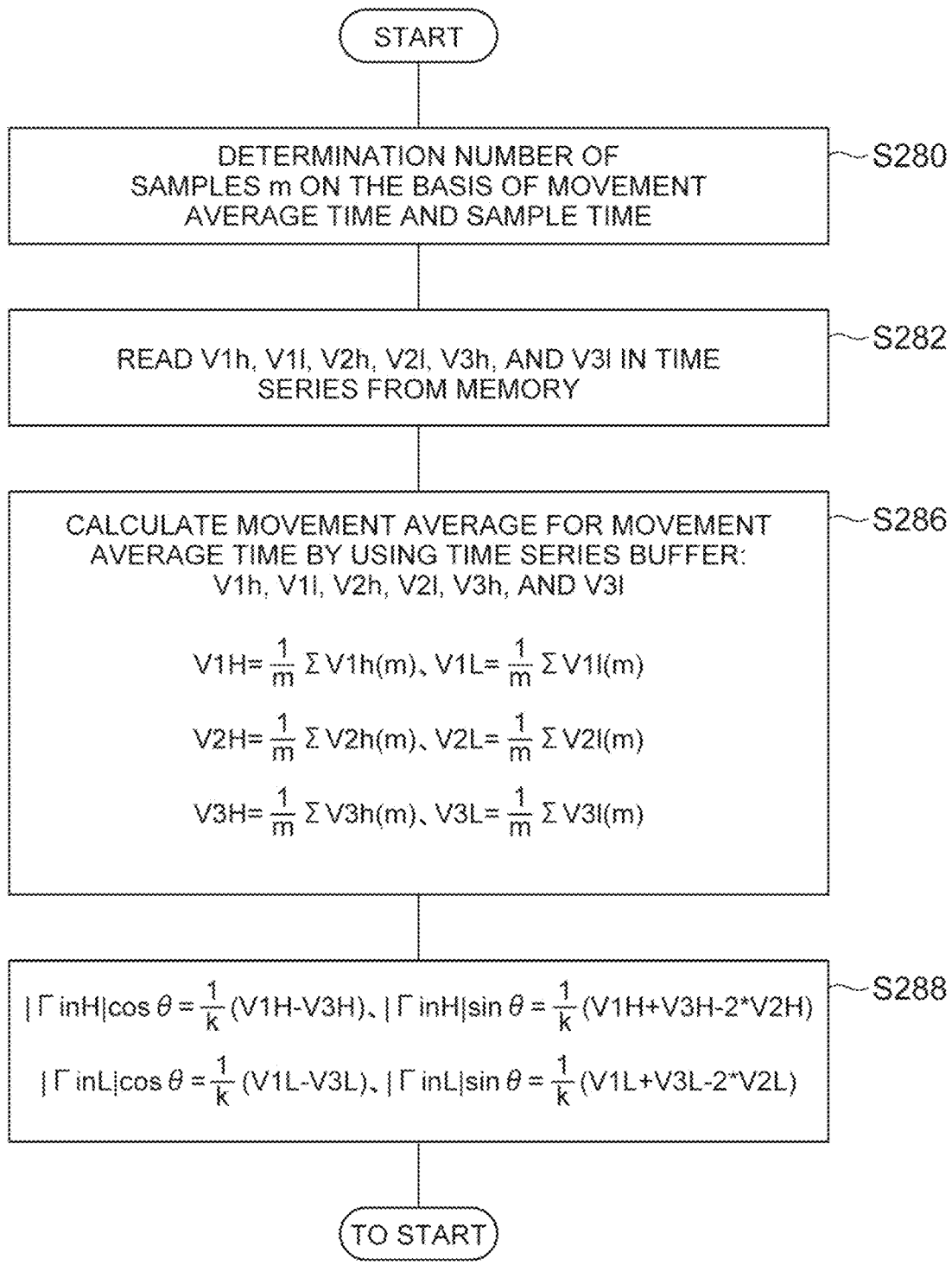
FIG. 36 is a flowchart illustrating an example of a measured value averaging process and a reflection coefficient calculation process.

Next, a description will be made of a measured value averaging process and a reflection coefficient calculation process using the time-series data in the tuner wave detection unit 263. FIG. 36 is a flowchart illustrating an example of a measured value averaging process and a reflection coefficient calculation process. The flowchart of FIG. 36 is started at a timing at which, for example, an operator performs an operation of starting the microwave power control process.

As illustrated in FIG. 36, the tuner control unit 260 determines the number of samples in as a determination process (step S280). The tuner control unit 260 determines the number of samples m on the basis of a movement average time (FIG. 32) obtained by connecting a plurality of H detection sections to each other and a predetermined sample time (sampling interval).

Next, as a reading process (step S282), the tuner control unit 260 refers to the storage unit of the tuner 26, and acquires the measured values V1h, V2h, V3h, V1l, V2l, and V3l in a time series.

Next, as an averaging process (step S286), the tuner control unit 260 calculates movement averages for movement average times, by using the measured values V1h, V2h, V3h, V1l, V2l, and V3l acquired in the reading process (step S282). Consequently, averaged measured values V1H, V2H, V3H, V1L, V2L, and V3L are calculated. Specifically, the averaged measured values are calculated according to the following equations (where n>=m).

$$V1H = \frac{1}{m}\sum V1h(m),$$

$$V1L = \frac{1}{m}\sum V1l(m)$$

$$V2H = \frac{1}{m}\sum V2h(m),$$

-continued $$V2L = \frac{1}{m}\sum V2l(m)$$

$$V3H = \frac{1}{m}\sum V3h(m),$$

$$V3L = \frac{1}{m}\sum V3l(m)$$

Next, as a computation process (step S288), the tuner control unit 260 calculates a reflection coefficient Γ by using the values calculated in the averaging process (step S286). Specifically, the reflection coefficient is calculated according to the following equations.

$$|\Gamma inH|\cos\theta = \frac{1}{k}(V1H - V3H),$$

$$|\Gamma inH|\sin\theta = \frac{1}{k}(V1H + V3H - 2\cdot V2H)$$

$$|\Gamma inL|\cos\theta = \frac{1}{k}(V1L - V3L),$$

$$|\Gamma inL|\sin\theta = \frac{1}{k}(V1L + V3L - 2\cdot V2L)$$

Here, |ΓinH| indicates an absolute value of a reflection coefficient corresponding to a high level, |ΓinL| indicates an absolute value of a reflection coefficient corresponding to a low level, and θ indicates a rotation angle of an imaginary part. In addition, k is a proportion constant.

When the computation process (step S288) is finished, the flowchart of FIG. 36 is finished, and the tuner control unit 260 performs the determination process (step S280) again. As mentioned above, the tuner control unit 260 repeatedly executes the flowchart of FIG. 36 until, for example, an operator performs an operation of finishing the power control process.

Tuner Matching in Case of Taking into Consideration Radio Frequency Power

Figure 37:
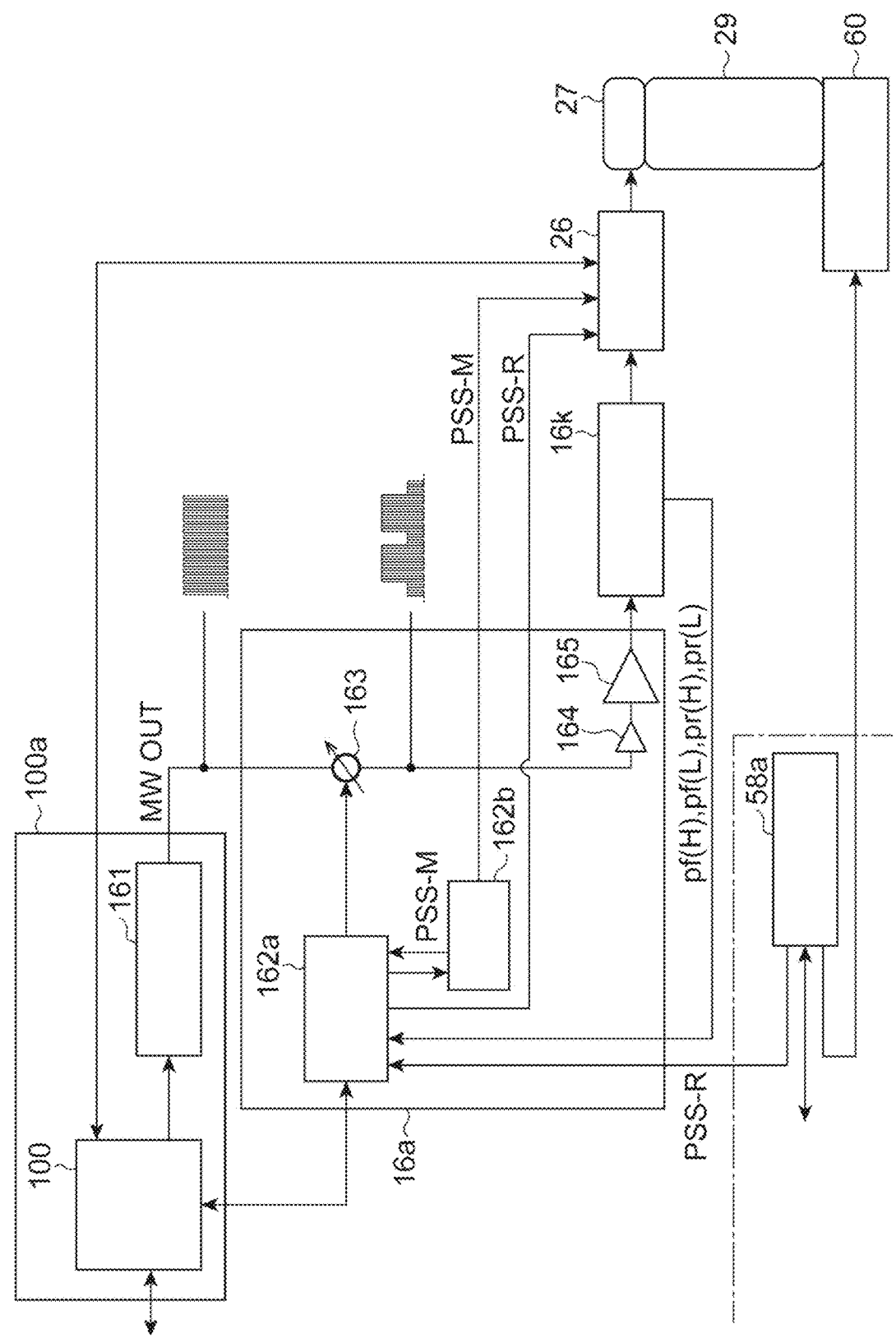
FIG. 37 is a diagram illustrating an example of a tuner performing an operation corresponding to synchronization signals for a microwave and a radio frequency.

Next, a description will be made of tuner control in a case where pulse modulation of radio frequency power is taken into consideration. FIG. 37 is a diagram illustrating an example of a tuner performing an operation corresponding to synchronization signals for a microwave and a radio frequency. The configuration illustrated in FIG. 37 is the same as the configuration illustrated in FIG. 30 except that the synchronization signal PSS-R for radio frequency power is input to the tuner 26 from the control unit 162a. The tuner 26 selects a measured value in the tuner wave detection unit 263 by using the synchronization signal PSS-M and the synchronization signal PSS-R.

As described above, synchronization examples of the synchronization signal PSS-M and the synchronization signal PSS-R include the first synchronization example (FIGS. 9A and 9B) and the second synchronization example (FIGS. 10A and 10B). Hereinafter, other synchronization examples, a third synchronization example and a fourth synchronization example will be described.

Third Synchronization Example

Figure 38:
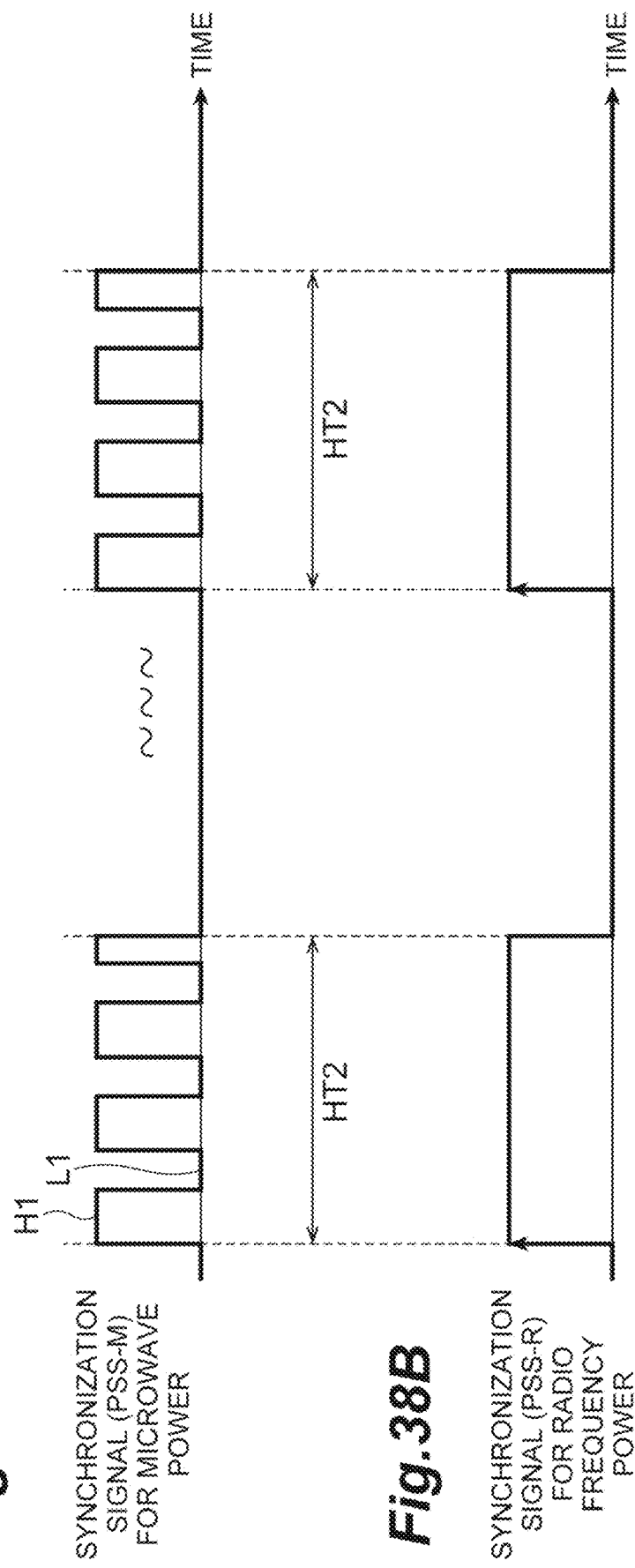
FIGS. 38A and 38B are diagrams illustrating a third synchronization example in which a synchronization signal for modulating power of a microwave is synchronized with a synchronization signal for modulating power of a radio frequency.

FIGS. 38A and 38B are diagrams illustrating a third synchronization example in which a synchronization signal for modulating power of a microwave is not synchronized with a synchronization signal for modulating power of a radio frequency. A signal in FIG. 38A is the synchronization signal PSS-M for microwave power, and a signal in FIG. 38B is the synchronization signal PSS-R for radio frequency power. The control unit 162a acquires a timing at which radio frequency power has a high level on the basis of the synchronization signal PSS-R (an arrow in the figure). The control unit 162a outputs the timing at which radio frequency power has a high level to the pulse generator 162b as a synchronization trigger. The pulse generator 162b synchronizes a timing at which microwave power has a high level with the timing at which radio frequency power has a high level. The synchronization signal PSS-M for microwave power is set to be low at a timing at which radio frequency power has a low level. Consequently, the synchronization signal PSS-M for microwave power can be synchronized to be output at only the timing at which radio frequency power has a high level.

The tuner control unit 260 acquires voltages corresponding to a high level and a low level of microwave power (H1 and L1 in the figure) when the synchronization signal PSS-R for radio frequency power has a high level (HT2 in the figure). A synchronization number No. 3 is allocated to the third synchronization example.

Fourth Synchronization Example

Figure 39:
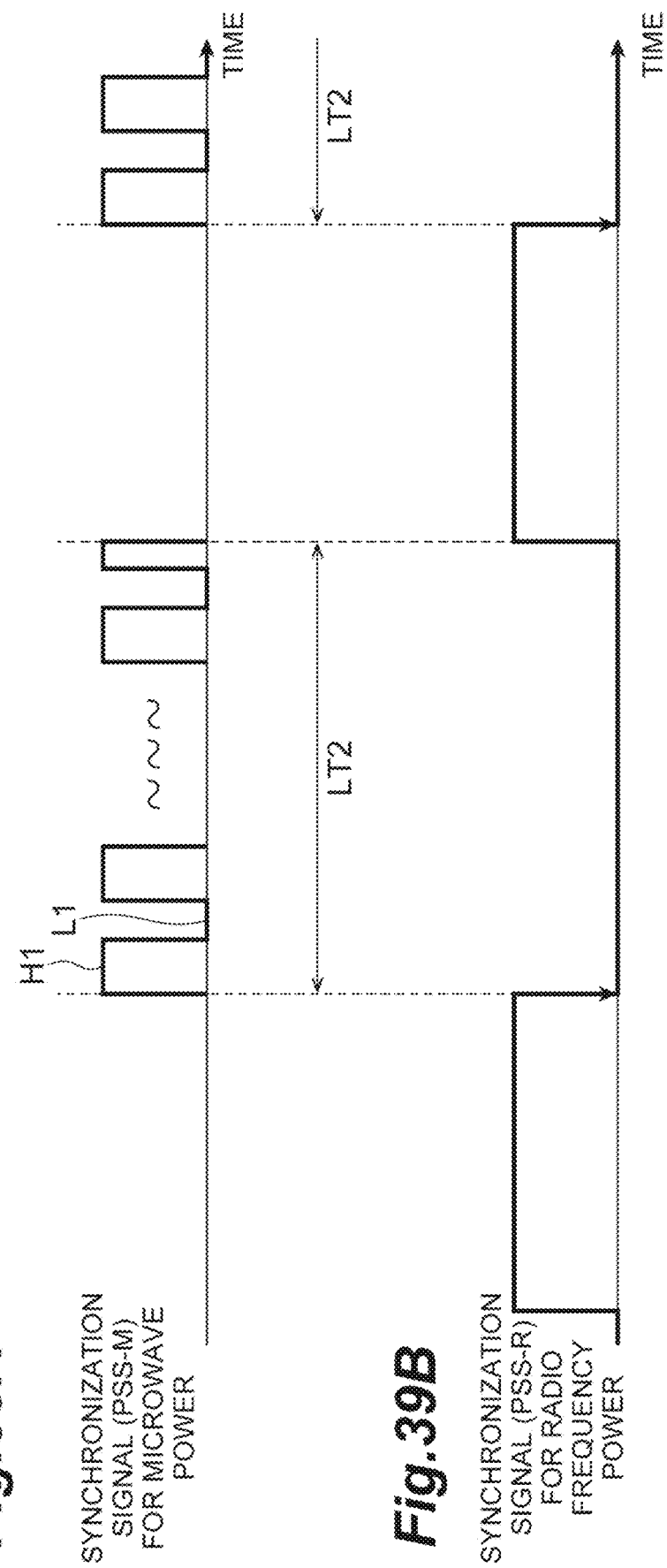
FIGS. 39A and 39B are diagrams illustrating a fourth synchronization example in which a synchronization signal for modulating power of a microwave is synchronized with a synchronization signal for modulating power of a radio frequency.

FIGS. 39A and 39B are diagrams illustrating a fourth synchronization example in which a synchronization signal for modulating power of a microwave is not synchronized with a synchronization signal for modulating power of a radio frequency. A signal in FIG. 39A is the synchronization signal PSS-M for microwave power, and a signal in FIG. 39B is the synchronization signal PSS-R for radio frequency power. The control unit 162a acquires a timing at which radio frequency power has a low level on the basis of the synchronization signal PSS-R (an arrow in the figure). The control unit 162a outputs the timing at which radio frequency power has a low level to the pulse generator 162b as a synchronization trigger. The pulse generator 162b synchronizes a timing at which microwave power has a low level with the timing at which radio frequency power has a low level. The synchronization signal PSS-M for microwave power is set to be low at a timing at which radio frequency power has a high level. Consequently, the synchronization signal PSS-M for microwave power can be synchronized to be output at only the timing at which radio frequency power has a low level.

The tuner control unit 260 acquires voltages corresponding to a high level and a low level of microwave power (H1 and L1 in the figure) when the synchronization signal PSS-R for radio frequency power has a low level (LT2 in the figure). A synchronization number No. 4 is allocated to the fourth synchronization example.

Process of Generating Synchronization Signal for Microwave

Figure 40:
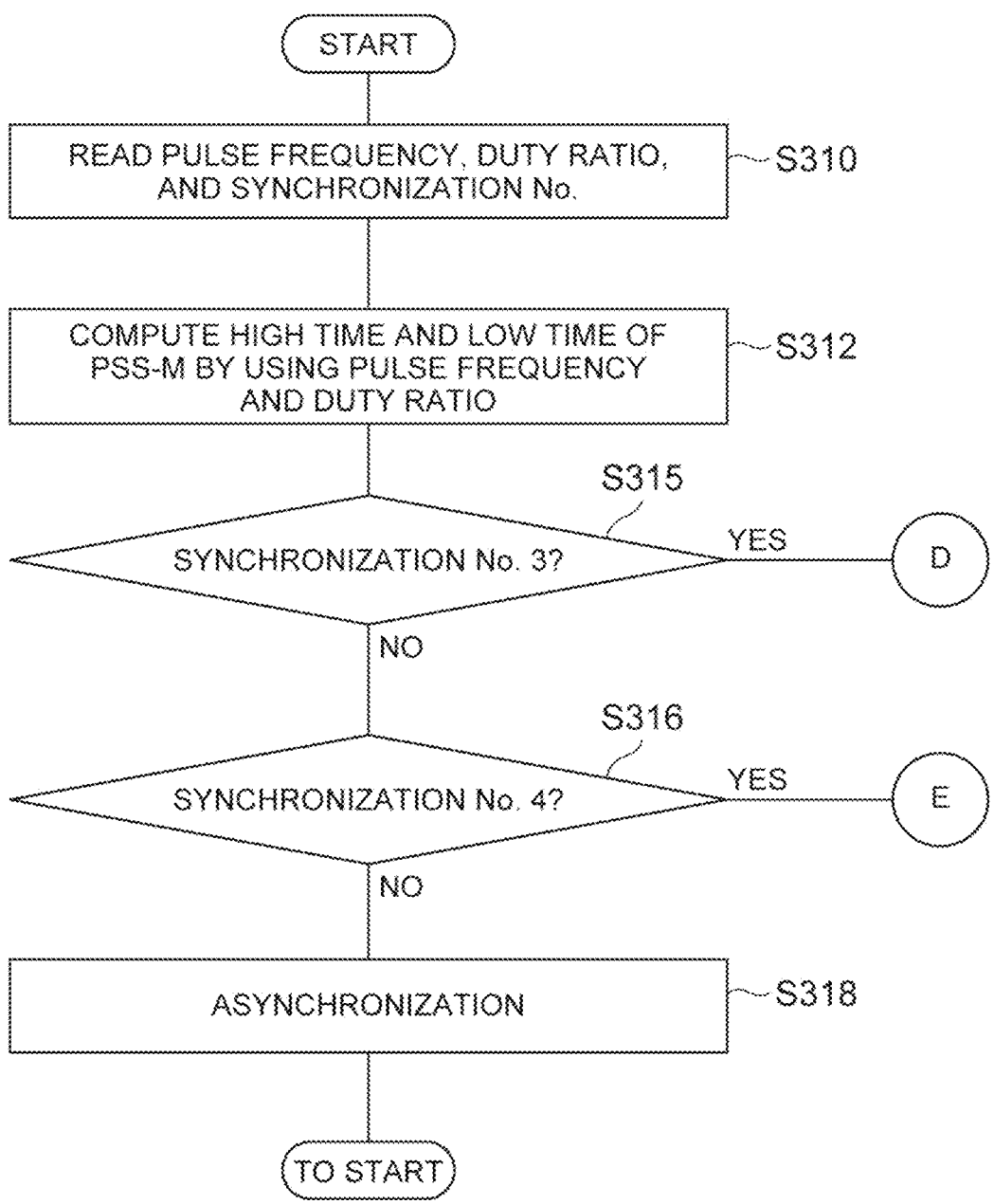
FIG. 40 is a flowchart illustrating an example of a process of generating a synchronization signal for a microwave.

Next, a description will be made of a process of generating synchronization signals related to the third synchronization example and the fourth synchronization example. FIG. 40 is a flowchart illustrating a process of generating a synchronization signal for a microwave. The flowchart of FIG. 40 is started at a timing at which, for example, an operator performs an operation of starting the power control process.

The flowchart of FIG. 40 is the same as the flowchart of FIG. 16 except that a determination process (step S315) and a determination process (step S316) are performed instead of the determination process (step S14) and the determination process (step S16). In other words, a reading process (step S310), a calculation process (step S312), and an asynchronization process (step S318) are respectively the same as the reading process (step S10), the calculation process (step S12), and the asynchronization process (step S18) in FIG. 16.

Next, the control unit 162a determines whether or not the synchronization number acquired in the reading process (step S310) is No. 3 as a determination process (step S315). The synchronization number No. 3 is a number allocated to the third synchronization example.

In a case where it is determined that the synchronization number is No. 3 (step S315: YES), a process of generating a synchronization signal related to the third synchronization example is started. In the third synchronization example, as illustrated in FIGS. 38A and 38B, the synchronization signal PSS-M synchronized with the synchronization signal PSS-R for radio frequency power is generated. This generation process will be described later with reference to FIG. 41. In a case where it is determined that the synchronization number is not No. 3 (step S315: NO), the control unit 162a determines whether or not the synchronization number acquired in the reading process (step S310) is No. 4 as a determination process (step S316). The synchronization number No. 4 is a number allocated to the fourth synchronization example.

In a case where it is determined that the synchronization number is No. 4 (step S316: YES), a process of generating a synchronization signal related to the fourth synchronization example is started. In the fourth synchronization example, as illustrated in FIGS. 39A and 39B, the synchronization signal PSS-M synchronized with the synchronization signal PSS-R for radio frequency power is generated. This generation process will be described later with reference to FIG. 42. Other processes are the same as those in FIG. 16.

Instead of the flowchart of FIG. 40, a flowchart in which the determination processes (step S315 and step S316) in FIG. 40 are added to the flowchart of FIG. 16 may be used.

Figure 41:
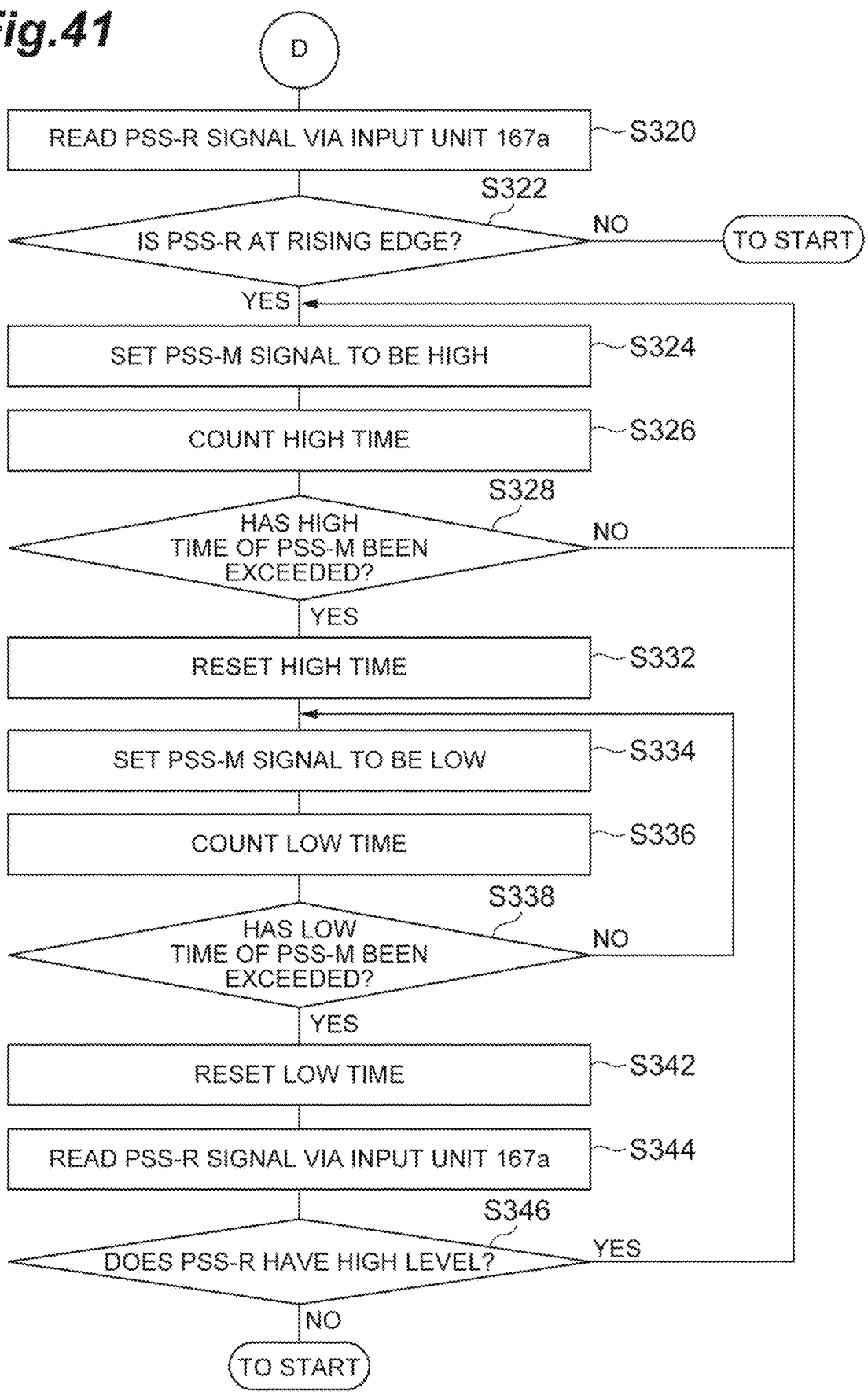
FIG. 41 is a flowchart illustrating an example of a process of generating a synchronization signal related to the third synchronization example.

Process of Generating Synchronization Signal Related to Third Synchronization Example In the third synchronization example, as illustrated in FIGS. 38A and 38B, the synchronization signal PSS-M for microwave power is synchronized to be output at only a timing at which radio frequency power has a high level. FIG. 41 is a flowchart illustrating an example of a process of generating a synchronization signal related to the third synchronization example. The flowchart of FIG. 41 is started in a case where it is determined that the synchronization number is No. 3 in the determination process (step S315) in FIG. 40 (step S315: YES).

As illustrated in FIG. 41, the control unit 162a of the microwave generation unit 16a acquires the synchronization signal PSS-R for radio frequency power via the pulse input unit 167a as a reading process (step S320).

Next, the control unit 162a determines whether or not the synchronization signal PSS-R for radio frequency power is at a rising edge as a determination process (step S322). In a case where it is determined that the synchronization signal PSS-R for radio frequency power is at the rising edge (step S322: YES), the control unit 162a determines that a synchronization timing comes, and outputs a synchronization trigger to the pulse generator 162b.

The pulse generator 162b sets the synchronization signal PSS-M for microwave power to a high level as a setting process (step S324). The pulse generator 162b counts the high time as a count process (step S326). The pulse generator 162b determines whether or not the high time counted in the count process (step S326) has exceeded the high time of the synchronization signal PSS-M calculated in the calculation process (step S312) in FIG. 40 as an elapse determination process (step S328).

In a case where it is determined that the counted high time does not exceed the high time of the synchronization signal PSS-M (step S328: NO), the pulse generator 162b performs the setting process (step S324) and the count process (step S326) again. In other words, the pulse generator 162b repeatedly performs the setting process (step S324) and the count process (step S326) until it is determined that the counted high time has exceeded the high time of the synchronization signal PSS-M.

In a case where it is determined that the counted high time has exceeded the high time of the synchronization signal PSS-M (step S328: YES), the pulse generator 162b resets the counted high time as a reset process (step S332). The pulse generator 162b sets the synchronization signal PSS-M to a low level as a setting process (step S334). The pulse generator 162b counts the low time as a count process (step S336). The pulse generator 162b determines whether or not the low time counted in the count process (step S336) has exceeded the low time of the synchronization signal PSS-M calculated in the calculation process (step S312) in FIG. 40 as an elapse determination process (step S338).

In a case where it is determined that the counted low time does not exceed the low time of the synchronization signal PSS-M (step S338: NO), the pulse generator 162b performs the setting process (step S334) and the count process (step S336) again. In other words, the pulse generator 162b repeatedly performs the setting process (step S334) and the count process (step S336) until it is determined that the counted low time has exceeded the low time of the synchronization signal PSS-M.

In a case where it is determined that the counted low time has exceeded the low time of the synchronization signal PSS-M (step S338: YES), the pulse generator 162b resets the counted low time as a reset process (step S342).

Next, the control unit 162a acquires the synchronization signal PSS-R for radio frequency power via the pulse input unit 167a as a reading process (step S344). Next, the control unit 162a determines whether or not the synchronization signal PSS-R for radio frequency power has a high level as a determination process (step S346).

In a case where it is determined that the synchronization signal PSS-R for radio frequency power has a high level (step S346: YES), the pulse generator 162b performs the setting process (step S324) again. In a case where it is determined that the synchronization signal PSS-R for radio frequency power does not have a high level (step S346: NO), or the synchronization signal PSS-R for radio frequency power is not at a rising edge (step S322: NO), the flowchart of FIG. 41 is finished, and the reading process (step S310) in FIG. 40 is performed again. By executing the flowchart of FIG. 41, the synchronization signal PSS-M for microwave power can be synchronized to be output at only a timing at which radio frequency power has a high level.

Figure 42:
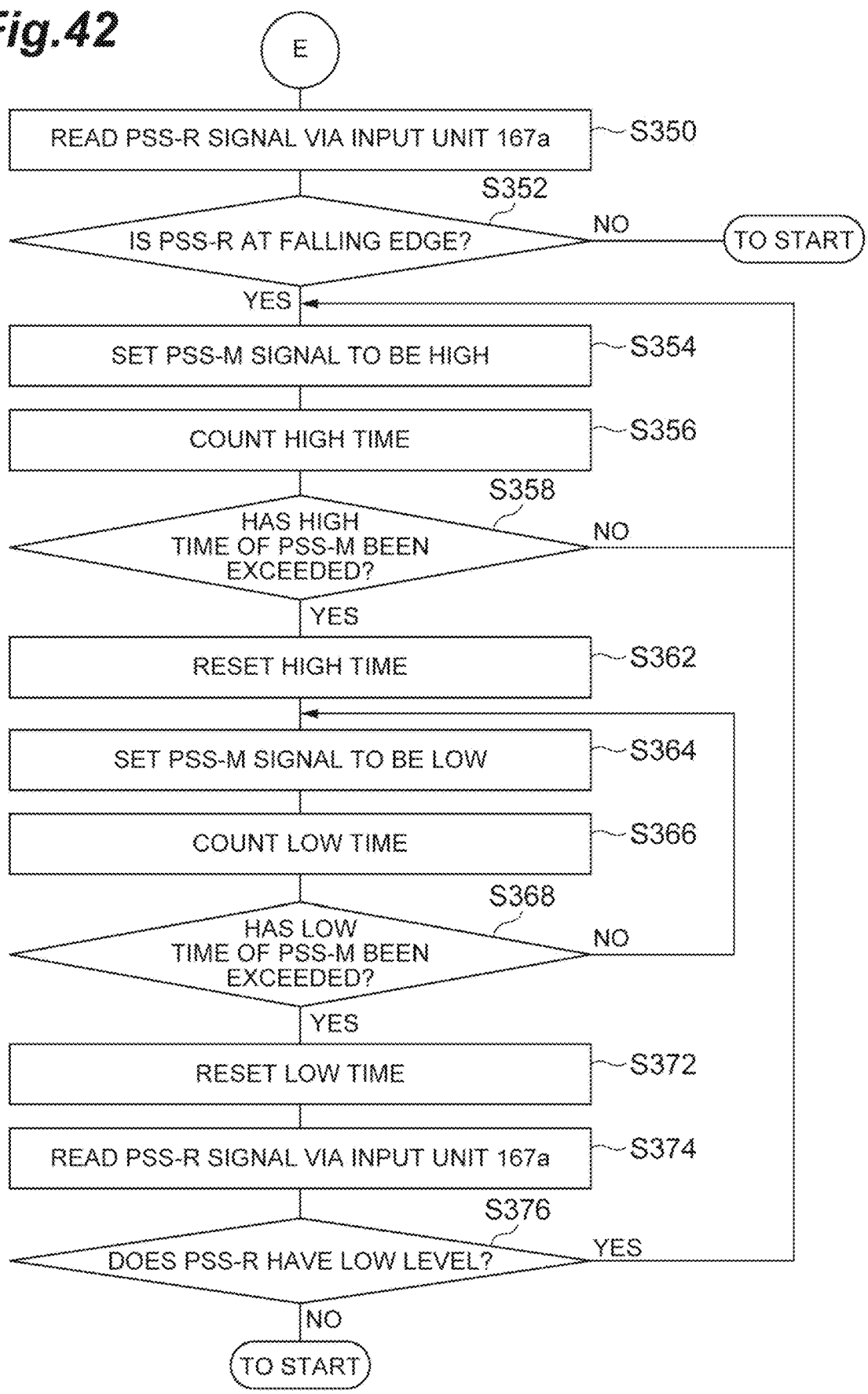
FIG. 42 is a flowchart illustrating an example of a process of generating a synchronization signal related to the fourth synchronization example.

Process of Generating Synchronization Signal Related to Fourth Synchronization Example In the fourth synchronization example, as illustrated in FIGS. 39A and 39B, the synchronization signal PSS-M for microwave power is synchronized to be output at only a timing at which radio frequency power has a low level. FIG. 42 is a flowchart illustrating an example of a process of generating a synchronization signal related to the fourth synchronization example. The flowchart of FIG. 42 is started in a case where it is determined that the synchronization number is No. 4 in the determination process (step S316) in FIG. 40 (step S316: YES).

The flowchart of FIG. 42 is the same as the flowchart of FIG. 41 except that a determination process (step S352) and a determination process (step S376) are different from the determination process (step S322) and the determination process (step S346).

In the determination process (step S352), it is determined whether or not the synchronization signal PSS-R for radio frequency power is at a falling edge. In the determination process (step S376), it is determined whether or not the synchronization signal PSS-R for radio frequency power has a low level.

By executing the flowchart of FIG. 42, the synchronization signal PSS-M for microwave power can be synchronized to be output at only a timing at which radio frequency power has a low level.

Matching Process in Case where Pulse Modulation of Radio Frequency Power is Taken into Consideration The tuner control unit 260 performs five processes such as a matching mode determination process, a detection timer process, a process of writing a measured value of microwave power, a measured value averaging process and a reflection coefficient computation process, and a motor drive process as a matching process during pulse modulation of microwave power in parallel in a multitasking manner. Since the motor drive process is the same as a motor drive process of the related art, hereinafter, details of other processes will be described.

Matching Mode Determination Process

Figure 43:
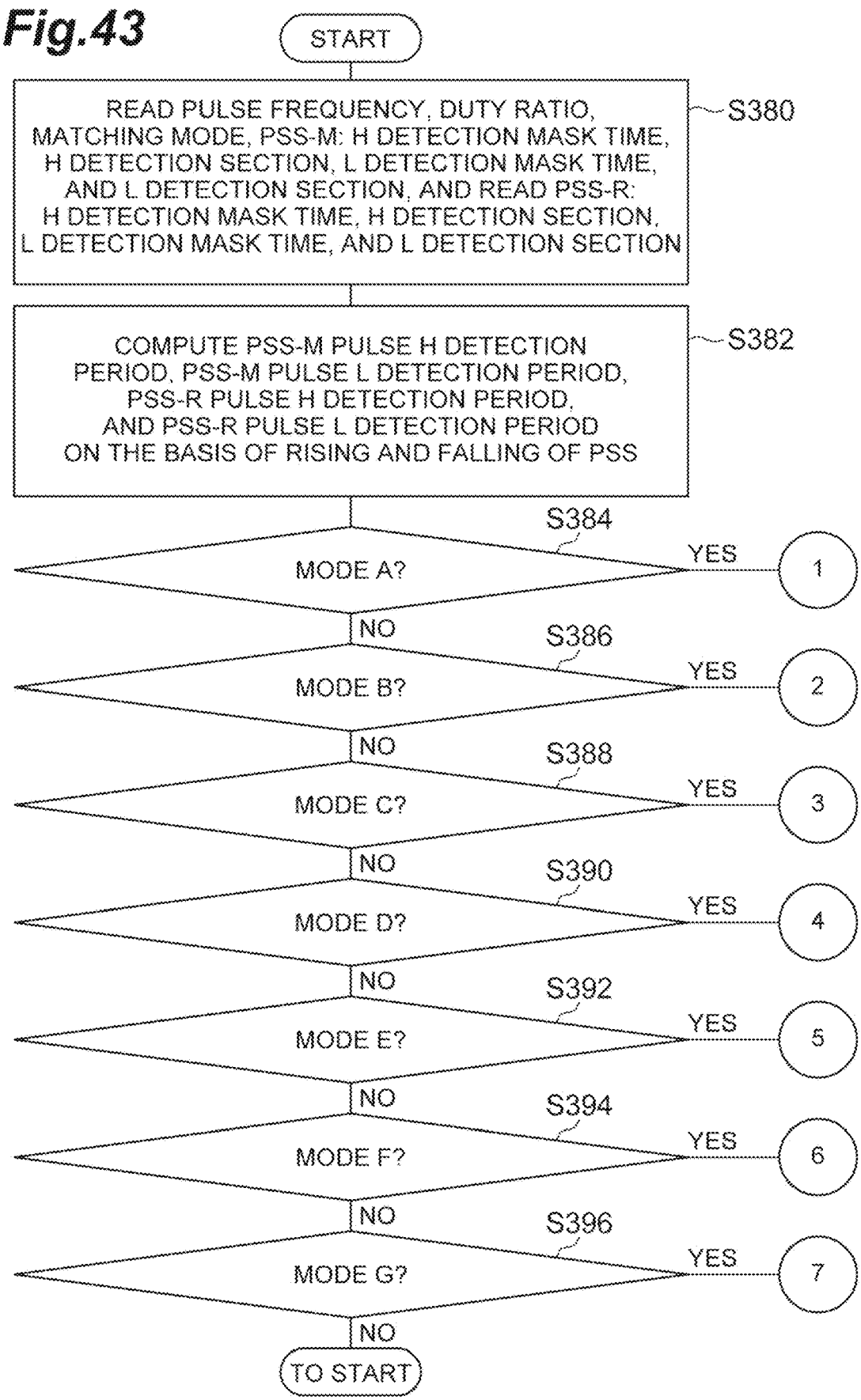
FIG. 43 is a flowchart illustrating an example of a matching mode determination process.

FIG. 43 is a flowchart illustrating an example of a matching mode determination process. The flowchart of FIG. 43 are started at a timing at which, for example, an operator performs an operation of starting the microwave power control process.

As illustrated in FIG. 43, as a reading process (step S380), the tuner control unit 260 acquires a pulse frequency, a duty ratio, and a matching mode from the controller 100, and acquires the H detection mask time, the H detection section, the L detection mask time, and the L detection section of the synchronization signal PSS-M, and the H detection mask time, the H detection section, the L detection mask time, and the L detection section of the synchronization signal PSS-R by referring to the storage unit.

The matching mode is an identification symbol for identifying the type of matching. A matching mode A is a mode in which matching with the synchronization signal PSS-M normally occurs, and the synchronization signal PSS-R is not necessary. A matching mode B is a mode in which matching occurs when the synchronization signal PSS-M has a high level, and the synchronization signal PSS-R is not necessary. A matching mode C is a mode in which matching occurs when the synchronization signal PSS-M has a low level, and the synchronization signal PSS-R is not necessary. A matching mode D is a mode in which matching occurs when the synchronization signal PSS-M has a high level, and the synchronization signal PSS-R has a high level. A matching mode E is a mode in which matching occurs when the synchronization signal PSS-M has a high level, and the synchronization signal PSS-R has a low level. A matching mode F is a mode in which matching occurs when the synchronization signal PSS-M has a low level, and the synchronization signal PSS-R has a high level. A matching mode G is a mode in which matching occurs when the synchronization signal PSS-M has a low level, and the synchronization signal PSS-R has a low level.

Next, as a calculation process (step S382), the tuner control unit 260 acquires the synchronization signal PSS-M for a microwave from the pulse generator 162b, and acquires the synchronization signal PSS-R for radio frequency power from the control unit 162a. Rising and falling of the synchronization signal PSS-M and the synchronization signal PSS-R are determined, and an H detection period and an L detection period of a pulse of the synchronization signal PSS-M, and an H detection period and an L detection period of a pulse of the synchronization signal PSS-R are calculated on the basis of the information acquired in the reading process (step S380).

Next, as a determination process (step S384), the tuner control unit 260 determines whether or not the matching mode acquired in the reading process (step S380) is the mode A. In a case where it is determined that the matching mode is the mode A (step S384: YES), the flow proceeds to a process 1.

In a case where it is determined that the matching mode is not the mode A (step S384: NO), as a determination process (step S386), the tuner control unit 260 determines whether or not the matching mode acquired in the reading process (step S380) is the mode B. In a case where it is determined that the matching mode is the mode B (step S386: YES), the flow proceeds to a process 2.

In a case where it is determined that the matching mode is not the mode B (step S386: NO), as a determination process (step S388), the tuner control unit 260 determines whether or not the matching mode acquired in the reading process (step S380) is the mode C. In a case where it is determined that the matching mode is the mode C (step S388: YES), the flow proceeds to a process 3.

In a case where it is determined that the matching mode is not the mode C (step S388: NO), as a determination process (step S390), the tuner control unit 260 determines whether or not the matching mode acquired in the reading process (step S380) is the mode D. In a case where it is determined that the matching mode is the mode D (step S390: YES), the flow proceeds to a process 4.

In a case where it is determined that the matching mode is not the mode D (step S390: NO), as a determination process (step S392), the tuner control unit 260 determines whether or not the matching mode acquired in the reading process (step S380) is the mode E. In a case where it is determined that the matching mode is the mode E (step S392: YES), the flow proceeds to a process 5.

In a case where it is determined that the matching mode is not the mode E (step S392: NO), as a determination process (step S394), the tuner control unit 260 determines whether or not the matching mode acquired in the reading process (step S380) is the mode F. In a case where it is determined that the matching mode is the mode F (step S394: YES), the flow proceeds to a process 6.

In a case where it is determined that the matching mode is not the mode F (step S394: NO), as a determination process (step S396), the tuner control unit 260 determines whether or not the matching mode acquired in the reading process (step S380) is the mode G In a case where it is determined that the matching mode is the mode G (step S396: YES), the flow proceeds to a process 7.

In a case where it is determined that the matching mode is not the mode G (step S396: NO), the flowchart of FIG. 43 is finished, and the tuner control unit 260 performs the reading process (step S380) again. As mentioned above, the tuner control unit 260 repeatedly executes the flowchart of FIG. 43 until, for example, an operator performs an operation of finishing the power control process.

Detection Timer Process

Figure 44:
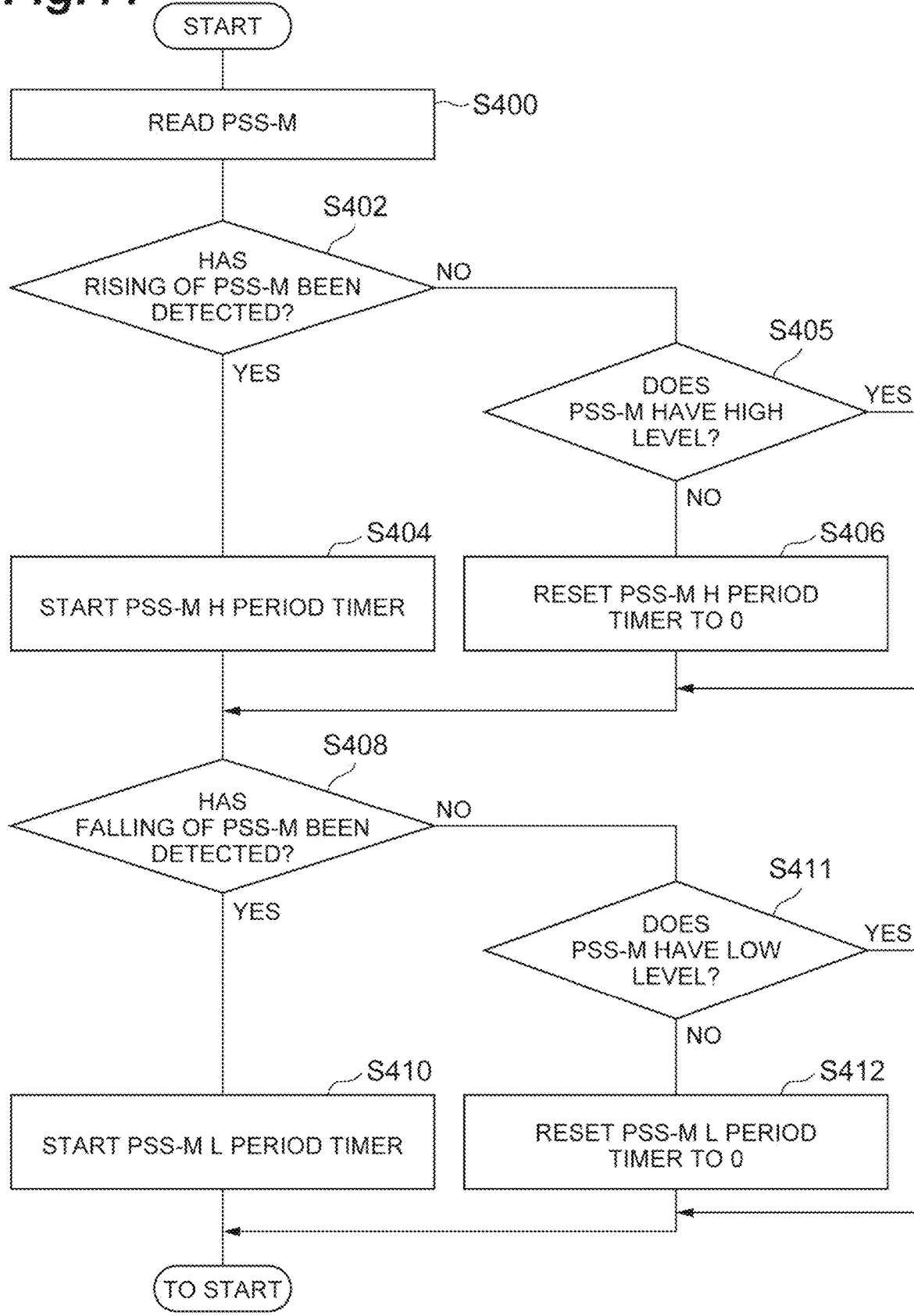
FIG. 44 is a flowchart illustrating a detection timer process for a synchronization signal for microwave power.

FIG. 44 is a flowchart illustrating a detection timer process for a synchronization signal for microwave power. The flowchart of FIG. 44 are started at a timing at which, for example, an operator performs an operation of starting the microwave power control process.

As illustrated in FIG. 44, as a reading process (step S400), the tuner control unit 260 acquires the synchronization signal PSS-M for a microwave from the pulse generator 162b.

Next, as a determination process (step S402), the tuner control unit 260 determines whether or not rising of the synchronization signal PSS-M acquired in the reading process (step S400) has been detected.

In a case where it is determined that rising of the synchronization signal PSS-M has been detected (step S402: YES), the tuner control unit 260 starts an H period timer as a timer process (step S404). The H period timer is a timer which counts time elapse from the rising of the synchronization signal PSS-M.

In a case where it is determined that rising of the synchronization signal PSS-M is not detected (step S402: NO), the tuner control unit 260 determines whether or not the synchronization signal PSS-M has a high level as a determination process (step S405). In a case where it is determined that the synchronization signal PSS-M does not have a high level (step S405: NO), the tuner control unit 260 resets the H period timer to 0 as a reset process (step S406). In a case where it is determined that the synchronization signal PSS-M has a high level (step S405: YES), the tuner control unit 260 skips the reset process (step S406).

In a case where the timer process (step S404) or the reset process (step S406) is finished, the tuner control unit 260 determines whether or not falling of the synchronization signal PSS-M acquired in the reading process (step S400) has been detected as a determination process (step S408).

In a case where it is determined that falling of the synchronization signal PSS-M has been detected (step S408: YES), the tuner control unit 260 starts an L period timer as a timer process (step S410). The L period timer is a timer which counts time elapse from the falling of the synchronization signal PSS-M.

In a case where it is determined that falling of the synchronization signal PSS-M is not detected (step S408: NO), the tuner control unit 260 determines whether or not the synchronization signal PSS-M has a low level as a determination process (step S411). In a case where it is determined that the synchronization signal PSS-M does not have a low level (step S411: NO), the tuner control unit 260 resets the L period timer to 0 as a reset process (step S412). In a case where it is determined that the synchronization signal PSS-M has a low level (step S411: YES), the tuner control unit 260 skips the reset process (step S412).

In a case where the timer process (step S410) or the reset process (step S412) is finished, or in a case where it is determined that the synchronization signal PSS-M has a low level (step S411: YES), the flowchart of FIG. 44 is finished, and the tuner control unit 260 performs the reading process (step S400) again. As mentioned above, the tuner control unit 260 repeatedly executes the flowchart of FIG. 44 until, for example, an operator performs an operation of finishing the power control process. By executing the flowchart of FIG. 44, an H period timer and an L period timer are set with respect to a synchronization signal for microwave power.

Figure 45:
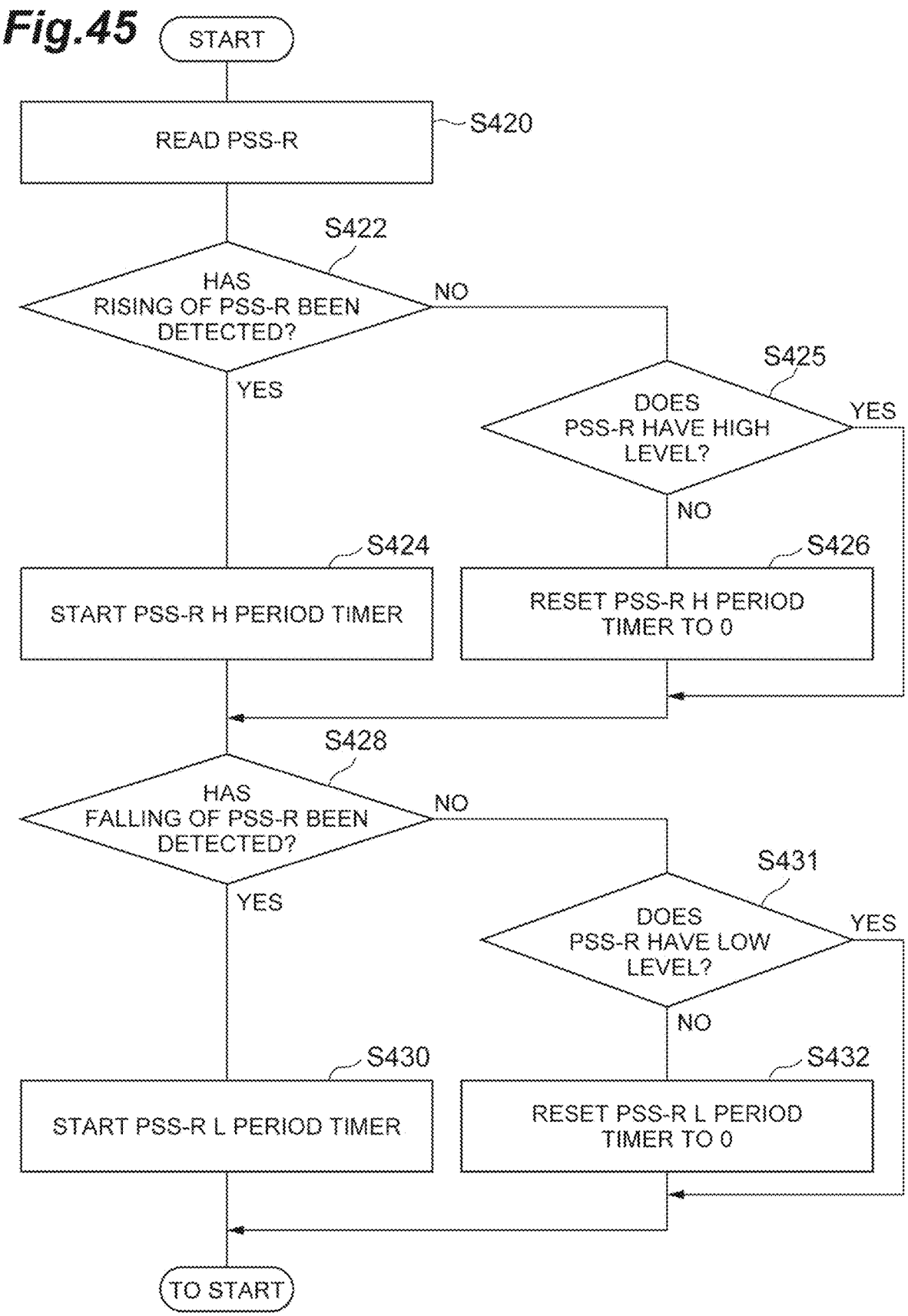
FIG. 45 is a flowchart illustrating a detection timer process for a synchronization signal for radio frequency power.

FIG. 45 is a flowchart illustrating a detection timer process for a synchronization signal for radio frequency power. The flowchart of FIG. 45 are started at a timing at which, for example, an operator performs an operation of starting the microwave power control process.

A reading process (step S420), a determination process (step S422), a timer process (step S424), a determination process (step S425), a reset process (step S426), a determination process (step S428), a timer process (step S430), a determination process (step S431), and a reset process (step S432) illustrated in FIG. 45 are the same as the reading process (step S400), the determination process (step S402), the timer process (step S404), the determination process (step S405), the reset process (step S406), the determination process (step S408), the timer process (step S410), the determination process (step S411), and the reset process (step S412) illustrated in FIG. 44 except that a processing target is the synchronization signal PSS-R for radio frequency power. By executing the flowchart of FIG. 45, an H period timer and an L period timer are set with respect to a synchronization signal for radio frequency power.

Process 1: Mode A

A process in the mode A is the same as that in FIGS. 33 and 34, and thus description thereof will be omitted.

Process 2: Mode B

Figure 46:
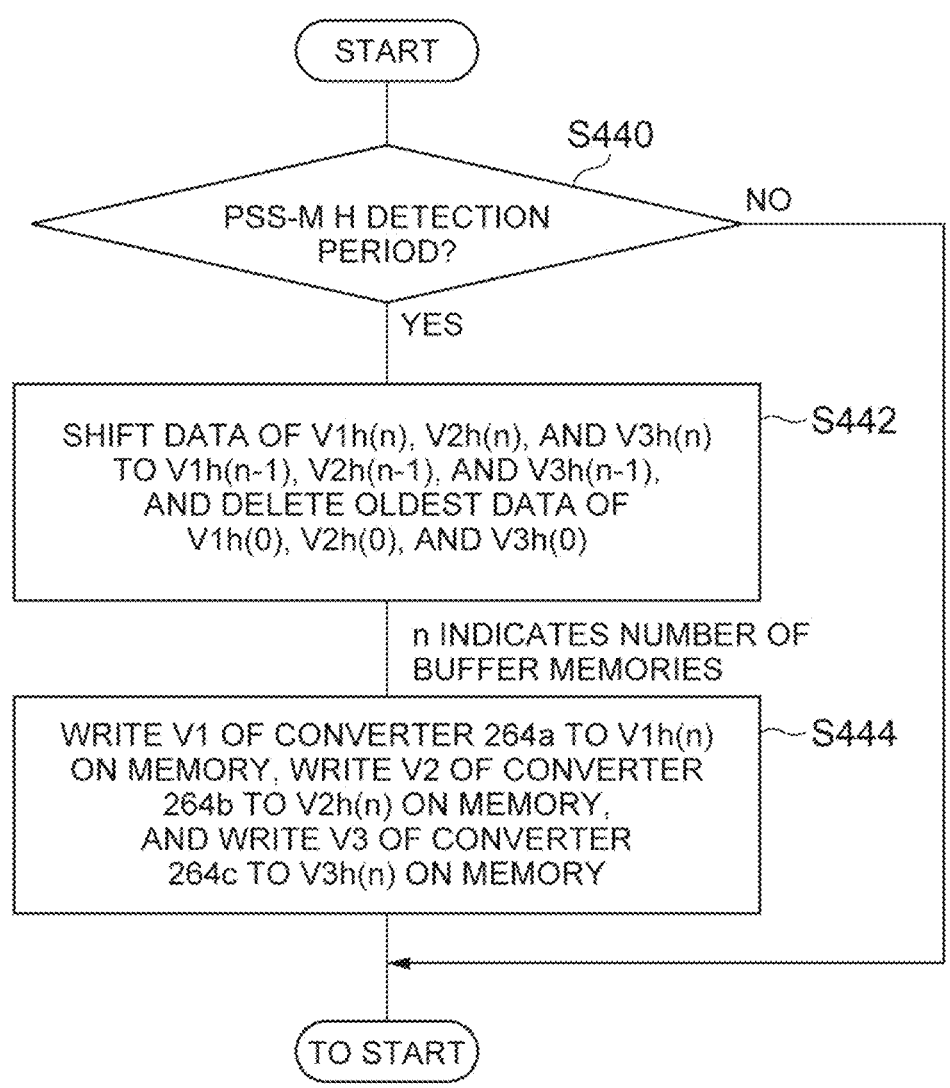
FIG. 46 is a flowchart illustrating an example of a writing process in a mode B.

FIG. 46 is a flowchart illustrating an example of a writing process in the mode B. The flowchart of FIG. 46 is started in a case where it is determined that the matching mode is the mode B in FIG. 43 (step S386: YES).

As illustrated in FIG. 46, as a determination process (step S440), the tuner control unit 260 determines whether or not a period is an H detection period of the synchronization signal PSS-M for a microwave. The tuner control unit 260 determines whether or not a period is the H detection period by using the H period timer counted in the timer process in FIG. 44.

In a case where it is determined that a period is the H detection period (step S440: YES), the tuner control unit 260 deletes the oldest data of data stored in the storage unit of the tuner 26 as an arrangement process (step S442). When the number of buffer memories is indicated by n, the tuner control unit 260 deletes high level measured values $V1h(0)$, $V2h(0)$, and $V3h(0)$ of microwave power. The tuner control unit 260 shifts storage positions on data of the measured values $V1h(n)$, $V2h(n)$, and $V3h(n)$ to storage positions of measured values $V1h(n-1)$, $V2h(n-1)$, and $V3h(n-1)$.

Next, the tuner control unit 260 stores the measured values in the storage unit of the tuner 26 as a writing process (step S444). The tuner control unit 260 stores the measured value V1 of microwave power detected by the A/D converter 264a (FIG. 27) in $V1h(n)$ of the storage unit of the tuner 26. The tuner control unit 260 stores the measured value V2 of microwave power detected by the A/D converter 264b (FIG. 27) in $V2h(n)$ of the storage unit of the tuner 26. The tuner control unit 260 stores the measured value V3 of microwave power detected by the A/D converter 264c (FIG. 27) in $V3h(n)$ of the storage unit of the tuner 26.

In a case where it is determined that a period is not the H detection period (step S440: NO), or the writing process (step S444) is finished, the tuner control unit 260 performs the determination process (step S440) again. As mentioned above, the arrangement process (step S442) and the writing process (step S444) are performed only in the H detection section. Consequently, the measured values $V1h(n)$, $V2h(n)$, and $V3h(n)$ of a microwave are stored in the storage unit of the tuner 26 in a time series only when microwave power has a high level.

Process 3: Mode C

Figure 47:
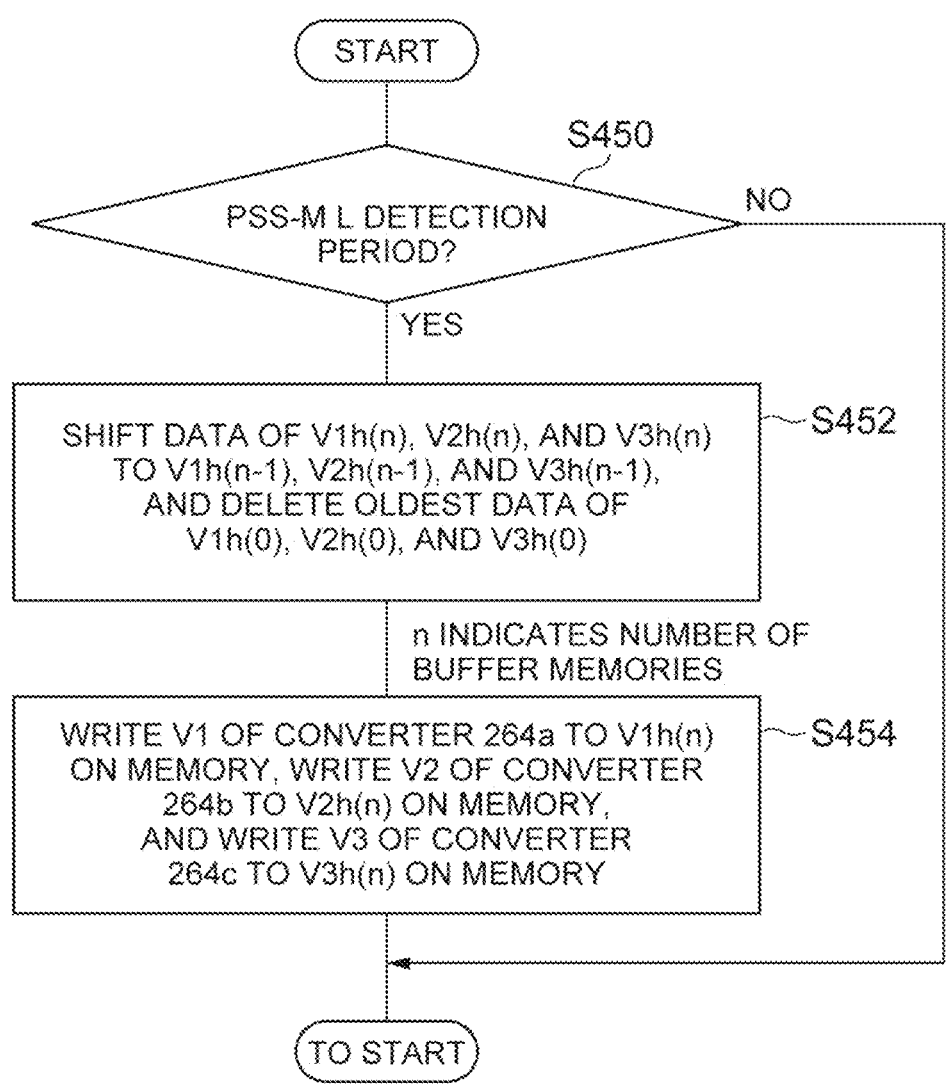
FIG. 47 is a flowchart illustrating an example of a writing process in a mode C.

FIG. 47 is a flowchart illustrating an example of a writing process in the mode C. The flowchart of FIG. 47 is started in a case where it is determined that the matching mode is the mode C (step S388: YES).

As illustrated in FIG. 47, as a determination process (step S450), the tuner control unit 260 determines whether or not a period is an L detection period of the synchronization signal PSS-M for a microwave. The tuner control unit 260 determines whether or not a period is the L detection period by using the L period timer counted in the timer process in FIG. 44.

An arrangement process (step S452) and a writing process (step S454) are the same as the arrangement process (step S442) and the writing process (step S444) in FIG. 46. As mentioned above, the arrangement process (step S452) and the writing process (step S454) are performed only in the L detection section. Consequently, the measured values $V1h(n)$, $V2h(n)$, and $V3h(n)$ are stored in the storage unit of the tuner 26 in a time series only when microwave power has a low level.

Process 4: Mode D

Figure 48:
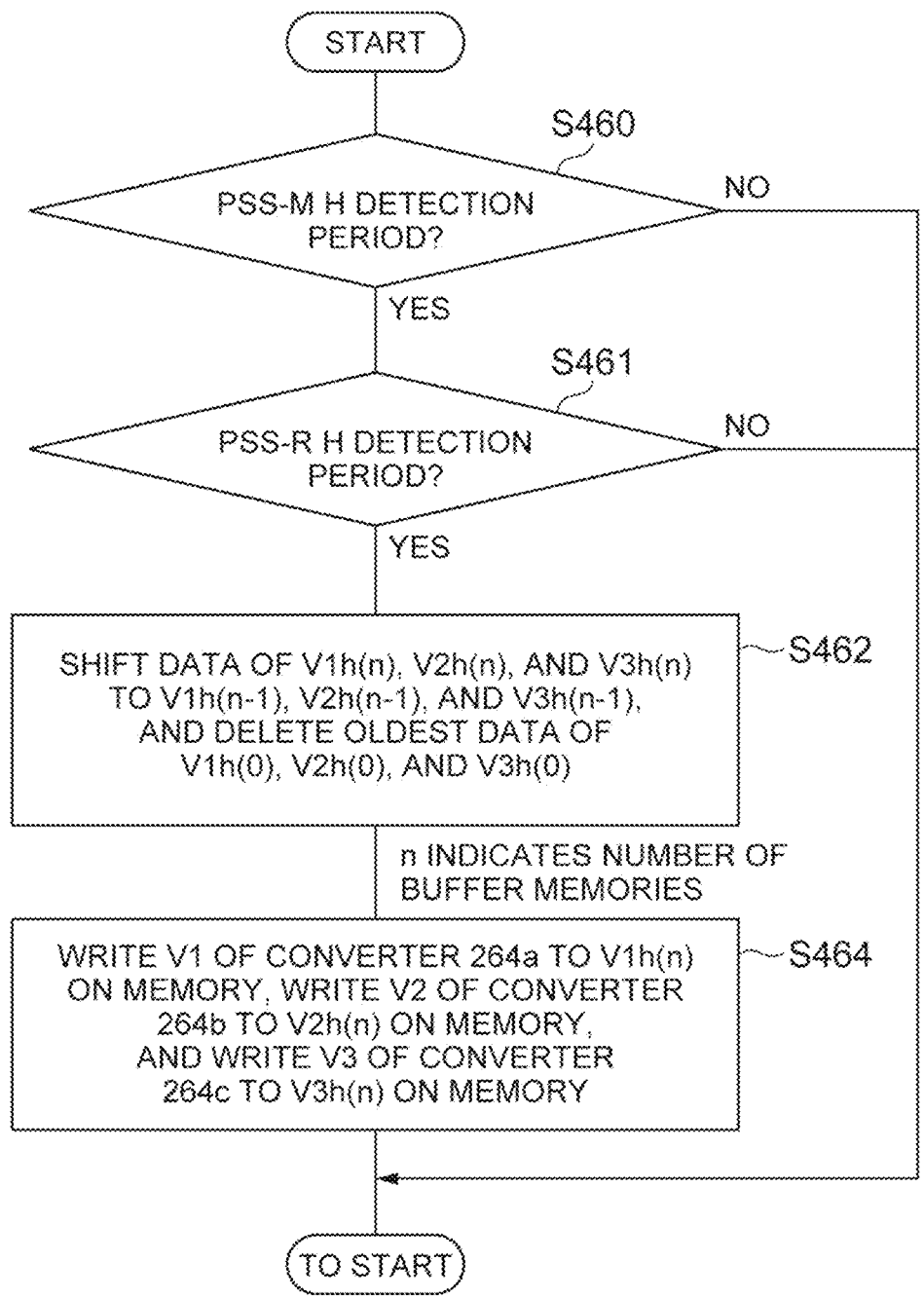
FIG. 48 is a flowchart illustrating an example of a writing process in a mode D.

FIG. 48 is a flowchart illustrating an example of a writing process in the mode D. The flowchart of FIG. 48 is started in a case where it is determined that the matching mode is the mode D (step S390: YES).

As illustrated in FIG. 48, as a determination process (step S460), the tuner control unit 260 determines whether or not a period is an H detection period of the synchronization signal PSS-M for a microwave. The tuner control unit 260 determines whether or not a period is the H detection period by using the H period timer counted in the timer process in FIG. 44.

In a case where it is determined that a period is the H detection period of the synchronization signal PSS-M for a microwave (step S460: YES), as a determination process (step S461), the tuner control unit 260 determines whether or not a period is an H detection period of the synchronization signal PSS-R for radio frequency power. The tuner control unit 260 determines whether or not a period is the H detection period by using the H period timer counted in the timer process in FIG. 45.

In a case where it is determined that a period is the H detection period (step S461: YES), the tuner control unit 260 performs an arrangement process (step S462) and a writing process (step S464). The arrangement process (step S462) and the writing process (step S464) are the same as the arrangement process (step S442) and the writing process (step S444) in FIG. 46.

In a case where the writing process (step S464) is finished, or it is determined that a period is not the H detection period (step S460: NO or step S461: NO), the tuner control unit 260 performs the determination process (step S460) again. As mentioned above, the arrangement process (step S462) and the writing process (step S464) are performed only in a case where both of microwave power and radio frequency power are in the H detection section. Consequently, the measured values $V1h(n)$, $V2h(n)$, and $V3h(n)$ are stored in the storage unit of the tuner 26 in a time series only when both of microwave power and radio frequency power have a high level.

Process 5: Mode E

Figure 49:
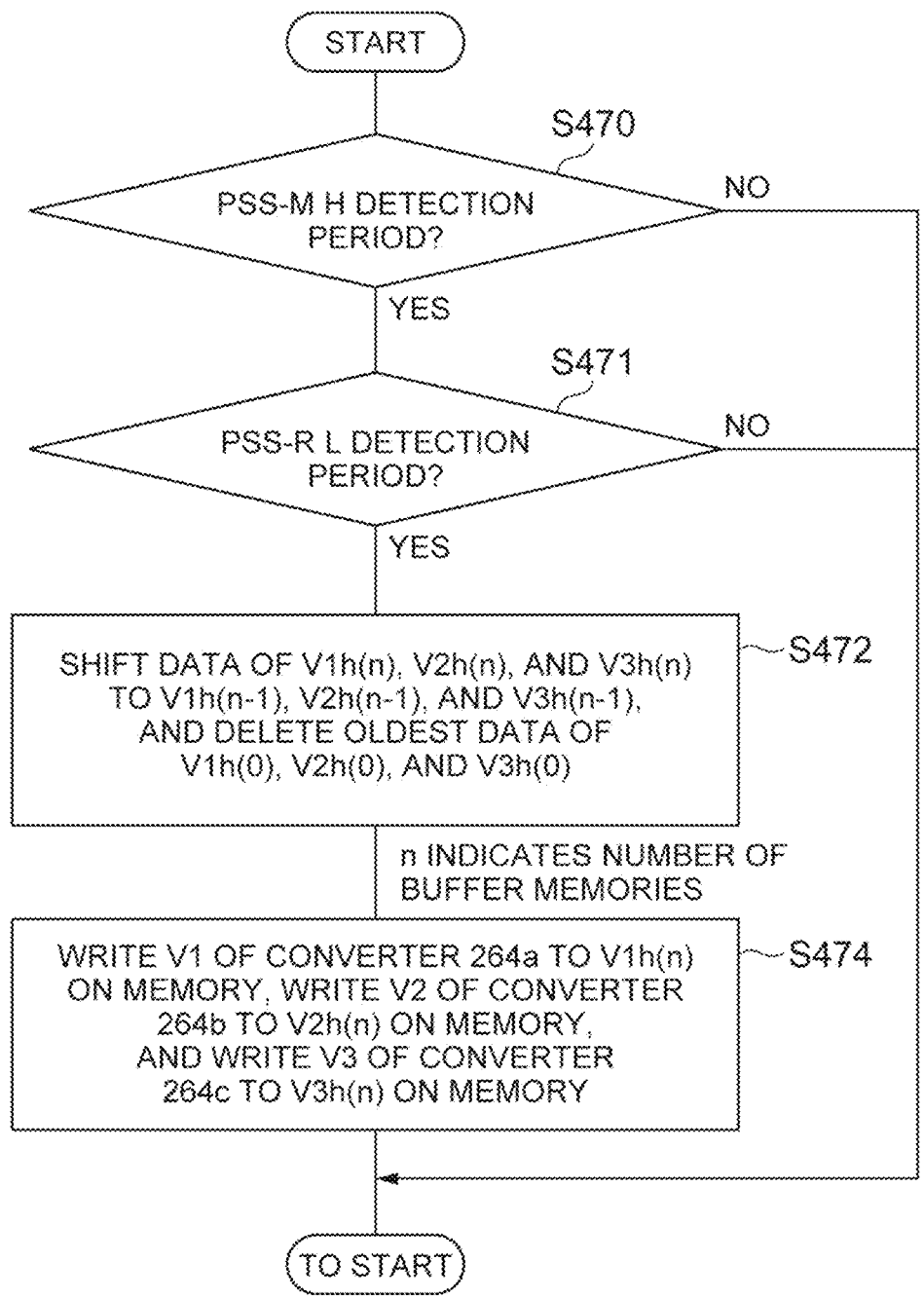
FIG. 49 is a flowchart illustrating an example of a writing process in a mode E.

FIG. 49 is a flowchart illustrating an example of a writing process in the mode E. The flowchart of FIG. 49 is started in a case where it is determined that the matching mode is the mode E (step S392: YES).

As illustrated in FIG. 49, as a determination process (step S470), the tuner control unit 260 determines whether or not a period is an H detection period of the synchronization signal PSS-M for a microwave. The tuner control unit 260 determines whether or not a period is the H detection period by using the H period timer counted in the timer process in FIG. 44.

In a case where it is determined that a period is the H detection period of the synchronization signal PSS-M for a microwave (step S470: YES), as a determination process (step S471), the tuner control unit 260 determines whether or not a period is an L detection period of the synchronization signal PSS-R for radio frequency power. The tuner control unit 260 determines whether or not a period is the L detection period by using the L period timer counted in the timer process in FIG. 45.

In a case where it is determined that a period is the L detection period (step S471: YES), the tuner control unit 260 performs an arrangement process (step S472) and a writing process (step S474). The arrangement process (step S472) and the writing process (step S474) are the same as the arrangement process (step S442) and the writing process (step S444) in FIG. 46.

In a case where the writing process (step S474) is finished, it is determined that a period is not the H detection period (step S470: NO), or it is determined that a period is not the L detection period (step S471: NO), the tuner control unit 260 performs the determination process (step S470) again. As mentioned above, the arrangement process (step S472) and the writing process (step S474) are performed only in a case where microwave power is in the H detection section, and radio frequency power is in the L detection section. Consequently, the measured values V1h(n), V2h(n), and V3h(n) are stored in the storage unit of the tuner 26 in a time series only when microwave power has a high level, and radio frequency power has a low level.

Process 6: Mode F

Figure 50:
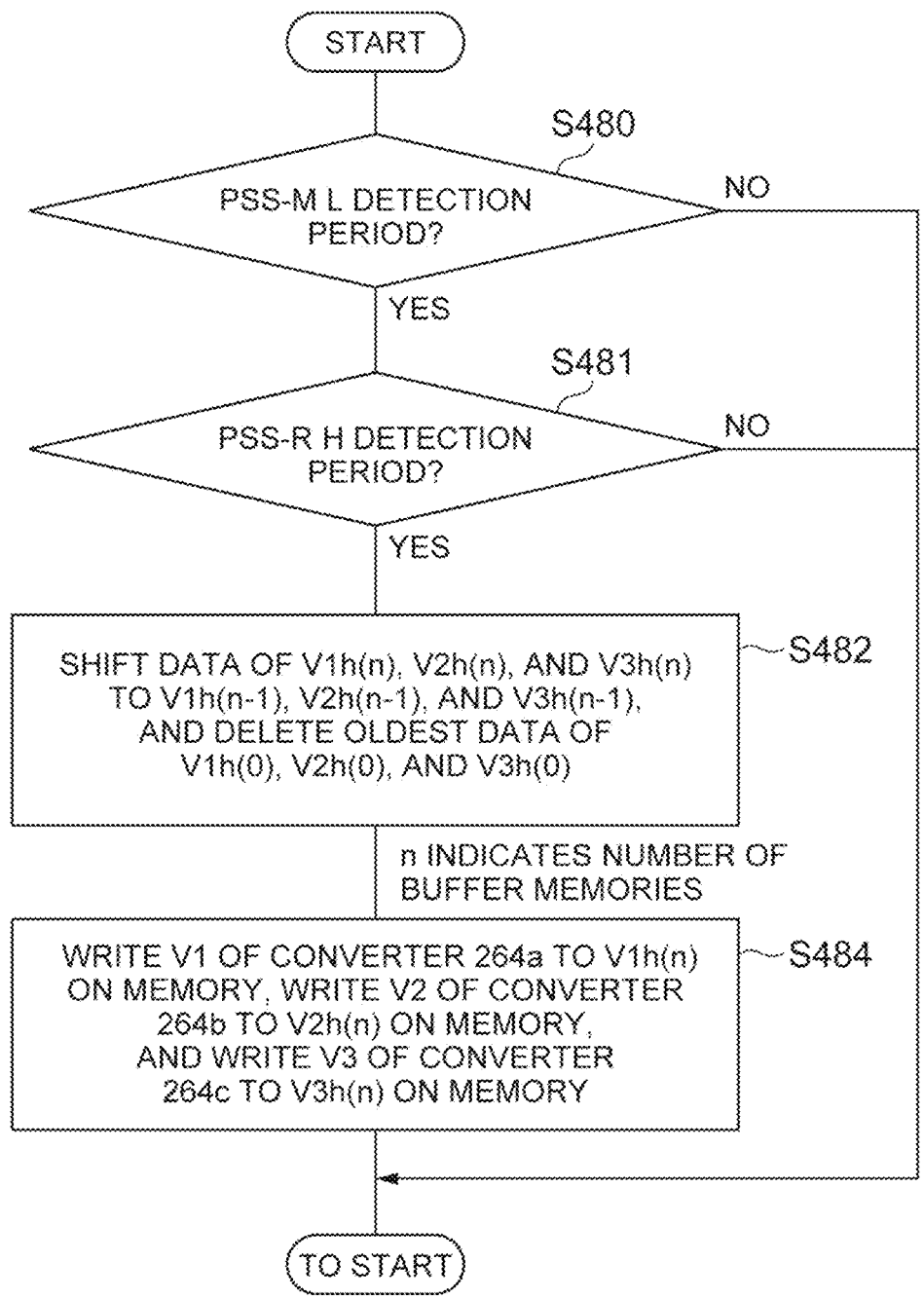
FIG. 50 is a flowchart illustrating an example of a writing process in a mode F.

FIG. 50 is a flowchart illustrating an example of a writing process in the mode F. The flowchart of FIG. 50 is started in a case where it is determined that the matching mode is the mode F (step S394: YES).

As illustrated in FIG. 50, as a determination process (step S480), the tuner control unit 260 determines whether or not a period is an L detection period of the synchronization signal PSS-M for a microwave. The tuner control unit 260 determines whether or not a period is the L detection period by using the L period timer counted in the timer process in FIG. 44.

In a case where it is determined that a period is the L detection period of the synchronization signal PSS-M for a microwave (step S480: YES), as a determination process (step S481), the tuner control unit 260 determines whether or not a period is an H detection period of the synchronization signal PSS-R for radio frequency power. The tuner control unit 260 determines whether or not a period is the H detection period by using the H period timer counted in the timer process in FIG. 45.

In a case where it is determined that a period is the H detection period (step S481: YES), the tuner control unit 260 performs an arrangement process (step S482) and a writing process (step S484). The arrangement process (step S482) and the writing process (step S484) are the same as the arrangement process (step S442) and the writing process (step S444) in FIG. 46.

In a case where the writing process (step S484) is finished, it is determined that a period is not the L detection period (step S480: NO), or it is determined that a period is not the H detection period (step S481: NO), the tuner control unit 260 performs the determination process (step S480) again. As mentioned above, the arrangement process (step S482) and the writing process (step S484) are performed only in a case where microwave power is in the L detection section, and radio frequency power is in the H detection section. Consequently, the measured values V1h(n), V2h(n), and V3h(n) are stored in the storage unit of the tuner 26 in a time series only when microwave power has a low level, and radio frequency power has a high level.

Process 7: Mode G

Figure 51:
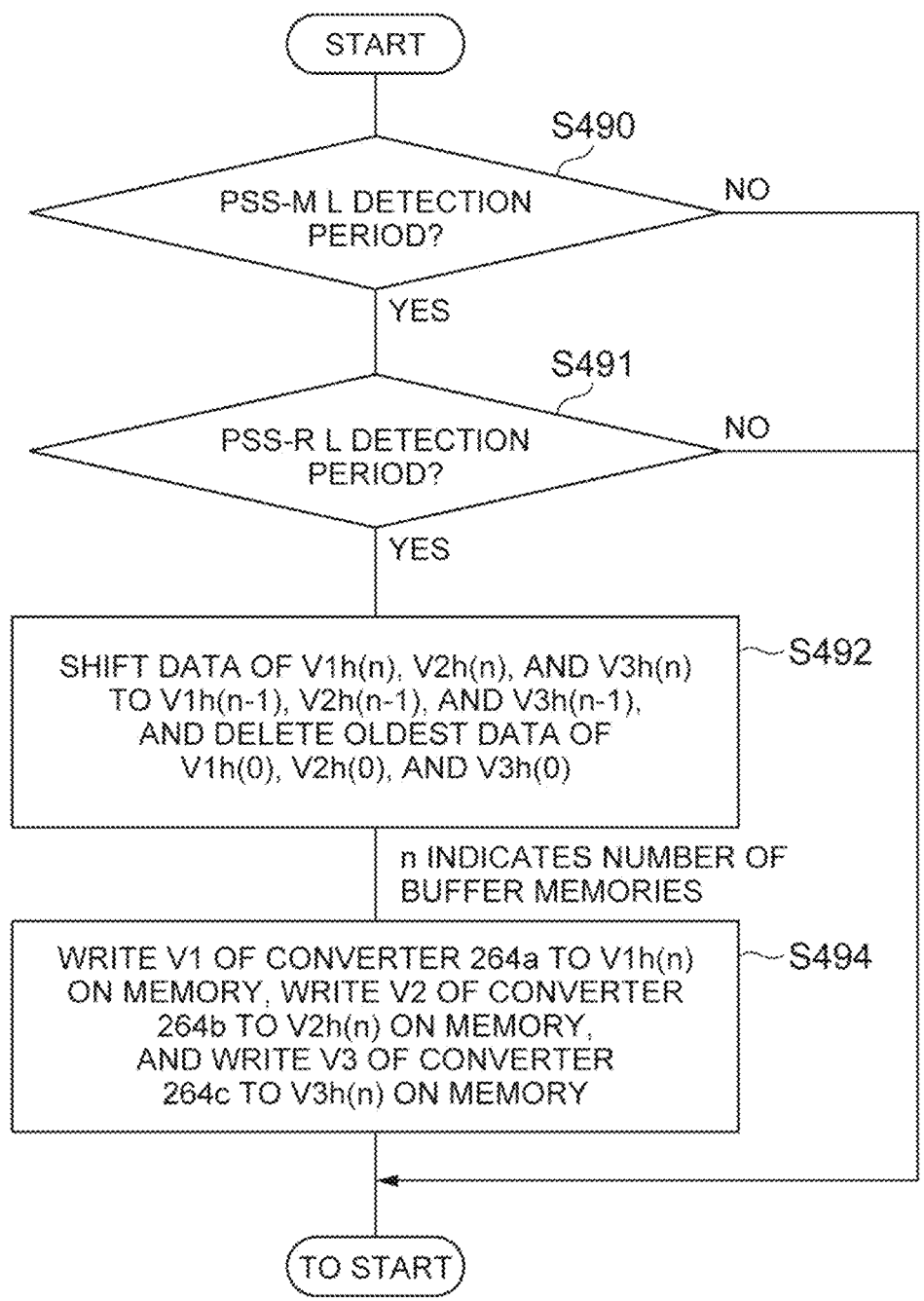
FIG. 51 is a flowchart illustrating an example of a writing process in a mode G.

FIG. 51 is a flowchart illustrating an example of a writing process in the mode G. The flowchart of FIG. 51 is started in a case where it is determined that the matching mode is the mode G (step S396: YES).

As illustrated in FIG. 51, as a determination process (step S490), the tuner control unit 260 determines whether or not a period is an L detection period of the synchronization signal PSS-M for a microwave. The tuner control unit 260 determines whether or not a period is the L detection period by using the L period timer counted in the timer process in FIG. 44.

In a case where it is determined that a period is the L detection period of the synchronization signal PSS-M for a microwave (step S490: YES), as a determination process (step S491), the tuner control unit 260 determines whether or not a period is an L detection period of the synchronization signal PSS-R for radio frequency power. The tuner control unit 260 determines whether or not a period is the L detection period by using the L period timer counted in the timer process in FIG. 45.

In a case where it is determined that a period is the L detection period (step S491: YES), the tuner control unit 260 performs an arrangement process (step S492) and a writing process (step S494). The arrangement process (step S492) and the writing process (step S494) are the same as the arrangement process (step S442) and the writing process (step S444) in FIG. 46.

In a case where the writing process (step S494) is finished, or it is determined that a period is not the L detection period (step S490: NO or step S491: NO), the tuner control unit 260 performs the determination process (step S490) again. As mentioned above, the arrangement process (step S492) and the writing process (step S494) are performed only in a case where both of microwave power and radio frequency power are in the L detection section. Consequently, the measured values V1h(n), V2h(n), and V3h(n) are stored in the storage unit of the tuner 26 in a time series only when both of microwave power and radio frequency power have a low level.

Time-Series Buffer Data

FIG. 52 illustrates an example of time-series buffer data. The time-series buffer data illustrated in FIG. 52 may be obtained by executing any one of the flowcharts of FIGS. 46 to 51. As illustrated in FIG. 52, for example, the high level measured value V1H and the low level measured value V1L of a microwave are stored in a time series in a period corresponding to several samples before the current time. The time-series buffer data is stored in a time series in the same manner for V2H, V2L, V3H, and V3L.

Measured Value Averaging Process and Reflection Coefficient Calculation Process

Figure 53:
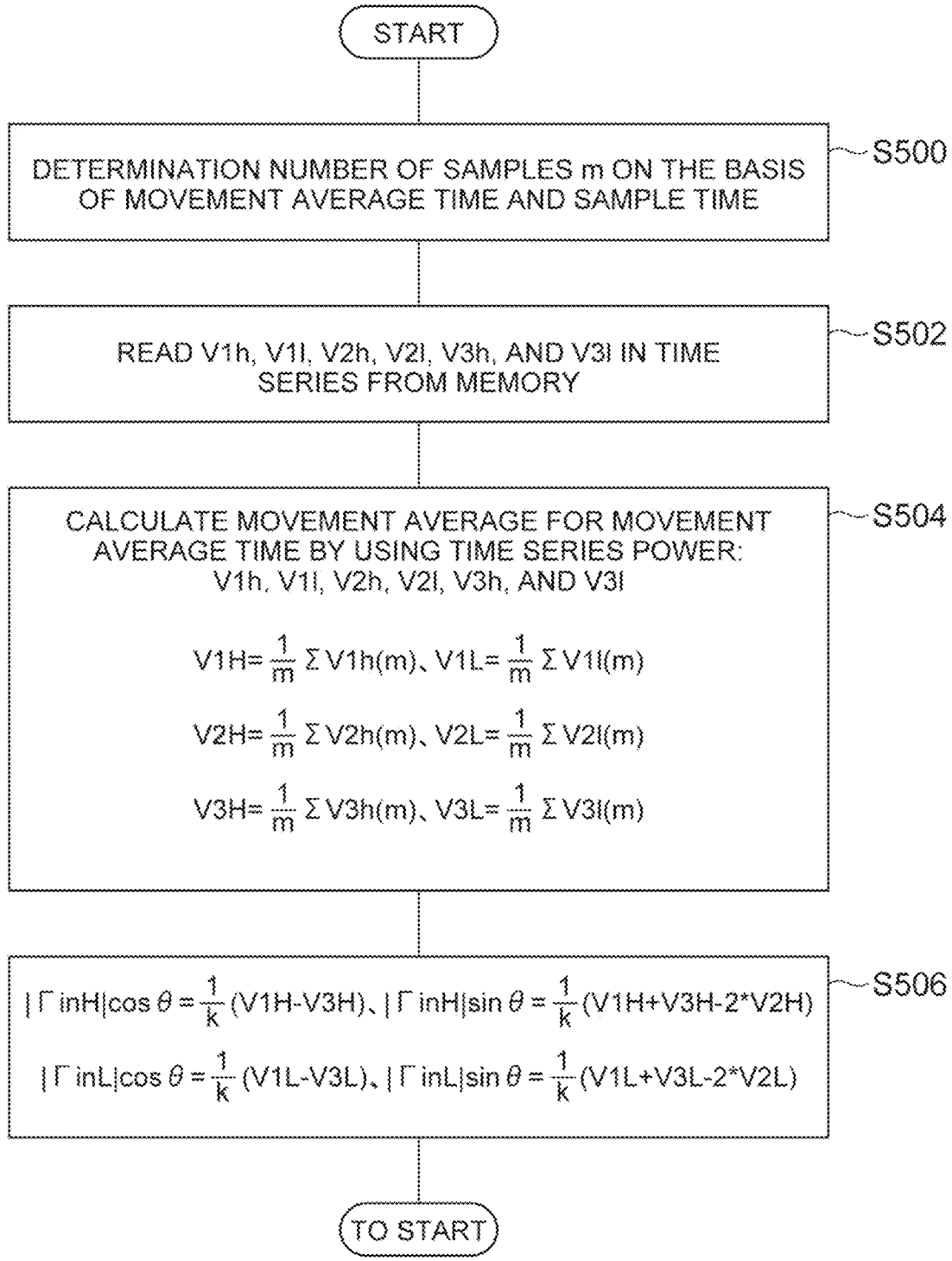
FIG. 53 is a flowchart illustrating an example of a measured value averaging process and a reflection coefficient calculation process.

Next, a description will be made of a measured value averaging process and a reflection coefficient calculation process using the time-series data in the tuner wave detection unit 263. FIG. 53 is a flowchart illustrating an example of a measured value averaging process and a reflection coefficient calculation process. The flowchart of FIG. 53 is started at a timing at which, for example, an operator performs an operation of starting the microwave power control process.

A determination process (step S500), a reading process (step S502), an averaging process (step S504), and a computation process (step S506) illustrated in FIG. 53 are the same as the determination process (step S280), the reading process (step S282), the averaging process (step S286), and the computation process (step S288) illustrated in FIG. 36.

Summary of Tuner

In the plasma processing apparatus 1, a measured value corresponding to microwave power in the wave guide tube 21 is detected at a timing based on a pulse frequency by the tuner wave detection unit 263. Consequently, a measured value of high level power and a measured value of low level power can be separately handled. Thus, the tuner 26 can perform matching based on a measured value of high level power and matching based on a measured value of low level power. Therefore, it is possible to appropriately match impedance on the microwave output device side with impedance on a chamber side compared with a case of averaging high level power and low level power as a whole.

Even in a case where microwave power is pulse-modulated, the tuner 26 can acquire a movement average time by connecting only H detection sections or L detection sections to each other. Thus, the microwave output device 16 can appropriately perform tuner matching.

The tuner 26 can measure power by appropriately setting the H detection mask time, the L detection mask time, the H detection section, and the L detection section so as to avoid a period in which microwave power greatly changes. Therefore, it is possible to reduce a power measurement error. As a result, it is possible to improve the accuracy of matching in the tuner.

The tuner 26 can perform matching by taking into consideration pulse modulation of microwave power and radio frequency power.

As mentioned above, various exemplary embodiments have been described, but various modification aspects may occur without limitation to the above-described exemplary embodiments.

In the above-described exemplary embodiments, a description has been made of an example in which the microwave generation unit 16a and the waveform generator 161 are separately formed, but may be formed as a single device.

In the above-described exemplary embodiments, a description has been made of an example in which the synchronization signal for microwave power is generated in accordance with the synchronization signal for radio frequency power, but the synchronization signal for radio frequency power may be generated in accordance with the synchronization signal for microwave power.

In a case where the plasma processing apparatus 1 uses only the Pf mode, the measurement unit 16k may not have the configuration of measuring a reflected wave.

Modification Example of Pulse Generator

Figure 54:
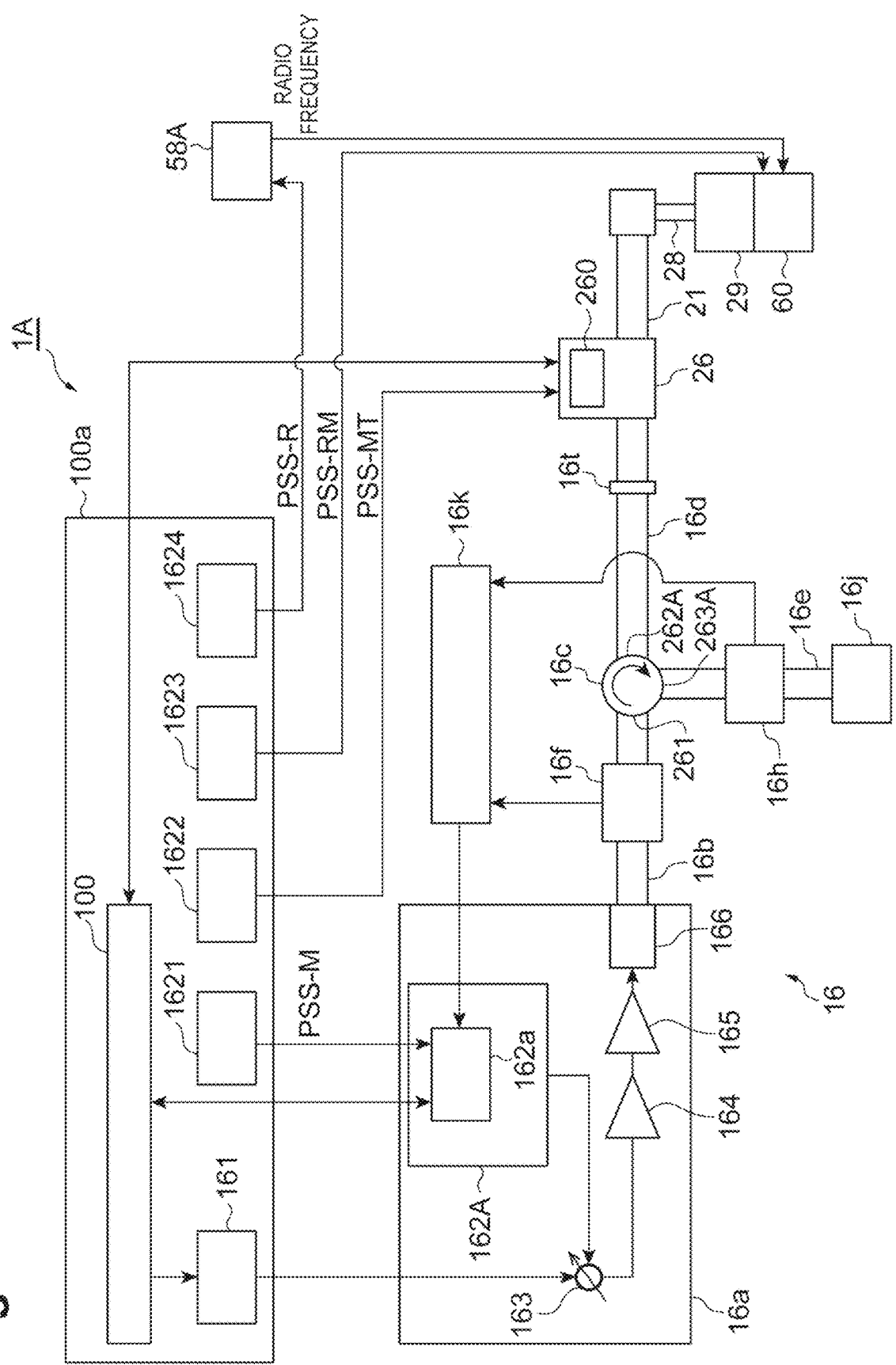
FIG. 54 is a diagram illustrating a microwave output device according to a modification example.

The microwave pulse generator 162b may not include the microwave generation unit 16a. FIG. 54 is a diagram illustrating an example of a microwave output device IA according to a modification example. For example, as illustrated in FIG. 54, a calculation device 100a may include a pulse generator 1621 which generates the synchronization signal PSS-M for microwave power in response to a command from the controller 100. The radio frequency power supply 58 may not include the pulse generator 58a. For example, as illustrated in FIG. 54, the calculation device 100a may include a pulse generator 1624 which generates the synchronization signal PSS-R for radio frequency power in response to a command from the controller 100. For example, as illustrated in FIG. 54, the calculation device 100a may include a pulse generator 1622 which generates a synchronization signal PSS-MT for microwave power in response to a command from the controller 100 instead of switching between input of the synchronization signal PSS-M for microwave power and input of the synchronization signal PSS-R for radio frequency power to the microwave tuner 26. For example, as illustrated in FIG. 54, the calculation device 100a may include a pulse generator 1623 which generates a synchronization signal PSS-RM for radio frequency power in response to a command from the controller 100 instead of switching between input of the synchronization signal PSS-M for microwave power and input of the synchronization signal PSS-R for radio frequency power to the radio frequency matching unit 60.

A pulse frequency, a setting duty, and synchronization timing setting of microwave power and radio frequency power are input as pulse setting, the controller 100 performs calculation so as to output the synchronization signal PSS-M for microwave power and the synchronization signal PSS-R for radio frequency power, and thus microwave pulse power and radio frequency pulse power can be synchronously output.

A pulse frequency, a setting duty, synchronization timing setting of microwave power and radio frequency power, and matching mode setting are input as pulse setting, the controller 100 performs calculation so as to output the synchronization signal PSS-MT for microwave power and the synchronization signal PSS-RM for radio frequency power, and thus a microwave pulse and a radio frequency pulse can be synchronously matched with each other such that plasma can be stably generated.

What is claimed is:

1. A microwave output device comprising:
a microwave generation unit configured to generate a microwave having a center frequency and a bandwidth respectively corresponding to a setting frequency and a setting bandwidth instructed by a controller, the microwave having power pulse-modulated such that a pulse frequency, a duty ratio, a high level and a low level respectively corresponding to a pulse frequency, a setting duty ratio, high level setting power and low level setting power instructed by the controller;
an output unit configured to output the microwave propagating from the microwave generation unit;
a first directional coupler configured to output parts of travelling waves propagating from the microwave generation unit to the output unit; and
a measurement unit configured to determine a first high measured value and a first low measured value respectively indicating a high level and a low level of power of the travelling waves in the output unit on the basis of the parts of the travelling waves output from the first directional coupler,
wherein the microwave generation unit
averages the first high measured value and the first low measured value with a predetermined movement average time and a predetermined sampling interval,
controls high level power of the pulse-modulated microwave on the basis of the averaged first high measured value and the high level setting power, and
controls low level power of the pulse-modulated microwave on the basis of the averaged first low measured value and the low level setting power.

2. The microwave output device according to claim 1, further comprising:

a second directional coupler configured to output parts of reflected waves returned to the output unit,
wherein the measurement unit further determines a second high measured value and a second low measured value respectively indicating a high level and a low level of power of the reflected waves in the output unit on the basis of the parts of the reflected waves output from the second directional coupler, and
wherein the microwave generation unit
  averages the second high measured value and the second low measured value with a predetermined movement average time and a predetermined sampling interval,
  controls high level power of the pulse-modulated microwave on the basis of the averaged first high measured value, the averaged second high measured value, and the high level setting power, and
  controls low level power of the pulse-modulated microwave on the basis of the averaged first low measured value, the averaged the second low measured value, and the low level setting power.

3. The microwave output device according to claim 2, wherein the measurement unit does not measure each of the power of the travelling waves and the power of the reflected waves in a first mask period until a predetermined time elapses from a high level timing and in a second mask period until a predetermined time elapses from a low level timing.

4. The microwave output device according to claim 3, wherein, with respect to each of the power of the travelling waves and the power of the reflected waves, the measurement unit measures high level power in a first sample period from the end of the first mask period to a low level timing, and measures low level power in a second sample period from the end of the second mask period to a high level timing.

5. The microwave output device according to claim 4, wherein the microwave generation unit
calculates a movement average time of each of the first high measured value and the second high measured value by using a period obtained by connecting a plurality of the first sample periods to each other, and
calculates a movement average time of each of the first low measured value and the second low measured value by using a period obtained by connecting a plurality of the second sample periods to each other.

6. The microwave output device according to claim 2, wherein, in a case where a control mode for which an instruction is given from the controller is a first control mode, the microwave generation unit controls high level power of a pulse-modulated microwave such that a difference between the averaged first high measured value and the averaged second high measured value comes close to the high level setting power, and controls low level power of a pulse-modulated microwave such that a difference between the averaged first low measured value and the averaged second low measured value comes close to the low level setting power, and
wherein, in a case where a control mode for which an instruction is given from the controller is a second control mode, the microwave generation unit controls high level power of a pulse-modulated microwave such that the averaged first high measured value comes close to the high level setting power, and controls low level power of a pulse-modulated microwave such that the averaged first low measured value comes close to the low level setting power.

7. The microwave output device according to claim 3, wherein, in a case where a control mode for which an instruction is given from the controller is a first control mode, the microwave generation unit controls high level power of a pulse-modulated microwave such that a difference between the averaged first high measured value and the averaged second high measured value comes close to the high level setting power, and controls low level power of a pulse-modulated microwave such that a difference between the averaged first low measured value and the averaged second low measured value comes close to the low level setting power, and
wherein, in a case where a control mode for which an instruction is given from the controller is a second control mode, the microwave generation unit controls high level power of a pulse-modulated microwave such that the averaged first high measured value comes close to the high level setting power, and controls low level power of a pulse-modulated microwave such that the averaged first low measured value comes close to the low level setting power.

8. The microwave output device according to claim 4, wherein, in a case where a control mode for which an instruction is given from the controller is a first control mode, the microwave generation unit controls high level power of a pulse-modulated microwave such that a difference between the averaged first high measured value and the averaged second high measured value comes close to the high level setting power, and controls low level power of a pulse-modulated microwave such that a difference between the averaged first low measured value and the averaged second low measured value comes close to the low level setting power, and
wherein, in a case where a control mode for which an instruction is given from the controller is a second control mode, the microwave generation unit controls high level power of a pulse-modulated microwave such that the averaged first high measured value comes close to the high level setting power, and controls low level power of a pulse-modulated microwave such that the averaged first low measured value comes close to the low level setting power.

9. The microwave output device according to claim 5, wherein, in a case where a control mode for which an instruction is given from the controller is a first control mode, the microwave generation unit controls high level power of a pulse-modulated microwave such that a difference between the averaged first high measured value and the averaged second high measured value comes close to the high level setting power, and controls low level power of a pulse-modulated microwave such that a difference between the averaged first low measured value and the averaged second low measured value comes close to the low level setting power, and
wherein, in a case where a control mode for which an instruction is given from the controller is a second control mode, the microwave generation unit controls high level power of a pulse-modulated microwave such that the averaged first high measured value comes close to the high level setting power, and controls low level power of a pulse-modulated microwave such that the averaged first low measured value comes close to the low level setting power.

10. The microwave output device according to claim 1, wherein the microwave generation unit includes
a waveform generation unit configured to generate a microwave, a control unit configured to output a first signal for applying a first attenuation amount to power of the microwave and a second signal for applying a second attenuation amount to the power of the microwave, a first converter connected to the control unit, and configured to perform D/A conversion on the first signal, a second converter connected to the control unit, and configured to perform D/A conversion on the second signal, an attenuator connected to the first converter and the second converter, and configured to attenuate power of the microwave according to the first signal having undergone the D/A conversion or the second signal having undergone the D/A conversion, and a switch provided between the first converter and the second converter, and the attenuator, and configured to switch between a connection between the first converter and the attenuator and a connection between the second converter and the attenuator.

11. The microwave output device according to claim 2, wherein the microwave generation unit includes a waveform generation unit configured to generate a microwave, a control unit configured to output a first signal for applying a first attenuation amount to power of the microwave and a second signal for applying a second attenuation amount to the power of the microwave, a first converter connected to the control unit, and configured to perform D/A conversion on the first signal, a second converter connected to the control unit, and configured to perform D/A conversion on the second signal, an attenuator connected to the first converter and the second converter, and configured to attenuate power of the microwave according to the first signal having undergone the D/A conversion or the second signal having undergone the D/A conversion, and a switch provided between the first converter and the second converter, and the attenuator, and configured to switch between a connection between the first converter and the attenuator and a connection between the second converter and the attenuator.

12. The microwave output device according to claim 3, wherein the microwave generation unit includes a waveform generation unit configured to generate a microwave, a control unit configured to output a first signal for applying a first attenuation amount to power of the microwave and a second signal for applying a second attenuation amount to the power of the microwave, a first converter connected to the control unit, and configured to perform D/A conversion on the first signal, a second converter connected to the control unit, and configured to perform D/A conversion on the second signal, an attenuator connected to the first converter and the second converter, and configured to attenuate power of the microwave according to the first signal having undergone the D/A conversion or the second signal having undergone the D/A conversion, and a switch provided between the first converter and the second converter, and the attenuator, and configured to switch between a connection between the first converter and the attenuator and a connection between the second converter and the attenuator.

13. The microwave output device according to claim 4, wherein the microwave generation unit includes a waveform generation unit configured to generate a microwave, a control unit configured to output a first signal for applying a first attenuation amount to power of the microwave and a second signal for applying a second attenuation amount to the power of the microwave, a first converter connected to the control unit, and configured to perform D/A conversion on the first signal, a second converter connected to the control unit, and configured to perform D/A conversion on the second signal, an attenuator connected to the first converter and the second converter, and configured to attenuate power of the microwave according to the first signal having undergone the D/A conversion or the second signal having undergone the D/A conversion, and a switch provided between the first converter and the second converter, and the attenuator, and configured to switch between a connection between the first converter and the attenuator and a connection between the second converter and the attenuator.

14. The microwave output device according to claim 5, wherein the microwave generation unit includes a waveform generation unit configured to generate a microwave, a control unit configured to output a first signal for applying a first attenuation amount to power of the microwave and a second signal for applying a second attenuation amount to the power of the microwave, a first converter connected to the control unit, and configured to perform D/A conversion on the first signal, a second converter connected to the control unit, and configured to perform D/A conversion on the second signal, an attenuator connected to the first converter and the second converter, and configured to attenuate power of the microwave according to the first signal having undergone the D/A conversion or the second signal having undergone the D/A conversion, and a switch provided between the first converter and the second converter, and the attenuator, and configured to switch between a connection between the first converter and the attenuator and a connection between the second converter and the attenuator.

15. The microwave output device according to claim 6, wherein the microwave generation unit includes a waveform generation unit configured to generate a microwave, a control unit configured to output a first signal for applying a first attenuation amount to power of the microwave and a second signal for applying a second attenuation amount to the power of the microwave, a first converter connected to the control unit, and configured to perform D/A conversion on the first signal, a second converter connected to the control unit, and configured to perform D/A conversion on the second signal, an attenuator connected to the first converter and the second converter, and configured to attenuate power of the microwave according to the first signal having undergone the D/A conversion or the second signal having undergone the D/A conversion, and a switch provided between the first converter and the second converter, and the attenuator, and configured to switch between a connection between the first converter and the attenuator and a connection between the second converter and the attenuator.

* * * * *